(12) United States Patent
Cui et al.

(10) Patent No.: US 10,854,426 B2
(45) Date of Patent: Dec. 1, 2020

(54) METAL RECESS FOR SEMICONDUCTOR STRUCTURES

(71) Applicant: Applied Materials, Inc., Santa Clara, CA (US)

(72) Inventors: Zhenjiang Cui, San Jose, CA (US); Nitin Ingle, San Jose, CA (US); Feiyue Ma, Santa Clara, CA (US); Hanshen Zhang, Santa Clara, CA (US); Siliang Chang, Santa Clara, CA (US); Daniella Holm, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 316 days.

(21) Appl. No.: 15/864,718

(22) Filed: Jan. 8, 2018

(65) Prior Publication Data

US 2019/0214229 A1     Jul. 11, 2019

(51) Int. Cl.
*H01J 37/32*     (2006.01)
*H01L 27/10*     (2006.01)
(Continued)

(52) U.S. Cl.
CPC .. *H01J 37/32091* (2013.01); *H01J 37/32357* (2013.01); *H01J 37/32449* (2013.01);
(Continued)

(58) Field of Classification Search
CPC ........... H01J 37/32091; H01J 37/32357; H01J 37/32449; H01J 37/32788;
(Continued)

(56) References Cited

U.S. PATENT DOCUMENTS 2,369,620 A    2/1945   Sullivan et al.
3,401,302 A    9/1968   Thorpe
(Continued)

FOREIGN PATENT DOCUMENTS

CN     1124364 A     6/1996
CN     1847450 A     10/2006
(Continued)

OTHER PUBLICATIONS

H. Xiao, Introduction to Semiconductor Manufacturing Technology, published by Prentice Hall, 2001, ISBN 0-13-022404-9, pp. 354-356.
(Continued)

*Primary Examiner* — Jeremy Carroll
(74) *Attorney, Agent, or Firm* — Kilpatrick Townsend & Stockton LLP

(57) ABSTRACT

Exemplary methods for laterally etching tungsten may include flowing an oxygen-containing precursor into a semiconductor processing chamber. A substrate positioned within the semiconductor processing chamber may include a trench formed between two vertical columns and tungsten slabs arranged within a plurality of recesses defined by at least one of the two vertical columns. At least two of the tungsten slabs may be connected by tungsten lining a portion of sidewalls of the trench. The methods may further include oxidizing the tungsten connecting the at least two of the tungsten slabs with the oxygen-containing precursor. The methods may include flowing a halide precursor into the semiconductor processing chamber. The methods may also include laterally etching the oxidized tungsten from the sidewalls of the trench.

19 Claims, 9 Drawing Sheets

(51) Int. Cl.
*H01L 21/02* (2006.01)
*H01L 27/02* (2006.01)
*H01L 21/285* (2006.01)
*H01L 21/3213* (2006.01)
*H01L 27/11582* (2017.01)

(52) U.S. Cl.
CPC .. *H01J 37/32788* (2013.01); *H01J 37/32972* (2013.01); *H01L 21/0262* (2013.01); *H01L 21/02274* (2013.01); *H01L 21/28518* (2013.01); *H01L 21/32135* (2013.01); *H01L 27/0203* (2013.01); *H01L 27/10* (2013.01); *H01J 2237/3347* (2013.01); *H01L 21/02244* (2013.01); *H01L 21/02252* (2013.01); *H01L 21/02255* (2013.01); *H01L 27/11582* (2013.01)

(58) Field of Classification Search
CPC ......... H01J 32/32972; H01L 21/02274; H01L 21/0262; H01L 21/28518; H01L 21/32135; H01L 27/0203; H01L 27/10
See application file for complete search history.

(56) References Cited

U.S. PATENT DOCUMENTS

| | | |
|---|---|---|
| 3,451,840 A | 6/1969 | Hough |
| 3,537,474 A | 11/1970 | Rohrer |
| 3,756,511 A | 9/1973 | Shinroku |
| 3,937,857 A | 2/1976 | Brummett et al. |
| 3,969,077 A | 7/1976 | Hill |
| 4,006,047 A | 2/1977 | Brummett et al. |
| 4,190,488 A | 2/1980 | Winters |
| 4,209,357 A | 6/1980 | Gorin et al. |
| 4,214,946 A | 7/1980 | Forget et al. |
| 4,232,060 A | 11/1980 | Mallory, Jr. |
| 4,234,628 A | 11/1980 | DuRose |
| 4,265,943 A | 5/1981 | Goldstein et al. |
| 4,340,462 A | 7/1982 | Koch |
| 4,341,592 A | 7/1982 | Shortes et al. |
| 4,361,418 A | 11/1982 | Tscheppe |
| 4,361,441 A | 11/1982 | Tylko |
| 4,364,803 A | 12/1982 | Nidola et al. |
| 4,368,223 A | 1/1983 | Kobayashi et al. |
| 4,374,698 A | 2/1983 | Sanders et al. |
| 4,397,812 A | 8/1983 | Mallory, Jr. |
| 4,468,413 A | 8/1984 | Bachmann |
| 4,503,807 A | 3/1985 | Nakayama et al. |
| 4,565,601 A | 1/1986 | Kakehi et al. |
| 4,579,618 A | 4/1986 | Celestino et al. |
| 4,585,920 A | 4/1986 | Hoog et al. |
| 4,600,464 A | 7/1986 | Desliets et al. |
| 4,610,775 A | 9/1986 | Phifer |
| 4,625,678 A | 12/1986 | Shloya et al. |
| 4,632,857 A | 12/1986 | Mallory, Jr. |
| 4,656,052 A | 4/1987 | Satou et al. |
| 4,656,076 A | 4/1987 | Vetanen et al. |
| 4,668,335 A | 5/1987 | Mockler |
| 4,690,746 A | 9/1987 | McInerney et al. |
| 4,715,937 A | 12/1987 | Moslehi et al. |
| 4,749,440 A | 6/1988 | Blackwood et al. |
| 4,753,898 A | 6/1988 | Parrillo et al. |
| 4,786,360 A | 11/1988 | Cote et al. |
| 4,792,378 A | 12/1988 | Rose et al. |
| 4,793,897 A | 12/1988 | Dunfield et al. |
| 4,807,016 A | 2/1989 | Douglas |
| 4,810,520 A | 3/1989 | Wu |
| 4,816,638 A | 3/1989 | Ukai et al. |
| 4,820,377 A | 4/1989 | Davis et al. |
| 4,828,649 A | 5/1989 | Davis |
| 4,857,140 A | 8/1989 | Loewenstein |
| 4,867,841 A | 9/1989 | Loewenstein et al. |
| 4,904,621 A | 2/1990 | Lowenstein et al. |
| 4,913,929 A | 4/1990 | Moslehi et al. |
| 4,919,750 A | 4/1990 | Bausmith et al. |
| 4,946,903 A | 8/1990 | Gardella et al. |
| 4,951,601 A | 8/1990 | Maydan et al. |
| 4,960,488 A | 10/1990 | Law et al. |
| 4,980,018 A | 12/1990 | Mu et al. |
| 4,981,551 A | 1/1991 | Palmour |
| 4,985,372 A | 1/1991 | Narita et al. |
| 4,987,856 A | 1/1991 | Hey et al. |
| 4,991,542 A | 2/1991 | Kohmura et al. |
| 4,992,136 A | 2/1991 | Tachi et al. |
| 4,993,358 A | 2/1991 | Mahawili |
| 4,994,404 A | 2/1991 | Sheng et al. |
| 5,000,113 A | 3/1991 | Wang et al. |
| 5,006,192 A | 4/1991 | Deguchi |
| 5,010,842 A | 4/1991 | Oda et al. |
| 5,013,691 A | 5/1991 | Lory et al. |
| 5,028,565 A | 7/1991 | Chang |
| 5,030,319 A | 7/1991 | Nishino et al. |
| 5,038,713 A | 8/1991 | Kawakami et al. |
| 5,045,244 A | 9/1991 | Marlett |
| 5,061,838 A | 10/1991 | Lane et al. |
| 5,069,938 A | 12/1991 | Lorimer et al. |
| 5,074,456 A | 12/1991 | Degner et al. |
| 5,083,030 A | 1/1992 | Stavov |
| 5,089,441 A | 2/1992 | Moslehi |
| 5,089,442 A | 2/1992 | Olmer |
| 5,147,692 A | 9/1992 | Bengston |
| 5,156,881 A | 10/1992 | Okano et al. |
| 5,180,435 A | 1/1993 | Markunas et al. |
| 5,186,718 A | 2/1993 | Tepman et al. |
| 5,188,706 A | 2/1993 | Hori et al. |
| 5,198,034 A | 3/1993 | deBoer et al. |
| 5,200,016 A | 4/1993 | Namose |
| 5,203,911 A | 4/1993 | Sricharoenchalkit et al. |
| 5,215,787 A | 6/1993 | Homma |
| 5,217,559 A | 6/1993 | Moslehi et al. |
| 5,221,427 A | 6/1993 | Koinuma et al. |
| 5,228,501 A | 7/1993 | Tepman et al. |
| 5,231,690 A | 7/1993 | Soma et al. |
| 5,235,139 A | 8/1993 | Bengston et al. |
| 5,238,499 A | 8/1993 | van de Ven et al. |
| 5,240,497 A | 8/1993 | Shacham et al. |
| 5,248,371 A | 9/1993 | Maher et al. |
| 5,248,527 A | 9/1993 | Uchida et al. |
| 5,252,178 A | 10/1993 | Moslehi |
| 5,266,157 A | 11/1993 | Kadomura |
| 5,269,881 A | 12/1993 | Sekiya |
| 5,270,125 A | 12/1993 | America et al. |
| 5,271,972 A | 12/1993 | Kwok et al. |
| 5,274,917 A | 1/1994 | Corbett, III et al. |
| 5,275,977 A | 1/1994 | Otsubo et al. |
| 5,277,750 A | 1/1994 | Wolgang |
| 5,279,669 A | 1/1994 | Lee |
| 5,279,705 A | 1/1994 | Tanaka |
| 5,279,865 A | 1/1994 | Chebi et al. |
| 5,288,518 A | 2/1994 | Homma |
| 5,290,382 A | 3/1994 | Zarowin et al. |
| 5,290,383 A | 3/1994 | Koshimizu |
| 5,292,370 A | 3/1994 | Tsai et al. |
| 5,292,682 A | 3/1994 | Stevens et al. |
| 5,300,463 A | 4/1994 | Cathey et al. |
| 5,302,233 A | 4/1994 | Kim et al. |
| 5,304,250 A | 4/1994 | Sameshima et al. |
| 5,306,530 A | 4/1994 | Strongin et al. |
| 5,314,724 A | 5/1994 | Tsukune et al. |
| 5,318,668 A | 6/1994 | Tamaki et al. |
| 5,319,247 A | 6/1994 | Matsuura |
| 5,326,427 A | 7/1994 | Jerbic |
| 5,328,558 A | 7/1994 | Kawamura et al. |
| 5,328,810 A | 7/1994 | Lowrey et al. |
| 5,330,578 A | 7/1994 | Sakama |
| 5,334,552 A | 8/1994 | Homma |
| 5,345,999 A | 9/1994 | Hosokawa |
| 5,352,636 A | 10/1994 | Beinglass |
| 5,356,478 A | 10/1994 | Chen et al. |
| 5,362,526 A | 11/1994 | Wang et al. |
| 5,366,585 A | 11/1994 | Robertson et al. |
| 5,368,897 A | 11/1994 | Kurihara et al. |
| 5,378,316 A | 1/1995 | Franke et al. |
| 5,380,560 A | 1/1995 | Kaja et al. |

(56) References Cited

U.S. PATENT DOCUMENTS

| | | |
|---|---|---|
| 5,382,311 A | 1/1995 | Ishikawa et al. |
| 5,384,284 A | 1/1995 | Doan et al. |
| 5,385,763 A | 1/1995 | Okano et al. |
| 5,399,237 A | 3/1995 | Keswick et al. |
| 5,399,529 A | 3/1995 | Homma |
| 5,403,434 A | 4/1995 | Moslehi |
| 5,413,670 A | 5/1995 | Langan et al. |
| 5,413,967 A | 5/1995 | Matsuda et al. |
| 5,415,890 A | 5/1995 | Kloiber et al. |
| 5,416,048 A | 5/1995 | Blalock et al. |
| 5,420,075 A | 5/1995 | Homma et al. |
| 5,429,995 A | 7/1995 | Nishiyama et al. |
| 5,439,553 A | 8/1995 | Grant et al. |
| 5,451,169 A | 9/1995 | Corbett, III et al. |
| 5,451,259 A | 9/1995 | Krogh |
| 5,453,124 A | 9/1995 | Moslehi et al. |
| 5,454,170 A | 10/1995 | Cook |
| 5,464,499 A | 11/1995 | Moslehi |
| 5,468,342 A | 11/1995 | Nulty et al. |
| 5,474,589 A | 12/1995 | Ohga et al. |
| 5,478,403 A | 12/1995 | Shinigawa et al. |
| 5,478,462 A | 12/1995 | Walsh |
| 5,483,920 A | 1/1996 | Pryor |
| 5,494,494 A | 2/1996 | Mizuno et al. |
| 5,500,249 A | 3/1996 | Telford et al. |
| 5,505,816 A | 4/1996 | Barnes et al. |
| 5,510,216 A | 4/1996 | Calabrese et al. |
| 5,516,367 A | 5/1996 | Lei et al. |
| 5,518,962 A | 5/1996 | Murao |
| 5,531,835 A | 7/1996 | Fodor et al. |
| 5,534,070 A | 7/1996 | Okamura et al. |
| 5,536,360 A | 7/1996 | Nguyen et al. |
| 5,549,780 A | 8/1996 | Koinuma et al. |
| 5,556,521 A | 9/1996 | Ghanbari |
| 5,558,717 A | 9/1996 | Zhao et al. |
| 5,560,779 A | 10/1996 | Knowles et al. |
| 5,563,105 A | 10/1996 | Dobuzinsky et al. |
| 5,567,243 A | 10/1996 | Foster et al. |
| 5,571,576 A | 11/1996 | Qian et al. |
| 5,575,853 A | 11/1996 | Arami et al. |
| 5,578,130 A | 11/1996 | Hayashi et al. |
| 5,578,161 A | 11/1996 | Auda |
| 5,580,385 A | 12/1996 | Paranjpe et al. |
| 5,580,421 A | 12/1996 | Hiatt et al. |
| 5,591,269 A | 1/1997 | Arami et al. |
| 5,592,358 A | 1/1997 | Shamouilian |
| 5,595,606 A | 1/1997 | Fujikawa et al. |
| 5,597,439 A | 1/1997 | Salzman |
| 5,599,740 A | 2/1997 | Jang et al. |
| 5,614,055 A | 3/1997 | Fairbairn et al. |
| 5,616,518 A | 4/1997 | Foo et al. |
| 5,624,582 A | 4/1997 | Cain |
| 5,626,922 A | 5/1997 | Miyanaga et al. |
| 5,628,829 A | 5/1997 | Foster et al. |
| 5,635,086 A | 6/1997 | Warren, Jr. |
| 5,645,645 A | 7/1997 | Zhang et al. |
| 5,648,125 A | 7/1997 | Cane |
| 5,648,175 A | 7/1997 | Russell et al. |
| 5,656,093 A | 8/1997 | Burkhart et al. |
| 5,660,957 A | 8/1997 | Chou et al. |
| 5,661,093 A | 8/1997 | Ravi et al. |
| 5,670,066 A | 9/1997 | Barnes et al. |
| 5,674,787 A | 10/1997 | Zhao et al. |
| 5,676,758 A | 10/1997 | Hasgawa et al. |
| 5,679,606 A | 10/1997 | Wang et al. |
| 5,685,946 A | 11/1997 | Fathauer et al. |
| 5,688,331 A | 11/1997 | Aruga et al. |
| 5,695,810 A | 12/1997 | Dubin et al. |
| 5,712,185 A | 1/1998 | Tsai et al. |
| 5,716,500 A | 2/1998 | Bardos et al. |
| 5,716,506 A | 2/1998 | Maclay et al. |
| 5,719,085 A | 2/1998 | Moon et al. |
| 5,733,816 A | 3/1998 | Iyer et al. |
| 5,747,373 A | 5/1998 | Yu |
| 5,753,886 A | 5/1998 | Iwamura et al. |
| 5,755,859 A | 5/1998 | Brusic et al. |
| 5,756,400 A | 5/1998 | Ye et al. |
| 5,756,402 A | 5/1998 | Jimbo et al. |
| 5,772,770 A | 6/1998 | Suda et al. |
| 5,781,693 A | 7/1998 | Ballance et al. |
| 5,786,276 A | 7/1998 | Brooks et al. |
| 5,788,825 A | 8/1998 | Park et al. |
| 5,789,300 A | 8/1998 | Fulford |
| 5,792,376 A | 8/1998 | Kanai et al. |
| 5,800,686 A | 9/1998 | Littau et al. |
| 5,804,259 A | 9/1998 | Robles |
| 5,812,403 A | 9/1998 | Fong et al. |
| 5,814,238 A | 9/1998 | Ashby et al. |
| 5,814,365 A | 9/1998 | Mahawill |
| 5,820,723 A | 10/1998 | Benjamin et al. |
| 5,824,599 A | 10/1998 | Schacham-Diamand et al. |
| 5,830,805 A | 11/1998 | Schacham-Diamand et al. |
| 5,835,334 A | 11/1998 | McMillin et al. |
| 5,843,538 A | 12/1998 | Ehrsam et al. |
| 5,843,847 A | 12/1998 | Pu et al. |
| 5,844,195 A | 12/1998 | Fairbairn et al. |
| 5,846,332 A | 12/1998 | Zhao et al. |
| 5,846,373 A | 12/1998 | Pirkle et al. |
| 5,846,375 A | 12/1998 | Gilchrist et al. |
| 5,846,598 A | 12/1998 | Semkow et al. |
| 5,849,639 A | 12/1998 | Molloy et al. |
| 5,850,105 A | 12/1998 | Dawson et al. |
| 5,855,681 A | 1/1999 | Maydan et al. |
| 5,855,685 A | 1/1999 | Tobe et al. |
| 5,856,240 A | 1/1999 | Sinha et al. |
| 5,858,876 A | 1/1999 | Chew |
| 5,863,376 A | 1/1999 | Wicker |
| 5,865,896 A | 2/1999 | Nowak |
| 5,866,483 A | 2/1999 | Shiau et al. |
| 5,868,897 A | 2/1999 | Ohkawa |
| 5,872,052 A | 2/1999 | Iyer |
| 5,872,058 A | 2/1999 | Van Cleemput et al. |
| 5,882,424 A | 3/1999 | Taylor et al. |
| 5,882,786 A | 3/1999 | Nassau et al. |
| 5,883,012 A | 3/1999 | Chiou |
| 5,885,358 A | 3/1999 | Maydan et al. |
| 5,885,404 A | 3/1999 | Kim et al. |
| 5,885,749 A | 3/1999 | Huggins et al. |
| 5,888,906 A | 3/1999 | Sandhu et al. |
| 5,891,349 A | 4/1999 | Tobe et al. |
| 5,891,513 A | 4/1999 | Dubin et al. |
| 5,897,751 A | 4/1999 | Makowiecki |
| 5,899,752 A | 5/1999 | Hey et al. |
| 5,900,163 A | 5/1999 | Yi et al. |
| 5,904,827 A | 5/1999 | Reynolds |
| 5,907,790 A | 5/1999 | Kellam |
| 5,910,340 A | 6/1999 | Uchida et al. |
| 5,913,147 A | 6/1999 | Dubin et al. |
| 5,913,978 A | 6/1999 | Kato et al. |
| 5,915,190 A | 6/1999 | Pirkle |
| 5,918,116 A | 6/1999 | Chittipeddi |
| 5,919,332 A | 7/1999 | Koshiishi et al. |
| 5,920,792 A | 7/1999 | Lin |
| 5,926,737 A | 7/1999 | Ameen et al. |
| 5,928,528 A | 7/1999 | Kubota et al. |
| 5,932,077 A | 8/1999 | Reynolds |
| 5,933,757 A | 8/1999 | Yoshikawa et al. |
| 5,935,334 A | 8/1999 | Fong et al. |
| 5,935,340 A | 8/1999 | Xia et al. |
| 5,937,323 A | 8/1999 | Orczyk et al. |
| 5,939,831 A | 8/1999 | Fong et al. |
| 5,942,075 A | 8/1999 | Nagahata et al. |
| 5,944,049 A | 8/1999 | Beyer et al. |
| 5,944,902 A | 8/1999 | Redeker et al. |
| 5,948,702 A | 9/1999 | Rotondaro |
| 5,951,601 A | 9/1999 | Lesinski et al. |
| 5,951,776 A | 9/1999 | Selyutin et al. |
| 5,951,896 A | 9/1999 | Mahawill |
| 5,953,591 A | 9/1999 | Ishihara et al. |
| 5,953,635 A | 9/1999 | Andideh |
| 5,963,840 A | 10/1999 | Xia et al. |
| 5,968,379 A | 10/1999 | Zhao et al. |
| 5,968,587 A | 10/1999 | Frankel et al. |
| 5,968,610 A | 10/1999 | Liu et al. |

(56) References Cited

U.S. PATENT DOCUMENTS

| | | |
|---|---|---|
| 5,969,422 A | 10/1999 | Ting et al. |
| 5,976,327 A | 11/1999 | Tanaka |
| 5,982,100 A | 11/1999 | Ghanbari |
| 5,990,000 A | 11/1999 | Hong et al. |
| 5,990,013 A | 11/1999 | Berenguer et al. |
| 5,993,916 A | 11/1999 | Zhao et al. |
| 5,994,209 A | 11/1999 | Yieh et al. |
| 5,997,649 A | 12/1999 | Hillman |
| 5,997,721 A | 12/1999 | Limbach et al. |
| 5,997,962 A | 12/1999 | Ogasawara et al. |
| 6,004,884 A | 12/1999 | Abraham |
| 6,007,635 A | 12/1999 | Mahawill |
| 6,007,785 A | 12/1999 | Liou |
| 6,010,962 A | 1/2000 | Liu et al. |
| 6,013,191 A | 1/2000 | Nasser-Faili et al. |
| 6,013,584 A | 1/2000 | M'Saad |
| 6,015,724 A | 1/2000 | Yamazaki et al. |
| 6,015,747 A | 1/2000 | Lopatin et al. |
| 6,017,414 A | 1/2000 | Koemtzopoulos et al. |
| 6,143,158 A | 1/2000 | Nishino et al. |
| 6,019,848 A | 2/2000 | Kiyama et al. |
| 6,020,271 A | 2/2000 | Yanagida |
| 6,022,446 A | 2/2000 | Shan et al. |
| 6,030,666 A | 2/2000 | Lam et al. |
| 6,030,881 A | 2/2000 | Papasouliotis et al. |
| 6,035,101 A | 3/2000 | Sajoto et al. |
| 6,036,878 A | 3/2000 | Collins et al. |
| 6,037,018 A | 3/2000 | Jang et al. |
| 6,037,266 A | 3/2000 | Tao et al. |
| 6,039,834 A | 3/2000 | Tanaka et al. |
| 6,039,851 A | 3/2000 | Iyer |
| 6,050,085 A | 4/2000 | Mayer |
| 6,053,982 A | 4/2000 | Halpin et al. |
| 6,059,643 A | 5/2000 | Hu et al. |
| 6,063,683 A | 5/2000 | Wu et al. |
| 6,063,712 A | 5/2000 | Gilton et al. |
| 6,065,424 A | 5/2000 | Shacham-Diamand et al. |
| 6,065,425 A | 5/2000 | Takaki et al. |
| 6,072,147 A | 6/2000 | Koshiishi |
| 6,072,227 A | 6/2000 | Yau et al. |
| 6,074,512 A | 6/2000 | Collins et al. |
| 6,074,514 A | 6/2000 | Bjorkman et al. |
| 6,077,384 A | 6/2000 | Collins et al. |
| 6,077,386 A | 6/2000 | Smith, Jr. et al. |
| 6,077,780 A | 6/2000 | Dubin |
| 6,079,356 A | 6/2000 | Umotoy et al. |
| 6,080,446 A | 6/2000 | Tobe et al. |
| 6,080,529 A | 6/2000 | Ye et al. |
| 6,081,414 A | 6/2000 | Flanigan et al. |
| 6,083,344 A | 7/2000 | Hanawa et al. |
| 6,083,844 A | 7/2000 | Bui-Le et al. |
| 6,086,677 A | 7/2000 | Umotoy et al. |
| 6,087,278 A | 7/2000 | Kim et al. |
| 6,090,212 A | 7/2000 | Mahawill |
| 6,093,457 A | 7/2000 | Okumura |
| 6,093,594 A | 7/2000 | Yeap et al. |
| 6,099,697 A | 8/2000 | Hausmann |
| 6,107,199 A | 8/2000 | Allen et al. |
| 6,110,530 A | 8/2000 | Chen et al. |
| 6,110,556 A | 8/2000 | Bang et al. |
| 6,110,832 A | 8/2000 | Morgan et al. |
| 6,110,836 A | 8/2000 | Cohen et al. |
| 6,110,838 A | 8/2000 | Loewenstein |
| 6,113,771 A | 9/2000 | Landau et al. |
| 6,114,216 A | 9/2000 | Yieh et al. |
| 6,117,245 A | 9/2000 | Mandrekar et al. |
| 6,120,640 A | 9/2000 | Shih et al. |
| 6,124,003 A | 9/2000 | Mikami et al. |
| 6,126,753 A | 10/2000 | Shinriki et al. |
| 6,132,512 A | 10/2000 | Horie et al. |
| 6,136,163 A | 10/2000 | Cheung et al. |
| 6,136,165 A | 10/2000 | Moslehi et al. |
| 6,136,685 A | 10/2000 | Narwankar et al. |
| 6,136,693 A | 10/2000 | Chan et al. |
| 6,140,234 A | 10/2000 | Uzoh et al. |
| 6,144,099 A | 11/2000 | Lopatin et al. |
| 6,147,009 A | 11/2000 | Grill et al. |
| 6,148,761 A | 11/2000 | Majewski et al. |
| 6,149,828 A | 11/2000 | Vaartstra |
| 6,150,628 A | 11/2000 | Smith et al. |
| 6,153,935 A | 11/2000 | Edelstein et al. |
| 6,161,500 A | 12/2000 | Kopacz et al. |
| 6,161,576 A | 12/2000 | Maher et al. |
| 6,162,302 A | 12/2000 | Raghavan et al. |
| 6,162,370 A | 12/2000 | Hackett et al. |
| 6,165,912 A | 12/2000 | McConnell et al. |
| 6,167,834 B1 | 1/2001 | Wang et al. |
| 6,169,021 B1 | 1/2001 | Akram et al. |
| 6,170,428 B1 | 1/2001 | Redeker et al. |
| 6,170,429 B1 | 1/2001 | Schoepp |
| 6,171,661 B1 | 1/2001 | Zheng et al. |
| 6,174,450 B1 | 1/2001 | Patrick et al. |
| 6,174,810 B1 | 1/2001 | Patrick et al. |
| 6,174,812 B1 | 1/2001 | Hsuing et al. |
| 6,176,198 B1 | 1/2001 | Kao et al. |
| 6,176,667 B1 | 1/2001 | Fairbairn |
| 6,177,245 B1 | 1/2001 | Ward et al. |
| 6,179,924 B1 | 1/2001 | Zhao et al. |
| 6,180,523 B1 | 1/2001 | Lee et al. |
| 6,182,602 B1 | 2/2001 | Redeker et al. |
| 6,182,603 B1 | 2/2001 | Shang et al. |
| 6,184,121 B1 | 2/2001 | Buchwalter et al. |
| 6,184,489 B1 | 2/2001 | Ito et al. |
| 6,186,091 B1 | 2/2001 | Chu et al. |
| 6,189,483 B1 | 2/2001 | Ishikawa et al. |
| 6,190,233 B1 | 2/2001 | Hong et al. |
| 6,194,038 B1 | 2/2001 | Rossman |
| 6,197,181 B1 | 3/2001 | Chen |
| 6,197,364 B1 | 3/2001 | Paunovic et al. |
| 6,197,680 B1 | 3/2001 | Lin et al. |
| 6,197,688 B1 | 3/2001 | Simpson |
| 6,197,705 B1 | 3/2001 | Vassiliev |
| 6,198,616 B1 | 3/2001 | Dahimene et al. |
| 6,200,412 B1 | 3/2001 | Kilgore et al. |
| 6,203,863 B1 | 3/2001 | Liu et al. |
| 6,204,200 B1 | 3/2001 | Shieh et al. |
| 6,210,486 B1 | 4/2001 | Mizukami et al. |
| 6,217,658 B1 | 4/2001 | Orczyk et al. |
| 6,220,201 B1 | 4/2001 | Nowak |
| 6,225,745 B1 | 5/2001 | Srivastava |
| 6,228,233 B1 | 5/2001 | Lakshmikanthan et al. |
| 6,228,751 B1 | 5/2001 | Yamazaki et al. |
| 6,228,758 B1 | 5/2001 | Pellerin et al. |
| 6,235,643 B1 | 5/2001 | Mui et al. |
| 6,237,527 B1 | 5/2001 | Kellerman et al. |
| 6,238,513 B1 | 5/2001 | Arnold et al. |
| 6,238,582 B1 | 5/2001 | Williams et al. |
| 6,197,151 B1 | 6/2001 | Kaji et al. |
| 6,241,845 B1 | 6/2001 | Gadgil et al. |
| 6,242,349 B1 | 6/2001 | Nogami et al. |
| 6,242,360 B1 | 6/2001 | Fischer et al. |
| 6,244,211 B1 | 6/2001 | Nishikawa et al. |
| 6,245,396 B1 | 6/2001 | Nogami |
| 6,245,670 B1 | 6/2001 | Cheung et al. |
| 6,251,236 B1 | 6/2001 | Stevens |
| 6,251,802 B1 | 6/2001 | Moore et al. |
| 6,258,170 B1 | 7/2001 | Somekh et al. |
| 6,258,220 B1 | 7/2001 | Dordi et al. |
| 6,258,223 B1 | 7/2001 | Cheung et al. |
| 6,258,270 B1 | 7/2001 | Hilgendorff et al. |
| 6,261,637 B1 | 7/2001 | Oberle |
| 6,267,074 B1 | 7/2001 | Okumura |
| 6,277,733 B1 | 8/2001 | Smith |
| 6,277,752 B1 | 8/2001 | Chen |
| 6,277,763 B1 | 8/2001 | Kugimiya et al. |
| 6,281,072 B1 | 8/2001 | Li et al. |
| 6,281,135 B1 | 8/2001 | Han et al. |
| 6,284,146 B1 | 9/2001 | Kim et al. |
| 6,287,643 B1 | 9/2001 | Powell et al. |
| 6,291,282 B1 | 9/2001 | Wilk et al. |
| 6,291,348 B1 | 9/2001 | Lopatin et al. |
| 6,302,964 B1 | 10/2001 | Umotoy et al. |
| 6,303,044 B1 | 10/2001 | Koemtzopoulos |
| 6,303,418 B1 | 10/2001 | Cha et al. |

(56) References Cited

U.S. PATENT DOCUMENTS

| | | |
|---|---|---|
| 6,306,246 B1 | 10/2001 | Melvin et al. |
| 6,306,772 B1 | 10/2001 | Lin |
| 6,308,654 B1 | 10/2001 | Schneider et al. |
| 6,308,776 B1 | 10/2001 | Sloan |
| 6,310,755 B1 | 10/2001 | Busato et al. |
| 6,312,554 B1 | 11/2001 | Ye |
| 6,312,995 B1 | 11/2001 | Yu |
| 6,319,387 B1 | 11/2001 | Krishnamoorthy et al. |
| 6,321,587 B1 | 11/2001 | Laush |
| 6,322,716 B1 | 11/2001 | Qiao et al. |
| 6,323,128 B1 | 11/2001 | Sambucetti et al. |
| 6,329,297 B1 | 12/2001 | Balish et al. |
| 6,335,288 B1 | 1/2002 | Kwan et al. |
| 6,340,435 B1 | 1/2002 | Bjorkman et al. |
| 6,342,733 B1 | 1/2002 | Hu et al. |
| RE37,546 E | 2/2002 | Mahawill |
| 6,344,410 B1 | 2/2002 | Lopatin et al. |
| 6,348,407 B1 | 2/2002 | Gupta et al. |
| 6,350,320 B1 | 2/2002 | Sherstinsky et al. |
| 6,350,697 B1 | 2/2002 | Richardson |
| 6,351,013 B1 | 2/2002 | Luning et al. |
| 6,352,081 B1 | 3/2002 | Lu et al. |
| 6,355,573 B1 | 3/2002 | Okumura |
| 6,358,827 B1 | 3/2002 | Chen et al. |
| 6,364,949 B1 | 4/2002 | Or et al. |
| 6,364,954 B2 | 4/2002 | Umotoy et al. |
| 6,364,957 B1 | 4/2002 | Schneider et al. |
| 6,372,657 B1 | 4/2002 | Hineman et al. |
| 6,375,748 B1 | 4/2002 | Yudovsky et al. |
| 6,376,386 B1 | 4/2002 | Oshima |
| 6,379,575 B1 | 4/2002 | Yin et al. |
| 6,383,896 B1 | 5/2002 | Kirimura et al. |
| 6,383,951 B1 | 5/2002 | Li |
| 6,387,182 B1 | 5/2002 | Horie et al. |
| 6,387,207 B1 | 5/2002 | Janakiraman et al. |
| 6,391,753 B1 | 5/2002 | Yu |
| 6,395,150 B1 | 5/2002 | Van Cleemput et al. |
| 6,403,491 B1 | 6/2002 | Liu et al. |
| 6,415,736 B1 | 7/2002 | Hao et al. |
| 6,416,647 B1 | 7/2002 | Dordi et al. |
| 6,418,874 B1 | 7/2002 | Cox et al. |
| 6,423,284 B1 | 7/2002 | Arno |
| 6,427,623 B2 | 8/2002 | Ko |
| 6,429,465 B1 | 8/2002 | Yagi et al. |
| 6,432,819 B1 | 8/2002 | Pavate et al. |
| 6,432,831 B2 | 8/2002 | Dhindsa et al. |
| 6,436,193 B1 | 8/2002 | Kasai et al. |
| 6,436,816 B1 | 8/2002 | Lee et al. |
| 6,437,512 B1 | 8/2002 | Chen et al. |
| 6,440,863 B1 | 8/2002 | Tsai et al. |
| 6,441,492 B1 | 8/2002 | Cunningham |
| 6,444,083 B1 | 9/2002 | Steger et al. |
| 6,446,572 B1 | 9/2002 | Brcka |
| 6,447,636 B1 | 9/2002 | Qian et al. |
| 6,448,537 B1 | 9/2002 | Nering |
| 6,458,718 B1 | 10/2002 | Todd |
| 6,461,974 B1 | 10/2002 | Ni et al. |
| 6,462,371 B1 | 10/2002 | Weimer et al. |
| 6,462,372 B1 | 10/2002 | Xia et al. |
| 6,463,782 B1 | 10/2002 | Shen et al. |
| 6,465,051 B1 | 10/2002 | Sahin et al. |
| 6,465,350 B1 | 10/2002 | Taylor et al. |
| 6,465,366 B1 | 10/2002 | Nemani et al. |
| 6,471,779 B1 | 10/2002 | Nishio et al. |
| 6,477,980 B1 | 11/2002 | White et al. |
| 6,479,373 B2 | 11/2002 | Dreybrodt et al. |
| 6,488,984 B1 | 12/2002 | Wada et al. |
| 6,494,959 B1 | 12/2002 | Samoilov et al. |
| 6,499,425 B1 | 12/2002 | Sandhu et al. |
| 6,500,728 B1 | 12/2002 | Wang |
| 6,503,843 B1 | 1/2003 | Xia et al. |
| 6,506,291 B2 | 1/2003 | Tsai et al. |
| 6,509,283 B1 | 1/2003 | Thomas |
| 6,509,623 B2 | 1/2003 | Zhao |
| 6,516,815 B1 | 2/2003 | Stevens et al. |
| 6,518,548 B2 | 2/2003 | Sugaya et al. |
| 6,527,968 B1 | 3/2003 | Wang et al. |
| 6,528,409 B1 | 3/2003 | Lopatin et al. |
| 6,528,751 B1 | 3/2003 | Hoffman et al. |
| 6,531,069 B1 | 3/2003 | Srivastava et al. |
| 6,537,707 B1 | 3/2003 | Lee |
| 6,537,733 B2 | 3/2003 | Campana et al. |
| 6,541,397 B1 | 4/2003 | Bencher |
| 6,541,671 B1 | 4/2003 | Martinez et al. |
| 6,544,340 B2 | 4/2003 | Yudovsky |
| 6,547,977 B1 | 4/2003 | Yan et al. |
| 6,551,924 B1 | 4/2003 | Dalton et al. |
| 6,558,564 B1 | 5/2003 | Loewenhardt |
| 6,565,661 B1 | 5/2003 | Nguyen |
| 6,565,729 B2 | 5/2003 | Chen et al. |
| 6,569,773 B1 | 5/2003 | Gellrich et al. |
| 6,572,937 B2 | 6/2003 | Hakovirta et al. |
| 6,573,030 B1 | 6/2003 | Fairbairn et al. |
| 6,573,606 B2 | 6/2003 | Sambucetti et al. |
| 6,576,151 B1 | 6/2003 | Vereecke et al. |
| 6,585,851 B1 | 7/2003 | Ohmi et al. |
| 6,586,163 B1 | 7/2003 | Okabe et al. |
| 6,596,599 B1 | 7/2003 | Guo |
| 6,596,654 B1 | 7/2003 | Bayman et al. |
| 6,602,434 B1 | 8/2003 | Hung et al. |
| 6,602,806 B1 | 8/2003 | Xia et al. |
| 6,603,269 B1 | 8/2003 | Vo et al. |
| 6,605,874 B2 | 8/2003 | Leu et al. |
| 6,616,967 B1 | 9/2003 | Test |
| 6,627,532 B1 | 9/2003 | Gaillard et al. |
| 6,635,575 B1 | 10/2003 | Xia et al. |
| 6,635,578 B1 | 10/2003 | Xu et al. |
| 6,638,810 B2 | 10/2003 | Bakli et al. |
| 6,638,855 B1 | 10/2003 | Chang et al. |
| 6,645,301 B2 | 11/2003 | Sainty et al. |
| 6,645,550 B1 | 11/2003 | Cheung et al. |
| 6,656,831 B1 | 12/2003 | Lee et al. |
| 6,656,837 B2 | 12/2003 | Xu et al. |
| 6,656,848 B1 | 12/2003 | Scanlan et al. |
| 6,663,715 B1 | 12/2003 | Yuda et al. |
| 6,673,200 B1 | 1/2004 | Gu et al. |
| 6,677,242 B1 | 1/2004 | Liu et al. |
| 6,679,981 B1 | 1/2004 | Pan et al. |
| 6,688,375 B1 | 2/2004 | Turner |
| 6,692,903 B2 | 2/2004 | Chen et al. |
| 6,713,356 B1 | 3/2004 | Skotnicki et al. |
| 6,713,835 B1 | 3/2004 | Horak et al. |
| 6,717,189 B2 | 4/2004 | Inoue et al. |
| 6,720,213 B1 | 4/2004 | Gambino et al. |
| 6,736,147 B2 | 5/2004 | Satoh et al. |
| 6,736,987 B1 | 5/2004 | Cho |
| 6,740,247 B1 | 5/2004 | Han et al. |
| 6,740,585 B2 | 5/2004 | Yoon et al. |
| 6,740,977 B2 | 5/2004 | Ahn et al. |
| 6,743,473 B1 | 6/2004 | Parkhe et al. |
| 6,743,732 B1 | 6/2004 | Lin et al. |
| 6,756,235 B1 | 6/2004 | Liu et al. |
| 6,759,261 B2 | 7/2004 | Shimokohbe et al. |
| 6,762,127 B2 | 7/2004 | Boiteux et al. |
| 6,762,435 B2 | 7/2004 | Towle |
| 6,764,958 B1 | 7/2004 | Nemani et al. |
| 6,765,273 B1 | 7/2004 | Chau et al. |
| 6,767,834 B2 | 7/2004 | Chung et al. |
| 6,768,079 B2 | 7/2004 | Kosakai |
| 6,770,166 B1 | 8/2004 | Fisher |
| 6,772,827 B2 | 8/2004 | Keller et al. |
| 6,792,889 B2 | 9/2004 | Nakano et al. |
| 6,794,290 B1 | 9/2004 | Papasouliotis et al. |
| 6,794,311 B2 | 9/2004 | Huang et al. |
| 6,796,314 B1 | 9/2004 | Graff et al. |
| 6,797,189 B2 | 9/2004 | Hung et al. |
| 6,797,634 B2 | 9/2004 | Suzuki |
| 6,800,336 B1 | 10/2004 | Fornsel et al. |
| 6,800,830 B2 | 10/2004 | Mahawili |
| 6,802,944 B2 | 10/2004 | Ahmad et al. |
| 6,808,564 B2 | 10/2004 | Dietze |
| 6,808,747 B1 | 10/2004 | Shih et al. |
| 6,808,748 B2 | 10/2004 | Kapoor et al. |
| 6,815,633 B1 | 11/2004 | Chen et al. |

(56) References Cited

U.S. PATENT DOCUMENTS

| | | |
|---|---|---|
| 6,818,561 B1 | 11/2004 | Sonderman |
| 6,821,571 B2 | 11/2004 | Huang |
| 6,823,589 B2 | 11/2004 | White et al. |
| 6,828,241 B2 | 12/2004 | Kholodenko et al. |
| 6,830,624 B2 | 12/2004 | Janakiraman et al. |
| 6,835,995 B2 | 12/2004 | Li |
| 6,846,401 B2 | 1/2005 | Wijenberg et al. |
| 6,846,745 B1 | 1/2005 | Papasouliotis et al. |
| 6,849,854 B2 | 2/2005 | Sainty |
| 6,852,550 B2 | 2/2005 | Tuttle et al. |
| 6,852,584 B1 | 2/2005 | Chen et al. |
| 6,853,533 B2 | 2/2005 | Parkhe et al. |
| 6,858,153 B2 | 2/2005 | Bjorkman et al. |
| 6,861,097 B1 | 3/2005 | Goosey et al. |
| 6,861,332 B2 | 3/2005 | Park et al. |
| 6,869,880 B2 | 3/2005 | Krishnaraj et al. |
| 6,875,280 B2 | 4/2005 | Ikeda et al. |
| 6,878,206 B2 | 4/2005 | Tzu et al. |
| 6,879,981 B2 | 4/2005 | Rothschild et al. |
| 6,883,733 B1 | 4/2005 | Lind et al. |
| 6,886,491 B2 | 5/2005 | Kim et al. |
| 6,892,669 B2 | 5/2005 | Xu et al. |
| 6,893,967 B1 | 5/2005 | Wright et al. |
| 6,897,532 B1 | 5/2005 | Schwarz et al. |
| 6,900,596 B2 | 5/2005 | Yang et al. |
| 6,903,511 B2 | 6/2005 | Chistyakov |
| 6,908,862 B2 | 6/2005 | Li et al. |
| 6,911,112 B2 | 6/2005 | An |
| 6,911,401 B2 | 6/2005 | Khandan et al. |
| 6,916,399 B1 | 7/2005 | Rozenzon et al. |
| 6,921,556 B2 | 7/2005 | Shimizu et al. |
| 6,924,191 B2 | 8/2005 | Liu et al. |
| 6,930,047 B2 | 8/2005 | Yamazaki |
| 6,935,269 B2 | 8/2005 | Lee et al. |
| 6,942,753 B2 | 9/2005 | Choi et al. |
| 6,946,033 B2 | 9/2005 | Tsuei et al. |
| 6,951,821 B2 | 10/2005 | Hamelin et al. |
| 6,958,175 B2 | 10/2005 | Sakamoto et al. |
| 6,958,286 B2 | 10/2005 | Chen et al. |
| 6,969,619 B1 | 11/2005 | Winniczek |
| 6,972,840 B1 | 12/2005 | Gu et al. |
| 6,995,073 B2 | 2/2006 | Liou |
| 7,017,269 B2 | 3/2006 | White et al. |
| 7,017,514 B1 | 3/2006 | Shepherd |
| 7,018,941 B2 | 3/2006 | Cui et al. |
| 7,030,034 B2 | 4/2006 | Fucsko et al. |
| 7,037,846 B2 | 5/2006 | Srivastava et al. |
| 7,049,200 B2 | 5/2006 | Arghavani et al. |
| 7,049,244 B2 | 5/2006 | Becker et al. |
| 7,052,553 B1 | 5/2006 | Shih et al. |
| 7,071,532 B2 | 7/2006 | Geffken et al. |
| 7,084,070 B1 | 8/2006 | Lee et al. |
| 7,115,525 B2 | 10/2006 | Abatchev et al. |
| 7,122,949 B2 | 10/2006 | Strikovski |
| 7,138,767 B2 | 11/2006 | Chen et al. |
| 7,145,725 B2 | 12/2006 | Hasel et al. |
| 7,148,155 B1 | 12/2006 | Tarafdar et al. |
| 7,166,233 B2 | 1/2007 | Johnson et al. |
| 7,183,214 B2 | 2/2007 | Nam et al. |
| 7,196,342 B2 | 3/2007 | Ershov et al. |
| 7,226,805 B2 | 6/2007 | Hallin et al. |
| 7,235,137 B2 | 6/2007 | Kitayama et al. |
| 7,244,474 B2 | 7/2007 | Hanawa et al. |
| 7,252,011 B2 | 8/2007 | Traverso |
| 7,252,716 B2 | 8/2007 | Kim et al. |
| 7,253,123 B2 | 8/2007 | Arghavani et al. |
| 7,256,370 B2 | 8/2007 | Guiver |
| 7,274,004 B2 | 9/2007 | Benjamin et al. |
| 7,288,482 B2 | 10/2007 | Panda et al. |
| 7,291,360 B2 | 11/2007 | Hanawa et al. |
| 7,297,894 B1 | 11/2007 | Tsukamoto |
| 7,316,761 B2 | 1/2008 | Doan et al. |
| 7,329,608 B2 | 2/2008 | Babayan et al. |
| 7,341,633 B2 | 3/2008 | Lubomirsky et al. |
| 7,344,912 B1 | 3/2008 | Okoroanyanwu |
| 7,358,192 B2 | 4/2008 | Merry et al. |
| 7,361,865 B2 | 4/2008 | Maki et al. |
| 7,364,956 B2 | 4/2008 | Saito |
| 7,365,016 B2 | 4/2008 | Ouellet et al. |
| 7,396,480 B2 | 7/2008 | Kao et al. |
| 7,396,773 B1 | 7/2008 | Blosse et al. |
| 7,416,989 B1 | 8/2008 | Liu et al. |
| 7,465,358 B2 | 12/2008 | Weidman et al. |
| 7,465,953 B1 | 12/2008 | Koh et al. |
| 7,468,319 B2 | 12/2008 | Lee |
| 7,479,303 B2 | 1/2009 | Byun et al. |
| 7,484,473 B2 | 2/2009 | Keller et al. |
| 7,488,688 B2 | 2/2009 | Chung et al. |
| 7,494,545 B2 | 2/2009 | Lam et al. |
| 7,500,445 B2 | 3/2009 | Zhao et al. |
| 7,504,040 B2 | 3/2009 | Lijima et al. |
| 7,513,214 B2 | 4/2009 | Okumura et al. |
| 7,520,957 B2 | 4/2009 | Kao et al. |
| 7,543,546 B2 | 6/2009 | Shibata et al. |
| 7,553,756 B2 | 6/2009 | Hayashi et al. |
| 7,575,007 B2 | 8/2009 | Tang et al. |
| 7,581,511 B2 | 9/2009 | Mardian et al. |
| 7,604,708 B2 | 10/2009 | Wood et al. |
| 7,611,980 B2 | 11/2009 | Wells |
| 7,628,897 B2 | 12/2009 | Mungekar et al. |
| 7,658,799 B2 | 2/2010 | Ishikawa et al. |
| 7,682,518 B2 | 3/2010 | Chandrachood et al. |
| 7,695,590 B2 | 4/2010 | Hanawa et al. |
| 7,708,859 B2 | 5/2010 | Huang et al. |
| 7,722,925 B2 | 5/2010 | White et al. |
| 7,723,221 B2 | 5/2010 | Hayashi |
| 7,749,326 B2 | 7/2010 | Kim et al. |
| 7,780,790 B2 | 8/2010 | Nogami |
| 7,785,672 B2 | 8/2010 | Choi et al. |
| 7,790,634 B2 | 9/2010 | Munro et al. |
| 7,806,077 B2 | 10/2010 | Lee et al. |
| 7,806,078 B2 | 10/2010 | Yoshida |
| 7,807,578 B2 | 10/2010 | Bencher et al. |
| 7,825,038 B2 | 11/2010 | Ingle et al. |
| 7,837,828 B2 | 11/2010 | Ikeda et al. |
| 7,845,309 B2 | 12/2010 | Condrashoff et al. |
| 7,867,926 B2 | 1/2011 | Satoh et al. |
| 7,906,818 B2 | 3/2011 | Pekny |
| 7,915,139 B1 | 3/2011 | Lang et al. |
| 7,922,863 B2 | 4/2011 | Ripley |
| 7,932,181 B2 | 4/2011 | Singh et al. |
| 7,939,422 B2 | 5/2011 | Ingle et al. |
| 7,968,441 B2 | 6/2011 | Xu |
| 7,976,631 B2 | 7/2011 | Burrows |
| 7,977,249 B1 | 7/2011 | Liu |
| 7,981,806 B2 | 7/2011 | Jung |
| 7,989,365 B2 | 8/2011 | Park et al. |
| 8,008,166 B2 | 8/2011 | Sanchez et al. |
| 8,048,811 B2 | 11/2011 | Feustel et al. |
| 8,058,179 B1 | 11/2011 | Draeger et al. |
| 8,071,482 B2 | 12/2011 | Kawada |
| 8,074,599 B2 | 12/2011 | Choi et al. |
| 8,076,198 B2 | 12/2011 | Lee et al. |
| 8,083,853 B2 | 12/2011 | Choi et al. |
| 8,114,245 B2 | 2/2012 | Ohmi et al. |
| 8,119,530 B2 | 2/2012 | Hori et al. |
| 8,133,349 B1 | 3/2012 | Panagopoulos |
| 8,173,228 B2 | 5/2012 | Choi et al. |
| 8,183,134 B2 | 5/2012 | Wu |
| 8,187,486 B1 | 5/2012 | Liu et al. |
| 8,199,454 B2 | 6/2012 | Koyama et al. |
| 8,211,808 B2 | 7/2012 | Sapre et al. |
| 8,216,486 B2 | 7/2012 | Dhindsa |
| 8,222,128 B2 | 7/2012 | Sasaki et al. |
| 8,252,194 B2 | 8/2012 | Kiehlbauch et al. |
| 8,272,346 B2 | 9/2012 | Bettencourt et al. |
| 8,295,089 B2 | 10/2012 | Jeong et al. |
| 8,298,627 B2 | 10/2012 | Minami et al. |
| 8,298,959 B2 | 10/2012 | Cheshire |
| 8,309,440 B2 | 11/2012 | Sanchez et al. |
| 8,312,839 B2 | 11/2012 | Baek |
| 8,313,610 B2 | 11/2012 | Dhindsa |
| 8,328,939 B2 | 12/2012 | Choi et al. |
| 8,329,262 B2 | 12/2012 | Miller et al. |

(56) References Cited

U.S. PATENT DOCUMENTS

| | | |
|---|---|---|
| 8,336,188 B2 | 12/2012 | Monteen |
| 8,343,306 B2 | 1/2013 | Tanaka et al. |
| 8,357,435 B2 | 1/2013 | Lubomirsky |
| 8,361,892 B2 | 1/2013 | Tam et al. |
| 8,368,308 B2 | 2/2013 | Banna et al. |
| 8,390,980 B2 | 3/2013 | Sansoni et al. |
| 8,398,777 B2 | 3/2013 | Collins et al. |
| 8,427,067 B2 | 4/2013 | Espiau et al. |
| 8,435,902 B2 | 5/2013 | Tang et al. |
| 8,440,523 B1 | 5/2013 | Guillorn et al. |
| 8,466,073 B2 | 6/2013 | Wang et al. |
| 8,475,674 B2 | 7/2013 | Thadani et al. |
| 8,480,850 B2 | 7/2013 | Tyler et al. |
| 8,491,805 B2 | 7/2013 | Kushibiki et al. |
| 8,501,629 B2 | 8/2013 | Tang et al. |
| 8,506,713 B2 | 8/2013 | Takagi |
| 8,512,509 B2 | 8/2013 | Bera et al. |
| 8,528,889 B2 | 9/2013 | Sansoni et al. |
| 8,540,844 B2 | 9/2013 | Hudson et al. |
| 8,551,891 B2 | 10/2013 | Liang |
| 8,573,152 B2 | 11/2013 | De La Llera |
| 8,622,021 B2 | 1/2014 | Taylor et al. |
| 8,623,471 B2 | 1/2014 | Tyler et al. |
| 8,633,423 B2 | 1/2014 | Lin et al. |
| 8,642,481 B2 | 2/2014 | Wang et al. |
| 8,652,298 B2 | 2/2014 | Dhindsa et al. |
| 8,668,836 B2 | 3/2014 | Mizukami et al. |
| 8,679,354 B2 | 3/2014 | O'Hara |
| 8,679,982 B2 | 3/2014 | Wang et al. |
| 8,679,983 B2 | 3/2014 | Wang et al. |
| 8,691,023 B2 | 4/2014 | Bao et al. |
| 8,702,902 B2 | 4/2014 | Blom et al. |
| 8,741,778 B2 | 6/2014 | Yang et al. |
| 8,747,610 B2 | 6/2014 | Chen et al. |
| 8,747,680 B1 | 6/2014 | Deshpande |
| 8,748,322 B1 | 6/2014 | Fung et al. |
| 8,765,574 B2 | 7/2014 | Zhang et al. |
| 8,771,536 B2 | 7/2014 | Zhang et al. |
| 8,771,539 B2 | 7/2014 | Zhang et al. |
| 8,772,888 B2 | 7/2014 | Jung et al. |
| 8,778,079 B2 | 7/2014 | Begarney et al. |
| 8,801,952 B1 | 8/2014 | Wang et al. |
| 8,802,572 B2 | 8/2014 | Nemani et al. |
| 8,808,563 B2 | 8/2014 | Wang et al. |
| 8,815,720 B2 | 8/2014 | Godet et al. |
| 8,835,316 B2 | 9/2014 | Yin et al. |
| 8,846,163 B2 | 9/2014 | Kao et al. |
| 8,869,742 B2 | 10/2014 | Dhindsa |
| 8,871,651 B1 | 10/2014 | Choi et al. |
| 8,888,087 B2 | 11/2014 | Okabe et al. |
| 8,894,767 B2 | 11/2014 | Goradia et al. |
| 8,895,449 B1 | 11/2014 | Zhu et al. |
| 8,900,364 B2 | 12/2014 | Wright |
| 8,921,234 B2 | 12/2014 | Liu et al. |
| 8,927,390 B2 | 1/2015 | Sapre et al. |
| 8,932,947 B1 | 1/2015 | Han et al. |
| 8,937,017 B2 | 1/2015 | Cheshire et al. |
| 8,945,414 B1 | 2/2015 | Su et al. |
| 8,946,665 B2 | 2/2015 | Shim et al. |
| 8,946,828 B2 | 2/2015 | Sun et al. |
| 8,951,429 B1 | 2/2015 | Liu et al. |
| 8,956,980 B1 | 2/2015 | Chen et al. |
| 8,969,212 B2 | 3/2015 | Ren et al. |
| 8,970,114 B2 | 3/2015 | Busche et al. |
| 8,980,005 B2 | 3/2015 | Carlson et al. |
| 8,980,758 B1 | 3/2015 | Ling et al. |
| 8,980,763 B2 | 3/2015 | Wang et al. |
| 8,992,723 B2 | 3/2015 | Sorensen et al. |
| 8,999,656 B2 | 4/2015 | Jirstrom et al. |
| 8,999,839 B2 | 4/2015 | Su et al. |
| 8,999,856 B2 | 4/2015 | Zhang et al. |
| 9,012,302 B2 | 4/2015 | Sapre et al. |
| 9,017,481 B1 | 4/2015 | Pettinger et al. |
| 9,023,732 B2 | 5/2015 | Wang et al. |
| 9,023,734 B2 | 5/2015 | Chen et al. |
| 9,034,770 B2 | 5/2015 | Park et al. |
| 9,040,422 B2 | 5/2015 | Wang et al. |
| 9,064,815 B2 | 6/2015 | Zhang et al. |
| 9,064,816 B2 | 6/2015 | Kim et al. |
| 9,068,265 B2 | 6/2015 | Lubomirsky et al. |
| 9,072,158 B2 | 6/2015 | Ikeda et al. |
| 9,093,371 B2 | 7/2015 | Wang et al. |
| 9,093,389 B2 | 7/2015 | Nemani |
| 9,093,390 B2 | 7/2015 | Wang et al. |
| 9,099,398 B2 | 8/2015 | Kang et al. |
| 9,111,877 B2 | 8/2015 | Chen et al. |
| 9,111,907 B2 | 8/2015 | Kamineni |
| 9,114,438 B2 | 8/2015 | Hoinkis et al. |
| 9,117,855 B2 | 8/2015 | Cho et al. |
| 9,132,436 B2 | 9/2015 | Liang et al. |
| 9,136,273 B1 | 9/2015 | Purayath et al. |
| 9,144,147 B2 | 9/2015 | Yang et al. |
| 9,153,442 B2 | 10/2015 | Wang et al. |
| 9,159,606 B1 | 10/2015 | Purayath et al. |
| 9,165,783 B2 | 10/2015 | Nemani et al. |
| 9,165,786 B1 | 10/2015 | Purayath et al. |
| 9,184,055 B2 | 11/2015 | Wang et al. |
| 9,190,290 B2 | 11/2015 | Xue et al. |
| 9,190,293 B2 | 11/2015 | Wang et al. |
| 9,190,302 B2 | 11/2015 | Ni |
| 9,202,708 B1 | 12/2015 | Chen et al. |
| 9,209,012 B2 | 12/2015 | Chen et al. |
| 9,236,265 B2 | 1/2016 | Korolik et al. |
| 9,236,266 B2 | 1/2016 | Zhang et al. |
| 9,240,315 B1 | 1/2016 | Hsieh et al. |
| 9,245,762 B2 | 1/2016 | Zhang et al. |
| 9,263,278 B2 | 2/2016 | Purayath et al. |
| 9,267,739 B2 | 2/2016 | Chen et al. |
| 9,269,590 B2 | 2/2016 | Luere et al. |
| 9,275,834 B1 | 3/2016 | Park et al. |
| 9,281,384 B2 | 3/2016 | Takeguchi |
| 9,287,095 B2 | 3/2016 | Nguyen et al. |
| 9,287,134 B2 | 3/2016 | Wang et al. |
| 9,293,568 B2 | 3/2016 | Ko |
| 9,299,537 B2 | 3/2016 | Kobayashi et al. |
| 9,299,538 B2 | 3/2016 | Kobayashi et al. |
| 9,299,539 B2 | 3/2016 | Makhratchev |
| 9,299,575 B2 | 3/2016 | Park et al. |
| 9,299,582 B2 | 3/2016 | Ingle et al. |
| 9,299,583 B1 | 3/2016 | Wang et al. |
| 9,309,598 B2 | 4/2016 | Wang et al. |
| 9,324,576 B2 | 4/2016 | Zhang et al. |
| 9,343,272 B1 | 5/2016 | Pandit et al. |
| 9,343,327 B2 | 5/2016 | Zhang et al. |
| 9,349,605 B1 | 5/2016 | Xu et al. |
| 9,355,856 B2 | 5/2016 | Wang et al. |
| 9,355,862 B2 | 5/2016 | Pandit et al. |
| 9,355,863 B2 | 5/2016 | Chen et al. |
| 9,355,922 B2 | 5/2016 | Park et al. |
| 9,362,130 B2 | 6/2016 | Ingle et al. |
| 9,362,163 B2 | 6/2016 | Danek et al. |
| 9,368,364 B2 | 6/2016 | Park et al. |
| 9,373,517 B2 | 6/2016 | Yang et al. |
| 9,373,522 B1 | 6/2016 | Wang et al. |
| 9,378,969 B2 | 6/2016 | Hsu et al. |
| 9,378,978 B2 | 6/2016 | Purayath et al. |
| 9,384,997 B2 | 7/2016 | Ren et al. |
| 9,385,028 B2 | 7/2016 | Nemani et al. |
| 9,390,937 B2 | 7/2016 | Chen et al. |
| 9,396,961 B2 | 7/2016 | Arghavani et al. |
| 9,396,989 B2 | 7/2016 | Purayath et al. |
| 9,406,523 B2 | 8/2016 | Chen et al. |
| 9,412,608 B2 | 8/2016 | Wang et al. |
| 9,412,752 B1 | 8/2016 | Yeh et al. |
| 9,418,858 B2 | 8/2016 | Wang et al. |
| 9,425,041 B2 | 8/2016 | Berry et al. |
| 9,425,057 B2 | 8/2016 | Cho et al. |
| 9,425,058 B2 | 8/2016 | Kim et al. |
| 9,431,268 B2 | 8/2016 | Lill et al. |
| 9,431,414 B2 | 8/2016 | Jang et al. |
| 9,343,358 B1 | 9/2016 | Montgomery |
| 9,437,451 B2 | 9/2016 | Chen et al. |
| 9,443,749 B2 | 9/2016 | Smith |
| 9,449,795 B2 | 9/2016 | Sabri et al. |

(56) References Cited

U.S. PATENT DOCUMENTS

| | | | |
|---|---|---|---|
| 9,449,843 B1* | 9/2016 | Korolik | H01L 21/32135 |
| 9,449,845 B2 | 9/2016 | Liu et al. | |
| 9,449,846 B2 | 9/2016 | Liu et al. | |
| 9,449,850 B2 | 9/2016 | Wang et al. | |
| 9,460,959 B1 | 10/2016 | Xie et al. | |
| 9,466,469 B2 | 10/2016 | Khaja | |
| 9,472,412 B2 | 10/2016 | Zhang et al. | |
| 9,472,417 B2 | 10/2016 | Ingle et al. | |
| 9,478,432 B2 | 10/2016 | Chen et al. | |
| 9,478,433 B1 | 10/2016 | Zhou et al. | |
| 9,478,434 B2 | 10/2016 | Wang et al. | |
| 9,493,879 B2 | 11/2016 | Hoinkis et al. | |
| 9,496,167 B2 | 11/2016 | Purayath et al. | |
| 9,499,898 B2 | 11/2016 | Nguyen et al. | |
| 9,502,258 B2 | 11/2016 | Xue et al. | |
| 9,508,529 B2 | 11/2016 | Valcore et al. | |
| 9,520,303 B2 | 12/2016 | Wang et al. | |
| 9,534,724 B2 | 1/2017 | Jiang et al. | |
| 9,543,163 B2 | 1/2017 | Ling et al. | |
| 9,564,296 B2 | 2/2017 | Kobayashi et al. | |
| 9,564,338 B1 | 2/2017 | Zhang et al. | |
| 9,576,788 B2 | 2/2017 | Liu et al. | |
| 9,576,809 B2 | 2/2017 | Korolik et al. | |
| 9,576,815 B2 | 2/2017 | Xu et al. | |
| 9,607,856 B2 | 3/2017 | Wang et al. | |
| 9,613,822 B2 | 4/2017 | Chen et al. | |
| 9,659,753 B2 | 5/2017 | Cho et al. | |
| 9,659,791 B2 | 5/2017 | Wang et al. | |
| 9,659,792 B2* | 5/2017 | Wang | H01L 21/324 |
| 9,666,449 B2 | 5/2017 | Koval et al. | |
| 9,691,645 B2 | 6/2017 | Benjaminson et al. | |
| 9,704,723 B2 | 7/2017 | Wang et al. | |
| 9,711,366 B2 | 7/2017 | Ingle et al. | |
| 9,721,789 B1 | 8/2017 | Yang et al. | |
| 9,728,437 B2 | 8/2017 | Tran et al. | |
| 9,741,593 B2 | 8/2017 | Benjaminson et al. | |
| 9,754,800 B2 | 9/2017 | Zhang et al. | |
| 9,768,034 B1 | 9/2017 | Xu et al. | |
| 9,773,648 B2 | 9/2017 | Cho et al. | |
| 9,773,695 B2 | 9/2017 | Purayath et al. | |
| 9,779,956 B1 | 10/2017 | Zhang et al. | |
| 9,812,462 B1 | 11/2017 | Pang et al. | |
| 9,822,009 B2 | 11/2017 | Kagaya et al. | |
| 9,831,097 B2 | 11/2017 | Ingle et al. | |
| 9,837,249 B2 | 12/2017 | Kobayashi et al. | |
| 9,837,284 B2 | 12/2017 | Chen et al. | |
| 9,837,286 B2 | 12/2017 | Yang et al. | |
| 9,842,744 B2 | 12/2017 | Zhang et al. | |
| 9,865,484 B1 | 1/2018 | Citla et al. | |
| 9,881,805 B2 | 1/2018 | Li et al. | |
| 9,885,117 B2 | 2/2018 | Lubomirsky et al. | |
| 9,887,096 B2 | 2/2018 | Park et al. | |
| 9,903,020 B2 | 2/2018 | Kim et al. | |
| 9,934,942 B1 | 4/2018 | Lubomirsky | |
| 9,941,097 B2 | 4/2018 | Yamazawa | |
| 9,947,549 B1 | 4/2018 | Park et al. | |
| 9,960,045 B1 | 5/2018 | Purayath et al. | |
| 9,966,240 B2 | 5/2018 | Park et al. | |
| 9,978,564 B2 | 5/2018 | Liang et al. | |
| 9,991,134 B2 | 6/2018 | Wang et al. | |
| 10,026,621 B2 | 7/2018 | Ko et al. | |
| 10,032,606 B2 | 7/2018 | Yang et al. | |
| 10,043,674 B1 | 8/2018 | Korolik et al. | |
| 10,043,684 B1 | 8/2018 | Arnepalli et al. | |
| 10,049,891 B1 | 8/2018 | Wang et al. | |
| 10,062,578 B2 | 8/2018 | Zhang et al. | |
| 10,062,579 B2 | 8/2018 | Chen et al. | |
| 10,062,585 B2 | 8/2018 | Lubomirsky | |
| 10,062,587 B2 | 8/2018 | Chen et al. | |
| 10,083,830 B2 | 9/2018 | Seino et al. | |
| 10,121,689 B2 | 11/2018 | Konkola et al. | |
| 10,147,620 B2 | 12/2018 | Benjaminson et al. | |
| 10,147,736 B2 | 12/2018 | Linuma | |
| 10,256,079 B2 | 4/2019 | Lubomirsky et al. | |
| 10,269,541 B2 | 4/2019 | Stowell et al. | |
| 10,319,600 B1 | 6/2019 | Li et al. | |
| 10,319,739 B2 | 6/2019 | Purayath | |
| 10,354,843 B2 | 7/2019 | Liang et al. | |
| 2001/0003014 A1 | 6/2001 | Yuda | |
| 2001/0006093 A1 | 7/2001 | Tabuchi et al. | |
| 2001/0008803 A1 | 7/2001 | Takamatsu et al. | |
| 2001/0015175 A1 | 8/2001 | Masuda et al. | |
| 2001/0015261 A1 | 8/2001 | Kobayashi et al. | |
| 2001/0023741 A1 | 9/2001 | Collison et al. | |
| 2001/0028093 A1 | 10/2001 | Yamazaki et al. | |
| 2001/0028922 A1 | 10/2001 | Sandhu | |
| 2001/0029112 A1 | 10/2001 | Toyoda et al. | |
| 2001/0029891 A1 | 10/2001 | Oh et al. | |
| 2001/0030366 A1 | 10/2001 | Nakano et al. | |
| 2001/0034106 A1 | 10/2001 | Moise et al. | |
| 2001/0034121 A1 | 10/2001 | Fu et al. | |
| 2001/0035124 A1 | 11/2001 | Okayama et al. | |
| 2001/0035127 A1 | 11/2001 | Metzner et al. | |
| 2001/0036706 A1 | 11/2001 | Kitamura | |
| 2001/0037856 A1 | 11/2001 | Park | |
| 2001/0037941 A1 | 11/2001 | Thompson | |
| 2001/0039921 A1 | 11/2001 | Rolfson et al. | |
| 2001/0042512 A1 | 11/2001 | Xu et al. | |
| 2001/0042799 A1 | 11/2001 | Kim et al. | |
| 2001/0045269 A1 | 11/2001 | Yamada | |
| 2001/0047760 A1 | 12/2001 | Moslehi | |
| 2001/0053585 A1 | 12/2001 | Kikuchi et al. | |
| 2001/0053610 A1 | 12/2001 | Athavale | |
| 2001/0054381 A1 | 12/2001 | Umotoy et al. | |
| 2001/0054387 A1 | 12/2001 | Frankel et al. | |
| 2002/0000202 A1 | 1/2002 | Yuda et al. | |
| 2002/0001778 A1 | 1/2002 | Latchford et al. | |
| 2002/0009560 A1 | 1/2002 | Ozono | |
| 2002/0009885 A1 | 1/2002 | Brankner et al. | |
| 2002/0011210 A1 | 1/2002 | Satoh et al. | |
| 2002/0011214 A1 | 1/2002 | Kamarehi et al. | |
| 2002/0015791 A1 | 2/2002 | Tobe et al. | |
| 2002/0016080 A1 | 2/2002 | Khan et al. | |
| 2002/0016085 A1 | 2/2002 | Huang et al. | |
| 2002/0020429 A1 | 2/2002 | Selbrede et al. | |
| 2002/0023899 A1 | 2/2002 | Khater et al. | |
| 2002/0028582 A1 | 3/2002 | Nallan et al. | |
| 2002/0028585 A1 | 3/2002 | Chung et al. | |
| 2002/0029747 A1 | 3/2002 | Powell et al. | |
| 2002/0033233 A1 | 3/2002 | Savas | |
| 2002/0036143 A1 | 3/2002 | Segawa et al. | |
| 2002/0040764 A1 | 4/2002 | Kwan et al. | |
| 2002/0040766 A1 | 4/2002 | Takahashi | |
| 2002/0042192 A1 | 4/2002 | Tanaka et al. | |
| 2002/0043690 A1 | 4/2002 | Doyle et al. | |
| 2002/0045966 A1 | 4/2002 | Lee et al. | |
| 2002/0046991 A1 | 4/2002 | Smith et al. | |
| 2002/0048963 A1 | 4/2002 | Campbell et al. | |
| 2002/0050246 A1 | 5/2002 | Parkhe | |
| 2002/0054962 A1 | 5/2002 | Huang | |
| 2002/0062954 A1 | 5/2002 | Getchel et al. | |
| 2002/0069820 A1 | 6/2002 | Yudovsky | |
| 2002/0070414 A1 | 6/2002 | Drescher et al. | |
| 2002/0073925 A1 | 6/2002 | Noble et al. | |
| 2002/0074573 A1 | 6/2002 | Takeuchi et al. | |
| 2002/0075624 A1 | 6/2002 | Wang et al. | |
| 2002/0086501 A1 | 7/2002 | O'Donnell et al. | |
| 2002/0090781 A1 | 7/2002 | Skotnicki et al. | |
| 2002/0090835 A1 | 7/2002 | Chakravarti et al. | |
| 2002/0094378 A1 | 7/2002 | O'Donnell | |
| 2002/0094591 A1 | 7/2002 | Sill et al. | |
| 2002/0096493 A1 | 7/2002 | Hattori | |
| 2002/0098681 A1 | 7/2002 | Hu et al. | |
| 2002/0106845 A1 | 8/2002 | Chao et al. | |
| 2002/0112819 A1 | 8/2002 | Kamarehi et al. | |
| 2002/0124867 A1 | 9/2002 | Kim et al. | |
| 2002/0129769 A1 | 9/2002 | Kim et al. | |
| 2002/0129902 A1 | 9/2002 | Babayan et al. | |
| 2002/0144657 A1 | 10/2002 | Chiang et al. | |
| 2002/0153808 A1 | 10/2002 | Skotnicki et al. | |
| 2002/0164885 A1 | 11/2002 | Lill et al. | |
| 2002/0170678 A1 | 11/2002 | Hayashi et al. | |
| 2002/0177322 A1 | 11/2002 | Li et al. | |
| 2002/0179248 A1 | 12/2002 | Kabansky et al. | |

(56) References Cited

U.S. PATENT DOCUMENTS

| | | |
|---|---|---|
| 2002/0182878 A1 | 12/2002 | Hirose et al. |
| 2002/0185226 A1 | 12/2002 | Lea et al. |
| 2002/0187280 A1 | 12/2002 | Johnson et al. |
| 2002/0187655 A1 | 12/2002 | Tan et al. |
| 2002/0197823 A1 | 12/2002 | Yoo et al. |
| 2003/0000473 A1 | 1/2003 | Chae et al. |
| 2003/0000647 A1 | 1/2003 | Yudovsky et al. |
| 2003/0003757 A1 | 1/2003 | Nallan et al. |
| 2003/0007910 A1 | 1/2003 | Lazarovich et al. |
| 2003/0010452 A1 | 1/2003 | Park et al. |
| 2003/0010645 A1 | 1/2003 | Ting et al. |
| 2003/0015515 A1 | 1/2003 | Ito et al. |
| 2003/0019428 A1 | 1/2003 | Ku et al. |
| 2003/0019580 A1 | 1/2003 | Strang |
| 2003/0026060 A1 | 2/2003 | Hiramatsu et al. |
| 2003/0029566 A1 | 2/2003 | Roth |
| 2003/0029567 A1 | 2/2003 | Dhindsa et al. |
| 2003/0029715 A1 | 2/2003 | Yu et al. |
| 2003/0031905 A1 | 2/2003 | Saito et al. |
| 2003/0032284 A1 | 2/2003 | Enomoto et al. |
| 2003/0038127 A1 | 2/2003 | Liu et al. |
| 2003/0038305 A1 | 2/2003 | Wasshuber |
| 2003/0054608 A1 | 3/2003 | Tseng et al. |
| 2003/0066482 A1 | 4/2003 | Pokharna et al. |
| 2003/0066607 A1 | 4/2003 | White et al. |
| 2003/0070761 A1 | 4/2003 | Turlot et al. |
| 2003/0071035 A1 | 4/2003 | Brailove |
| 2003/0072639 A1 | 4/2003 | White et al. |
| 2003/0075808 A1 | 4/2003 | Inoue et al. |
| 2003/0077857 A1 | 4/2003 | Xia et al. |
| 2003/0077909 A1 | 4/2003 | Jiwari |
| 2003/0079686 A1 | 5/2003 | Chen et al. |
| 2003/0087488 A1 | 5/2003 | Fink et al. |
| 2003/0087531 A1 | 5/2003 | Kang et al. |
| 2003/0091938 A1 | 5/2003 | Fairbairn et al. |
| 2003/0094134 A1 | 5/2003 | Minami |
| 2003/0098125 A1 | 5/2003 | An |
| 2003/0101938 A1 | 6/2003 | Ronsse et al. |
| 2003/0109143 A1 | 6/2003 | Hsieh et al. |
| 2003/0116087 A1 | 6/2003 | Nguyen et al. |
| 2003/0116439 A1 | 6/2003 | Seo et al. |
| 2003/0119328 A1 | 6/2003 | Fujisato |
| 2003/0121608 A1 | 7/2003 | Chen et al. |
| 2003/0121609 A1 | 7/2003 | Ohmi et al. |
| 2003/0124465 A1 | 7/2003 | Lee et al. |
| 2003/0124842 A1 | 7/2003 | Hytros et al. |
| 2003/0127049 A1 | 7/2003 | Han et al. |
| 2003/0127740 A1 | 7/2003 | Hsu et al. |
| 2003/0129106 A1 | 7/2003 | Sorensen et al. |
| 2003/0129827 A1 | 7/2003 | Lee et al. |
| 2003/0132319 A1 | 7/2003 | Hytros et al. |
| 2003/0136520 A1 | 7/2003 | Yudovsky et al. |
| 2003/0140844 A1 | 7/2003 | Maa et al. |
| 2003/0143328 A1 | 7/2003 | Chen et al. |
| 2003/0148035 A1 | 8/2003 | Lingampalli |
| 2003/0150530 A1 | 8/2003 | Lin et al. |
| 2003/0152691 A1 | 8/2003 | Baude |
| 2003/0159307 A1 | 8/2003 | Sago et al. |
| 2003/0164226 A1 | 9/2003 | Kanno et al. |
| 2003/0168439 A1 | 9/2003 | Kanno et al. |
| 2003/0170945 A1 | 9/2003 | Igeta et al. |
| 2003/0173333 A1 | 9/2003 | Wang et al. |
| 2003/0173347 A1 | 9/2003 | Guiver |
| 2003/0173675 A1 | 9/2003 | Watanabe |
| 2003/0181040 A1 | 9/2003 | Ivanov et al. |
| 2003/0183244 A1 | 10/2003 | Rossman |
| 2003/0190426 A1 | 10/2003 | Padhi et al. |
| 2003/0196757 A1 | 10/2003 | Todorow et al. |
| 2003/0196760 A1 | 10/2003 | Tyler et al. |
| 2003/0199170 A1 | 10/2003 | Li |
| 2003/0200929 A1 | 10/2003 | Otsuki |
| 2003/0201764 A1 | 10/2003 | Jafari et al. |
| 2003/0205329 A1 | 11/2003 | Gujer et al. |
| 2003/0205479 A1 | 11/2003 | Lin et al. |
| 2003/0209323 A1 | 11/2003 | Yokogaki et al. |
| 2003/0215570 A1 | 11/2003 | Seutter et al. |
| 2003/0215963 A1 | 11/2003 | AmRhein et al. |
| 2003/0216044 A1 | 11/2003 | Lin et al. |
| 2003/0217812 A1 | 11/2003 | Yoshiki et al. |
| 2003/0221780 A1 | 12/2003 | Lei et al. |
| 2003/0224217 A1 | 12/2003 | Byun et al. |
| 2003/0224617 A1 | 12/2003 | Baek et al. |
| 2003/0230385 A1 | 12/2003 | Bach et al. |
| 2004/0002221 A1 | 1/2004 | O'Donnell et al. |
| 2004/0003828 A1 | 1/2004 | Jackson |
| 2004/0005726 A1 | 1/2004 | Huang |
| 2004/0018304 A1 | 1/2004 | Chung et al. |
| 2004/0020801 A1 | 2/2004 | Solling |
| 2004/0026371 A1 | 2/2004 | Nguyen et al. |
| 2004/0033678 A1 | 2/2004 | Arghavani et al. |
| 2004/0033684 A1 | 2/2004 | Li |
| 2004/0050328 A1 | 3/2004 | Kumagai et al. |
| 2004/0058070 A1 | 3/2004 | Takeuchi et al. |
| 2004/0058293 A1 | 3/2004 | Nguyen et al. |
| 2004/0060514 A1 | 4/2004 | Janakiraman et al. |
| 2004/0061447 A1 | 4/2004 | Saigusa et al. |
| 2004/0069225 A1 | 4/2004 | Fairbairn et al. |
| 2004/0070346 A1 | 4/2004 | Choi |
| 2004/0072446 A1 | 4/2004 | Liu et al. |
| 2004/0076529 A1 | 4/2004 | Gnauck et al. |
| 2004/0083962 A1 | 5/2004 | Bang |
| 2004/0083967 A1 | 5/2004 | Yuda et al. |
| 2004/0087139 A1 | 5/2004 | Yeh et al. |
| 2004/0092063 A1 | 5/2004 | Okumura |
| 2004/0099285 A1 | 5/2004 | Wange et al. |
| 2004/0099378 A1 | 5/2004 | Kim et al. |
| 2004/0101667 A1 | 5/2004 | O'Loughlin et al. |
| 2004/0103844 A1 | 6/2004 | Chou et al. |
| 2004/0107908 A1 | 6/2004 | Collins et al. |
| 2004/0108067 A1 | 6/2004 | Fischione et al. |
| 2004/0108068 A1 | 6/2004 | Senzaki et al. |
| 2004/0115876 A1 | 6/2004 | Goundar et al. |
| 2004/0115947 A1 | 6/2004 | Fink et al. |
| 2004/0118519 A1 | 6/2004 | Sen et al. |
| 2004/0124280 A1 | 7/2004 | Shih et al. |
| 2004/0129671 A1 | 7/2004 | Ji et al. |
| 2004/0137161 A1 | 7/2004 | Segawa et al. |
| 2004/0140053 A1 | 7/2004 | Srivastava et al. |
| 2004/0144311 A1 | 7/2004 | Chen et al. |
| 2004/0144490 A1 | 7/2004 | Zhao et al. |
| 2004/0147126 A1 | 7/2004 | Yamashita et al. |
| 2004/0149223 A1 | 8/2004 | Collison et al. |
| 2004/0149387 A1 | 8/2004 | Kim et al. |
| 2004/0149394 A1 | 8/2004 | Doan et al. |
| 2004/0152342 A1 | 8/2004 | Li |
| 2004/0154535 A1 | 8/2004 | Chen et al. |
| 2004/0157444 A1 | 8/2004 | Chiu |
| 2004/0161921 A1 | 8/2004 | Ryu |
| 2004/0163590 A1 | 8/2004 | Tran et al. |
| 2004/0163594 A1 | 8/2004 | Windhorn |
| 2004/0163601 A1 | 8/2004 | Kadotani et al. |
| 2004/0175913 A1 | 9/2004 | Johnson et al. |
| 2004/0175929 A1 | 9/2004 | Schmitt et al. |
| 2004/0182315 A1 | 9/2004 | Laflamme et al. |
| 2004/0187787 A1 | 9/2004 | Dawson et al. |
| 2004/0192032 A1 | 9/2004 | Ohmori et al. |
| 2004/0194799 A1 | 10/2004 | Kim et al. |
| 2004/0195208 A1 | 10/2004 | Pavel et al. |
| 2004/0195216 A1 | 10/2004 | Strang |
| 2004/0200499 A1 | 10/2004 | Harvey |
| 2004/0201843 A1 | 10/2004 | Glenn et al. |
| 2004/0206730 A1 | 10/2004 | Holber et al. |
| 2004/0211357 A1 | 10/2004 | Gadgil et al. |
| 2004/0219723 A1 | 11/2004 | Peng et al. |
| 2004/0219737 A1 | 11/2004 | Quon |
| 2004/0219789 A1 | 11/2004 | Wood et al. |
| 2004/0221809 A1 | 11/2004 | Ohmi et al. |
| 2004/0231706 A1 | 11/2004 | Bhatnagar et al. |
| 2004/0237897 A1 | 12/2004 | Hanawa et al. |
| 2004/0238123 A1 | 12/2004 | Becknell et al. |
| 2004/0259367 A1 | 12/2004 | Constantine et al. |
| 2004/0263827 A1 | 12/2004 | Xu |
| 2005/0000430 A1 | 1/2005 | Jang et al. |
| 2005/0000432 A1 | 1/2005 | Keller et al. |

(56) References Cited

U.S. PATENT DOCUMENTS

| | | |
|---|---|---|
| 2005/0001276 A1 | 1/2005 | Gao et al. |
| 2005/0003676 A1 | 1/2005 | Ho et al. |
| 2005/0009340 A1 | 1/2005 | Saijo et al. |
| 2005/0009358 A1 | 1/2005 | Choi et al. |
| 2005/0026430 A1 | 2/2005 | Kim et al. |
| 2005/0026431 A1 | 2/2005 | Kazumi et al. |
| 2005/0035455 A1 | 2/2005 | Hu et al. |
| 2005/0039679 A1 | 2/2005 | Kleshock |
| 2005/0051094 A1 | 3/2005 | Schaepkens et al. |
| 2005/0054167 A1 | 3/2005 | Choi et al. |
| 2005/0056218 A1 | 3/2005 | Sun et al. |
| 2005/0073051 A1 | 4/2005 | Yamamoto et al. |
| 2005/0077284 A1 | 4/2005 | Natsuhara et al. |
| 2005/0079706 A1 | 4/2005 | Kumar et al. |
| 2005/0087517 A1 | 4/2005 | Ott et al. |
| 2005/0090078 A1 | 4/2005 | Ishihara |
| 2005/0090120 A1 | 4/2005 | Hasegawa et al. |
| 2005/0098111 A1 | 5/2005 | Shimizu et al. |
| 2005/0103267 A1 | 5/2005 | Hur et al. |
| 2005/0105991 A1 | 5/2005 | Hofmeister et al. |
| 2005/0109279 A1 | 5/2005 | Suzuki |
| 2005/0112876 A1 | 5/2005 | Wu |
| 2005/0112901 A1 | 5/2005 | Ji et al. |
| 2005/0123690 A1 | 6/2005 | Derderian et al. |
| 2005/0133849 A1 | 6/2005 | Jeon et al. |
| 2005/0136188 A1 | 6/2005 | Chang |
| 2005/0139578 A1 | 6/2005 | Fukuda et al. |
| 2005/0145173 A1 | 7/2005 | Holber et al. |
| 2005/0145341 A1 | 7/2005 | Suzuki |
| 2005/0164479 A1 | 7/2005 | Perng et al. |
| 2005/0167394 A1 | 8/2005 | Liu et al. |
| 2005/0176258 A1 | 8/2005 | Hirose et al. |
| 2005/0178746 A1 | 8/2005 | Gorin |
| 2005/0178748 A1 | 8/2005 | Buchberger et al. |
| 2005/0181588 A1 | 8/2005 | Kim |
| 2005/0183666 A1 | 8/2005 | Tsuji et al. |
| 2005/0183827 A1 | 8/2005 | White et al. |
| 2005/0194094 A1 | 9/2005 | Yasaka |
| 2005/0196967 A1 | 9/2005 | Savas et al. |
| 2005/0199489 A1 | 9/2005 | Stevens et al. |
| 2005/0205110 A1 | 9/2005 | Kao et al. |
| 2005/0205862 A1 | 9/2005 | Koemtzopoulos et al. |
| 2005/0208215 A1 | 9/2005 | Eguchi et al. |
| 2005/0208217 A1 | 9/2005 | Shinriki et al. |
| 2005/0214477 A1 | 9/2005 | Hanawa et al. |
| 2005/0217582 A1 | 10/2005 | Kim et al. |
| 2005/0218507 A1 | 10/2005 | Kao et al. |
| 2005/0219786 A1 | 10/2005 | Brown et al. |
| 2005/0221552 A1 | 10/2005 | Kao et al. |
| 2005/0224181 A1 | 10/2005 | Merry et al. |
| 2005/0229848 A1 | 10/2005 | Shinriki et al. |
| 2005/0230350 A1 | 10/2005 | Kao et al. |
| 2005/0236694 A1 | 10/2005 | Wu et al. |
| 2005/0238807 A1 | 10/2005 | Lin et al. |
| 2005/0239282 A1 | 10/2005 | Chen et al. |
| 2005/0241579 A1 | 11/2005 | Kidd |
| 2005/0241583 A1 | 11/2005 | Buechel et al. |
| 2005/0241763 A1 | 11/2005 | Huang et al. |
| 2005/0247672 A1 | 11/2005 | Tatsumi |
| 2005/0251990 A1 | 11/2005 | Choi et al. |
| 2005/0257890 A1 | 11/2005 | Park et al. |
| 2005/0258160 A1 | 11/2005 | Goto et al. |
| 2005/0266622 A1 | 12/2005 | Arghavani et al. |
| 2005/0266650 A1 | 12/2005 | Ahn et al. |
| 2005/0266691 A1 | 12/2005 | Gu et al. |
| 2005/0268856 A1 | 12/2005 | Miller et al. |
| 2005/0269030 A1 | 12/2005 | Kent et al. |
| 2005/0271812 A1 | 12/2005 | Myo et al. |
| 2005/0274324 A1 | 12/2005 | Takahashi et al. |
| 2005/0274396 A1 | 12/2005 | Shih et al. |
| 2005/0279454 A1 | 12/2005 | Snijders |
| 2005/0283321 A1 | 12/2005 | Yue et al. |
| 2005/0287688 A1 | 12/2005 | Won et al. |
| 2005/0287755 A1 | 12/2005 | Bachmann |
| 2005/0287771 A1 | 12/2005 | Seamons et al. |
| 2006/0000802 A1 | 1/2006 | Kumar et al. |
| 2006/0000805 A1 | 1/2006 | Todorow et al. |
| 2006/0005856 A1 | 1/2006 | Sun et al. |
| 2006/0005930 A1 | 1/2006 | Ikeda et al. |
| 2006/0006057 A1 | 1/2006 | Laermer |
| 2006/0008676 A1 | 1/2006 | Ebata et al. |
| 2006/0011298 A1 | 1/2006 | Lim et al. |
| 2006/0011299 A1 | 1/2006 | Condrashoff et al. |
| 2006/0016783 A1 | 1/2006 | Wu et al. |
| 2006/0019456 A1 | 1/2006 | Bu et al. |
| 2006/0019477 A1 | 1/2006 | Hanawa et al. |
| 2006/0019486 A1 | 1/2006 | Yu et al. |
| 2006/0021574 A1 | 2/2006 | Armour et al. |
| 2006/0021701 A1 | 2/2006 | Tobe et al. |
| 2006/0021703 A1 | 2/2006 | Umotoy et al. |
| 2006/0024954 A1 | 2/2006 | Wu et al. |
| 2006/0024956 A1 | 2/2006 | Zhijian et al. |
| 2006/0032833 A1 | 2/2006 | Kawaguchi et al. |
| 2006/0033678 A1 | 2/2006 | Lubomirsky et al. |
| 2006/0040055 A1 | 2/2006 | Nguyen et al. |
| 2006/0042545 A1 | 3/2006 | Shibata et al. |
| 2006/0043066 A1 | 3/2006 | Kamp |
| 2006/0046412 A1 | 3/2006 | Nguyen et al. |
| 2006/0046419 A1 | 3/2006 | Sandhu et al. |
| 2006/0046470 A1 | 3/2006 | Becknell |
| 2006/0051966 A1 | 3/2006 | Or et al. |
| 2006/0051968 A1 | 3/2006 | Joshi et al. |
| 2006/0054184 A1 | 3/2006 | Mozetic et al. |
| 2006/0054280 A1 | 3/2006 | Jang |
| 2006/0057828 A1 | 3/2006 | Omura et al. |
| 2006/0060942 A1 | 3/2006 | Minixhofer et al. |
| 2006/0065629 A1 | 3/2006 | Chen et al. |
| 2006/0073349 A1 | 4/2006 | Aihara et al. |
| 2006/0076108 A1 | 4/2006 | Holland et al. |
| 2006/0081337 A1 | 4/2006 | Himori et al. |
| 2006/0087644 A1 | 4/2006 | McMillin et al. |
| 2006/0090700 A1 | 5/2006 | Satoh et al. |
| 2006/0093756 A1 | 5/2006 | Rajagopalan et al. |
| 2006/0097397 A1 | 5/2006 | Russell et al. |
| 2006/0102076 A1 | 5/2006 | Smith et al. |
| 2006/0102587 A1 | 5/2006 | Kimura |
| 2006/0113038 A1 | 6/2006 | Gondhalekar et al. |
| 2006/0118178 A1 | 6/2006 | Desbiolles et al. |
| 2006/0118240 A1 | 6/2006 | Holber et al. |
| 2006/0121724 A1 | 6/2006 | Yue et al. |
| 2006/0124151 A1 | 6/2006 | Yamasaki et al. |
| 2006/0124242 A1 | 6/2006 | Kanarik et al. |
| 2006/0130971 A1 | 6/2006 | Chang et al. |
| 2006/0137613 A1 | 6/2006 | Kasai |
| 2006/0151115 A1 | 7/2006 | Kim |
| 2006/0157449 A1 | 7/2006 | Takahashi et al. |
| 2006/0162661 A1 | 7/2006 | Jung et al. |
| 2006/0166107 A1 | 7/2006 | Chen et al. |
| 2006/0166515 A1 | 7/2006 | Karim et al. |
| 2006/0169327 A1 | 8/2006 | Shajii et al. |
| 2006/0169410 A1 | 8/2006 | Maeda et al. |
| 2006/0178008 A1 | 8/2006 | Yeh et al. |
| 2006/0183270 A1 | 8/2006 | Humpston |
| 2006/0185592 A1 | 8/2006 | Matsuura |
| 2006/0191479 A1 | 8/2006 | Mizukami et al. |
| 2006/0191637 A1 | 8/2006 | Zajac et al. |
| 2006/0207504 A1 | 9/2006 | Hasebe et al. |
| 2006/0207595 A1 | 9/2006 | Ohmi et al. |
| 2006/0207971 A1 | 9/2006 | Moriya et al. |
| 2006/0210713 A1 | 9/2006 | Brcka |
| 2006/0210723 A1 | 9/2006 | Ishizaka |
| 2006/0211163 A1 | 9/2006 | Ouellet et al. |
| 2006/0215347 A1 | 9/2006 | Wakabayashi et al. |
| 2006/0216878 A1 | 9/2006 | Lee |
| 2006/0219360 A1 | 10/2006 | Iwasaki |
| 2006/0222481 A1 | 10/2006 | Foree |
| 2006/0226121 A1 | 10/2006 | Aoi |
| 2006/0228496 A1 | 10/2006 | Choi et al. |
| 2006/0228889 A1 | 10/2006 | Edelberg et al. |
| 2006/0240661 A1 | 10/2006 | Annapragada et al. |
| 2006/0244107 A1 | 11/2006 | Sugihara |
| 2006/0245852 A1 | 11/2006 | Iwabuchi |
| 2006/0246217 A1 | 11/2006 | Weidman et al. |
| 2006/0251800 A1 | 11/2006 | Weidman et al. |

(56) References Cited

U.S. PATENT DOCUMENTS

| | | |
|---|---|---|
| 2006/0251801 A1 | 11/2006 | Weidman et al. |
| 2006/0252252 A1 | 11/2006 | Zhu et al. |
| 2006/0252265 A1 | 11/2006 | Jin et al. |
| 2006/0254716 A1 | 11/2006 | Mosden et al. |
| 2006/0260750 A1 | 11/2006 | Rueger |
| 2006/0261490 A1 | 11/2006 | Su et al. |
| 2006/0264043 A1 | 11/2006 | Stewart et al. |
| 2006/0266288 A1 | 11/2006 | Choi |
| 2006/0285270 A1 | 12/2006 | Lee |
| 2006/0286774 A1 | 12/2006 | Singh et al. |
| 2006/0289384 A1 | 12/2006 | Pavel et al. |
| 2006/0292846 A1 | 12/2006 | Pinto et al. |
| 2007/0022952 A1 | 2/2007 | Ritchie et al. |
| 2007/0022954 A1 | 2/2007 | Iizuka et al. |
| 2007/0025907 A1 | 2/2007 | Rezeq |
| 2007/0039548 A1 | 2/2007 | Johnson |
| 2007/0048977 A1 | 3/2007 | Lee et al. |
| 2007/0051471 A1 | 3/2007 | Kawaguchi et al. |
| 2007/0056925 A1 | 3/2007 | Liu et al. |
| 2007/0062453 A1 | 3/2007 | Ishikawa |
| 2007/0066084 A1 | 3/2007 | Wajda et al. |
| 2007/0068625 A1 | 3/2007 | Funk et al. |
| 2007/0071888 A1 | 3/2007 | Shanmugasundram et al. |
| 2007/0072408 A1 | 3/2007 | Enomoto et al. |
| 2007/0077737 A1 | 4/2007 | Kobayashi |
| 2007/0079758 A1 | 4/2007 | Holland et al. |
| 2007/0090325 A1 | 4/2007 | Hwang et al. |
| 2007/0096658 A1 | 5/2007 | Saigusa et al. |
| 2007/0099428 A1 | 5/2007 | Shamiryan et al. |
| 2007/0099431 A1 | 5/2007 | Li |
| 2007/0099438 A1 | 5/2007 | Ye et al. |
| 2007/0107750 A1 | 5/2007 | Sawin et al. |
| 2007/0108404 A1 | 5/2007 | Stewart et al. |
| 2007/0111519 A1 | 5/2007 | Lubomirsky et al. |
| 2007/0117396 A1 | 5/2007 | Wu et al. |
| 2007/0119370 A1 | 5/2007 | Ma et al. |
| 2007/0119371 A1 | 5/2007 | Ma et al. |
| 2007/0123051 A1 | 5/2007 | Arghavani et al. |
| 2007/0128864 A1 | 6/2007 | Ma |
| 2007/0128876 A1 | 6/2007 | Fukiage |
| 2007/0131274 A1 | 6/2007 | Stollwerck et al. |
| 2007/0145023 A1 | 6/2007 | Holber et al. |
| 2007/0148349 A1 | 6/2007 | Fukada |
| 2007/0154838 A1 | 7/2007 | Lee |
| 2007/0163440 A1 | 7/2007 | Kim et al. |
| 2007/0169703 A1 | 7/2007 | Elliot et al. |
| 2007/0175861 A1 | 8/2007 | Hwang et al. |
| 2007/0181057 A1 | 8/2007 | Lam et al. |
| 2007/0193515 A1 | 8/2007 | Jeon et al. |
| 2007/0197028 A1 | 8/2007 | Byun et al. |
| 2007/0207275 A1 | 9/2007 | Nowak et al. |
| 2007/0209931 A1 | 9/2007 | Miller |
| 2007/0212288 A1 | 9/2007 | Holst |
| 2007/0221620 A1 | 9/2007 | Sakthivel et al. |
| 2007/0227554 A1 | 10/2007 | Satoh et al. |
| 2007/0231109 A1 | 10/2007 | Pak et al. |
| 2007/0232071 A1 | 10/2007 | Balseanu et al. |
| 2007/0235134 A1 | 10/2007 | Limuro |
| 2007/0235136 A1 | 10/2007 | Enomoto et al. |
| 2007/0238199 A1 | 10/2007 | Yamashita |
| 2007/0238321 A1 | 10/2007 | Futase et al. |
| 2007/0243685 A1 | 10/2007 | Jiang et al. |
| 2007/0243714 A1 | 10/2007 | Shin et al. |
| 2007/0254169 A1 | 11/2007 | Kamins et al. |
| 2007/0258186 A1 | 11/2007 | Matyushkin et al. |
| 2007/0259467 A1 | 11/2007 | Tweet et al. |
| 2007/0264820 A1 | 11/2007 | Liu |
| 2007/0266946 A1 | 11/2007 | Choi |
| 2007/0272154 A1 | 11/2007 | Amikura et al. |
| 2007/0277734 A1 | 12/2007 | Lubomirsky et al. |
| 2007/0280816 A1 | 12/2007 | Kurita et al. |
| 2007/0281106 A1 | 12/2007 | Lubomirsky et al. |
| 2007/0284044 A1 | 12/2007 | Matsumoto et al. |
| 2007/0284344 A1 | 12/2007 | Todorov et al. |
| 2007/0287292 A1 | 12/2007 | Li et al. |
| 2007/0296967 A1 | 12/2007 | Gupta et al. |
| 2008/0003836 A1 | 1/2008 | Nishimura et al. |
| 2008/0011424 A1 | 1/2008 | Yin et al. |
| 2008/0017104 A1 | 1/2008 | Matyushkin et al. |
| 2008/0020570 A1 | 1/2008 | Naik |
| 2008/0029032 A1 | 2/2008 | Sun et al. |
| 2008/0035608 A1 | 2/2008 | Thomas et al. |
| 2008/0044593 A1 | 2/2008 | Seo et al. |
| 2008/0044990 A1 | 2/2008 | Lee |
| 2008/0050538 A1 | 2/2008 | Hirata |
| 2008/0063798 A1 | 3/2008 | Kher et al. |
| 2008/0063810 A1 | 3/2008 | Park et al. |
| 2008/0075668 A1 | 3/2008 | Goldstein |
| 2008/0081483 A1 | 4/2008 | Wu |
| 2008/0085604 A1 | 4/2008 | Hoshino et al. |
| 2008/0089001 A1 | 4/2008 | Parkhe et al. |
| 2008/0099147 A1 | 5/2008 | Myo et al. |
| 2008/0099426 A1 | 5/2008 | Kumar et al. |
| 2008/0099431 A1 | 5/2008 | Kumar et al. |
| 2008/0099876 A1 | 5/2008 | Seto |
| 2008/0100222 A1 | 5/2008 | Lewington et al. |
| 2008/0102570 A1 | 5/2008 | Fischer et al. |
| 2008/0102640 A1 | 5/2008 | Hassan et al. |
| 2008/0102646 A1 | 5/2008 | Kawaguchi et al. |
| 2008/0104782 A1 | 5/2008 | Hughes |
| 2008/0105555 A1 | 5/2008 | Iwazaki et al. |
| 2008/0115726 A1 | 5/2008 | Ingle et al. |
| 2008/0121970 A1 | 5/2008 | Aritome |
| 2008/0124937 A1 | 5/2008 | Xu et al. |
| 2008/0141941 A1 | 6/2008 | Augustino et al. |
| 2008/0142831 A1 | 6/2008 | Su |
| 2008/0153306 A1 | 6/2008 | Cho et al. |
| 2008/0156631 A1 | 7/2008 | Fair et al. |
| 2008/0156771 A1 | 7/2008 | Jeon et al. |
| 2008/0157225 A1 | 7/2008 | Datta et al. |
| 2008/0160210 A1 | 7/2008 | Yang et al. |
| 2008/0169588 A1 | 7/2008 | Shih et al. |
| 2008/0171407 A1 | 7/2008 | Nakabayashi et al. |
| 2008/0173906 A1 | 7/2008 | Zhu |
| 2008/0176412 A1 | 7/2008 | Komeda |
| 2008/0178797 A1 | 7/2008 | Fodor et al. |
| 2008/0178805 A1 | 7/2008 | Paterson et al. |
| 2008/0182381 A1 | 7/2008 | Kiyotoshi |
| 2008/0182382 A1 | 7/2008 | Ingle et al. |
| 2008/0182383 A1 | 7/2008 | Lee et al. |
| 2008/0193673 A1 | 8/2008 | Paterson et al. |
| 2008/0196666 A1 | 8/2008 | Toshima |
| 2008/0202688 A1 | 8/2008 | Wu et al. |
| 2008/0202892 A1 | 8/2008 | Smith et al. |
| 2008/0213496 A1 | 9/2008 | Sun et al. |
| 2008/0216901 A1 | 9/2008 | Chamberlain et al. |
| 2008/0216958 A1 | 9/2008 | Goto et al. |
| 2008/0230519 A1 | 9/2008 | Takahashi |
| 2008/0233709 A1 | 9/2008 | Conti et al. |
| 2008/0236751 A1 | 10/2008 | Aramaki et al. |
| 2008/0254635 A1 | 10/2008 | Benzel et al. |
| 2008/0261404 A1 | 10/2008 | Kozuka et al. |
| 2008/0264337 A1 | 10/2008 | Sano et al. |
| 2008/0268171 A1 | 10/2008 | Ma et al. |
| 2008/0268645 A1 | 10/2008 | Kao et al. |
| 2008/0292798 A1 | 11/2008 | Huh et al. |
| 2008/0293248 A1 | 11/2008 | Park et al. |
| 2008/0317965 A1 | 12/2008 | Son et al. |
| 2009/0000743 A1 | 1/2009 | Iizuka |
| 2009/0001480 A1 | 1/2009 | Cheng |
| 2009/0004849 A1 | 1/2009 | Eun |
| 2009/0004873 A1 | 1/2009 | Yang |
| 2009/0014127 A1 | 1/2009 | Shah et al. |
| 2009/0014323 A1 | 1/2009 | Yendler et al. |
| 2009/0014324 A1 | 1/2009 | Kawaguchi et al. |
| 2009/0017227 A1 | 1/2009 | Fu et al. |
| 2009/0022633 A1 | 1/2009 | Tomosue et al. |
| 2009/0034148 A1 | 2/2009 | Lubomirsky et al. |
| 2009/0036292 A1 | 2/2009 | Sun et al. |
| 2009/0045167 A1 | 2/2009 | Maruyama |
| 2009/0047793 A1 | 2/2009 | Fukasawa |
| 2009/0061640 A1 | 3/2009 | Wong et al. |
| 2009/0072401 A1 | 3/2009 | Arnold et al. |
| 2009/0075409 A1 | 3/2009 | Ueno et al. |

(56) References Cited

U.S. PATENT DOCUMENTS

| | | |
|---|---|---|
| 2009/0081878 A1 | 3/2009 | Dhindsa |
| 2009/0084317 A1 | 4/2009 | Wu et al. |
| 2009/0087960 A1 | 4/2009 | Cho et al. |
| 2009/0087979 A1 | 4/2009 | Raghuram |
| 2009/0095221 A1 | 4/2009 | Tam et al. |
| 2009/0095222 A1 | 4/2009 | Tam et al. |
| 2009/0095621 A1 | 4/2009 | Kao et al. |
| 2009/0098276 A1 | 4/2009 | Burrows |
| 2009/0098706 A1 | 4/2009 | Kim et al. |
| 2009/0104738 A1 | 4/2009 | Ring et al. |
| 2009/0104782 A1 | 4/2009 | Lu et al. |
| 2009/0111280 A1 | 4/2009 | Kao et al. |
| 2009/0117270 A1 | 5/2009 | Yamasaki et al. |
| 2009/0120364 A1 | 5/2009 | Suarez et al. |
| 2009/0120464 A1 | 5/2009 | Rasheed et al. |
| 2009/0120582 A1 | 5/2009 | Koshimizu |
| 2009/0140738 A1 | 6/2009 | Desvaux et al. |
| 2009/0159213 A1 | 6/2009 | Bera et al. |
| 2009/0159566 A1 | 6/2009 | Brillhart et al. |
| 2009/0159588 A1 | 6/2009 | Morioka et al. |
| 2009/0162647 A1 | 6/2009 | Sun et al. |
| 2009/0169744 A1 | 7/2009 | Byun et al. |
| 2009/0170221 A1 | 7/2009 | Jacques et al. |
| 2009/0170331 A1 | 7/2009 | Cheng et al. |
| 2009/0178764 A1 | 7/2009 | Kanno et al. |
| 2009/0179300 A1 | 7/2009 | Arai |
| 2009/0189246 A1 | 7/2009 | Wu et al. |
| 2009/0189287 A1 | 7/2009 | Yang et al. |
| 2009/0191711 A1 | 7/2009 | Rui et al. |
| 2009/0194233 A1 | 8/2009 | Tamura |
| 2009/0194508 A1 | 8/2009 | Ui et al. |
| 2009/0194810 A1 | 8/2009 | Kiyotoshi et al. |
| 2009/0197418 A1 | 8/2009 | Sago |
| 2009/0202721 A1 | 8/2009 | Nogami et al. |
| 2009/0212804 A1 | 8/2009 | Yamada et al. |
| 2009/0214825 A1 | 8/2009 | Sun et al. |
| 2009/0218317 A1 | 9/2009 | Belen et al. |
| 2009/0223928 A1 | 9/2009 | Colpo |
| 2009/0226633 A1 | 9/2009 | Laflamme, Jr. et al. |
| 2009/0230636 A1 | 9/2009 | Goto |
| 2009/0236314 A1 | 9/2009 | Chen |
| 2009/0253222 A1 | 10/2009 | Morisawa et al. |
| 2009/0255902 A1 | 10/2009 | Satoh et al. |
| 2009/0258162 A1 | 10/2009 | Furuta et al. |
| 2009/0269934 A1 | 10/2009 | Kao |
| 2009/0274590 A1 | 11/2009 | Willwerth et al. |
| 2009/0275146 A1 | 11/2009 | Takano et al. |
| 2009/0275205 A1 | 11/2009 | Kiehlbauch et al. |
| 2009/0275206 A1 | 11/2009 | Katz et al. |
| 2009/0277587 A1 | 11/2009 | Lubomirsky et al. |
| 2009/0277874 A1 | 11/2009 | Rui et al. |
| 2009/0280650 A1 | 11/2009 | Lubomirsky et al. |
| 2009/0286400 A1 | 11/2009 | Heo et al. |
| 2009/0286405 A1 | 11/2009 | Okesaku et al. |
| 2009/0291027 A1 | 11/2009 | Choi |
| 2009/0293809 A1 | 12/2009 | Cho et al. |
| 2009/0294898 A1 | 12/2009 | Feustel et al. |
| 2009/0298256 A1 | 12/2009 | Chen et al. |
| 2009/0302005 A1 | 12/2009 | Kool et al. |
| 2009/0314309 A1 | 12/2009 | Sankarakrishnan et al. |
| 2009/0314433 A1 | 12/2009 | Hoffman et al. |
| 2009/0317978 A1 | 12/2009 | Higashi |
| 2009/0320756 A1 | 12/2009 | Tanaka |
| 2010/0000683 A1 | 1/2010 | Kadkhodayan et al. |
| 2010/0003406 A1 | 1/2010 | Lam et al. |
| 2010/0003824 A1 | 1/2010 | Kadkhodayan et al. |
| 2010/0006032 A1 | 1/2010 | Hinckley et al. |
| 2010/0006543 A1 | 1/2010 | Sawada et al. |
| 2010/0018648 A1 | 1/2010 | Collins et al. |
| 2010/0022030 A1 | 1/2010 | Ditizio |
| 2010/0025370 A1 | 2/2010 | Dieguez-Campo et al. |
| 2010/0037821 A1 | 2/2010 | Nogami |
| 2010/0039747 A1 | 2/2010 | Sansoni |
| 2010/0043726 A1 | 2/2010 | Kosanke |
| 2010/0047080 A1 | 2/2010 | Bruce |
| 2010/0048022 A1 | 2/2010 | Kubota |
| 2010/0048027 A1 | 2/2010 | Cheng et al. |
| 2010/0055408 A1 | 3/2010 | Lee et al. |
| 2010/0055917 A1 | 3/2010 | Kim |
| 2010/0059889 A1 | 3/2010 | Gosset et al. |
| 2010/0062603 A1 | 3/2010 | Ganguly et al. |
| 2010/0072172 A1 | 3/2010 | Ui et al. |
| 2010/0075503 A1 | 3/2010 | Bencher |
| 2010/0081285 A1 | 4/2010 | Chen et al. |
| 2010/0089533 A1 | 4/2010 | Ueda et al. |
| 2010/0093151 A1 | 4/2010 | Arghavani et al. |
| 2010/0093168 A1 | 4/2010 | Naik |
| 2010/0096367 A1 | 4/2010 | Jeon et al. |
| 2010/0098882 A1 | 4/2010 | Lubomirsky et al. |
| 2010/0099236 A1 | 4/2010 | Kwon et al. |
| 2010/0099263 A1 | 4/2010 | Kao et al. |
| 2010/0101727 A1 | 4/2010 | Ji |
| 2010/0105209 A1 | 4/2010 | Winniczek et al. |
| 2010/0116788 A1 | 5/2010 | Singh et al. |
| 2010/0119843 A1 | 5/2010 | Sun et al. |
| 2010/0129974 A1 | 5/2010 | Futase et al. |
| 2010/0129982 A1 | 5/2010 | Kao et al. |
| 2010/0130001 A1 | 5/2010 | Noguchi |
| 2010/0139889 A1 | 6/2010 | Kurita et al. |
| 2010/0144140 A1 | 6/2010 | Chandrashekar et al. |
| 2010/0147219 A1 | 6/2010 | Hsieh et al. |
| 2010/0151149 A1 | 6/2010 | Ovshinsky |
| 2010/0154835 A1 | 6/2010 | Dimeo et al. |
| 2010/0164422 A1 | 7/2010 | Shu et al. |
| 2010/0173499 A1 | 7/2010 | Tao et al. |
| 2010/0178748 A1 | 7/2010 | Subramanian |
| 2010/0178755 A1 | 7/2010 | Lee et al. |
| 2010/0180819 A1 | 7/2010 | Hatanaka et al. |
| 2010/0183825 A1 | 7/2010 | Becker et al. |
| 2010/0187534 A1 | 7/2010 | Nishi et al. |
| 2010/0187588 A1 | 7/2010 | Kim et al. |
| 2010/0187694 A1 | 7/2010 | Yu et al. |
| 2010/0190352 A1 | 7/2010 | Jaiswal |
| 2010/0197143 A1 | 8/2010 | Nishimura |
| 2010/0203739 A1 | 8/2010 | Becker et al. |
| 2010/0206483 A1 | 8/2010 | Sorensen et al. |
| 2010/0207195 A1 | 8/2010 | Fukuzumi et al. |
| 2010/0207205 A1 | 8/2010 | Grebs et al. |
| 2010/0212594 A1 | 8/2010 | Hara et al. |
| 2010/0213172 A1 | 8/2010 | Wilson |
| 2010/0221895 A1 | 9/2010 | Seino et al. |
| 2010/0224322 A1 | 9/2010 | Sui et al. |
| 2010/0224324 A1 | 9/2010 | Kasai |
| 2010/0240205 A1 | 9/2010 | Son |
| 2010/0243165 A1 | 9/2010 | Um |
| 2010/0243606 A1 | 9/2010 | Koshimizu |
| 2010/0244204 A1 | 9/2010 | Matsuoka et al. |
| 2010/0248488 A1 | 9/2010 | Agarwal et al. |
| 2010/0252068 A1 | 10/2010 | Kannan et al. |
| 2010/0255667 A1 | 10/2010 | Seino et al. |
| 2010/0258913 A1 | 10/2010 | Lue |
| 2010/0263588 A1 | 10/2010 | Zhiyin |
| 2010/0267224 A1 | 10/2010 | Choi et al. |
| 2010/0267248 A1 | 10/2010 | Ma et al. |
| 2010/0272895 A1 | 10/2010 | Tsuda |
| 2010/0273290 A1 | 10/2010 | Kryliouk |
| 2010/0273291 A1 | 10/2010 | Kryliouk et al. |
| 2010/0288369 A1 | 11/2010 | Chang et al. |
| 2010/0294199 A1 | 11/2010 | Tran et al. |
| 2010/0310785 A1 | 12/2010 | Sasakawa et al. |
| 2010/0314005 A1 | 12/2010 | Saito et al. |
| 2010/0317197 A1 | 12/2010 | Lind et al. |
| 2010/0330814 A1 | 12/2010 | Yokota et al. |
| 2011/0005607 A1 | 1/2011 | Desbiolles et al. |
| 2011/0005684 A1 | 1/2011 | Hayami et al. |
| 2011/0008950 A1 | 1/2011 | Xu |
| 2011/0011338 A1 | 1/2011 | Chuc et al. |
| 2011/0011341 A1 | 1/2011 | Nishimoto |
| 2011/0034035 A1 | 2/2011 | Liang et al. |
| 2011/0039407 A1 | 2/2011 | Nishizuka |
| 2011/0042799 A1 | 2/2011 | Kang et al. |
| 2011/0043228 A1 | 2/2011 | Makhratchev et al. |
| 2011/0045676 A1 | 2/2011 | Park |
| 2011/0048325 A1 | 3/2011 | Choi et al. |

(56) References Cited

U.S. PATENT DOCUMENTS

| | | |
|---|---|---|
| 2011/0053380 A1 | 3/2011 | Sapre et al. |
| 2011/0058303 A1 | 3/2011 | Migita |
| 2011/0061810 A1 | 3/2011 | Ganguly et al. |
| 2011/0061812 A1 | 3/2011 | Ganguly et al. |
| 2011/0065276 A1 | 3/2011 | Ganguly et al. |
| 2011/0076401 A1 | 3/2011 | Chao et al. |
| 2011/0081782 A1 | 4/2011 | Liang et al. |
| 2011/0088847 A1 | 4/2011 | Law et al. |
| 2011/0100489 A1 | 5/2011 | Orito |
| 2011/0101335 A1 | 5/2011 | Yamazaki et al. |
| 2011/0104393 A1 | 5/2011 | Hilkene et al. |
| 2011/0111596 A1 | 5/2011 | Kanakasabapathy |
| 2011/0114601 A1 | 5/2011 | Lubomirsky et al. |
| 2011/0115378 A1 | 5/2011 | Lubomirsky et al. |
| 2011/0124144 A1 | 5/2011 | Schlemm et al. |
| 2011/0127156 A1 | 6/2011 | Foad et al. |
| 2011/0133650 A1 | 6/2011 | Kim |
| 2011/0139748 A1 | 6/2011 | Donnelly et al. |
| 2011/0140229 A1 | 6/2011 | Rachmady et al. |
| 2011/0143542 A1 | 6/2011 | Feurprier et al. |
| 2011/0146909 A1 | 6/2011 | Shi et al. |
| 2011/0147363 A1 | 6/2011 | Yap et al. |
| 2011/0151674 A1 | 6/2011 | Tang et al. |
| 2011/0151677 A1 | 6/2011 | Wang et al. |
| 2011/0151678 A1 | 6/2011 | Ashtiani et al. |
| 2011/0155181 A1 | 6/2011 | Inatomi |
| 2011/0159690 A1 | 6/2011 | Chandrashekar et al. |
| 2011/0165057 A1 | 7/2011 | Honda et al. |
| 2011/0165347 A1 | 7/2011 | Miller et al. |
| 2011/0165771 A1 | 7/2011 | Ring et al. |
| 2011/0174778 A1 | 7/2011 | Sawada et al. |
| 2011/0180847 A1 | 7/2011 | Ikeda et al. |
| 2011/0195575 A1 | 8/2011 | Wang |
| 2011/0198034 A1 | 8/2011 | Sun et al. |
| 2011/0204025 A1 | 8/2011 | Tahara |
| 2011/0207332 A1 | 8/2011 | Liu et al. |
| 2011/0217851 A1 | 9/2011 | Liang et al. |
| 2011/0223334 A1 | 9/2011 | Yudovsky et al. |
| 2011/0226734 A1 | 9/2011 | Sumiya et al. |
| 2011/0227028 A1 | 9/2011 | Sekar et al. |
| 2011/0230008 A1 | 9/2011 | Lakshmanan et al. |
| 2011/0230052 A1 | 9/2011 | Tang et al. |
| 2011/0232737 A1 | 9/2011 | Ruletzki et al. |
| 2011/0232845 A1 | 9/2011 | Riker et al. |
| 2011/0244686 A1 | 10/2011 | Aso et al. |
| 2011/0244693 A1 | 10/2011 | Tamura et al. |
| 2011/0253044 A1 | 10/2011 | Tam et al. |
| 2011/0256421 A1 | 10/2011 | Bose et al. |
| 2011/0265884 A1 | 11/2011 | Xu et al. |
| 2011/0265887 A1 | 11/2011 | Lee et al. |
| 2011/0265951 A1 | 11/2011 | Xu |
| 2011/0266252 A1 | 11/2011 | Thadani et al. |
| 2011/0266256 A1 | 11/2011 | Cruse et al. |
| 2011/0266682 A1 | 11/2011 | Edelstein et al. |
| 2011/0278260 A1 | 11/2011 | Lai et al. |
| 2011/0287633 A1 | 11/2011 | Lee et al. |
| 2011/0294300 A1 | 12/2011 | Zhang et al. |
| 2011/0298061 A1 | 12/2011 | Siddiqui et al. |
| 2011/0303146 A1 | 12/2011 | Nishijima |
| 2011/0304078 A1 | 12/2011 | Lee et al. |
| 2011/0308453 A1 | 12/2011 | Su et al. |
| 2012/0003782 A1 | 1/2012 | Byun et al. |
| 2012/0009796 A1 | 1/2012 | Cui et al. |
| 2012/0012848 A1 | 1/2012 | Suh |
| 2012/0017989 A1 | 1/2012 | Chang et al. |
| 2012/0025289 A1 | 2/2012 | Liang et al. |
| 2012/0031559 A1 | 2/2012 | Dhindsa et al. |
| 2012/0034786 A1 | 2/2012 | Dhindsa et al. |
| 2012/0035766 A1 | 2/2012 | Shajii et al. |
| 2012/0037596 A1 | 2/2012 | Eto et al. |
| 2012/0040492 A1 | 2/2012 | Ovshinsky et al. |
| 2012/0052683 A1 | 3/2012 | Kim et al. |
| 2012/0055402 A1 | 3/2012 | Moriya et al. |
| 2012/0068242 A1 | 3/2012 | Shin et al. |
| 2012/0070982 A1 | 3/2012 | Yu et al. |
| 2012/0070996 A1 | 3/2012 | Hao et al. |
| 2012/0073501 A1 | 3/2012 | Lubomirsky et al. |
| 2012/0088356 A1 | 4/2012 | Santhanam et al. |
| 2012/0091108 A1 | 4/2012 | Lin et al. |
| 2012/0097330 A1 | 4/2012 | Iyengar et al. |
| 2012/0100720 A1 | 4/2012 | Winniczek et al. |
| 2012/0103518 A1 | 5/2012 | Kakimoto |
| 2012/0104564 A1 | 5/2012 | Won et al. |
| 2012/0119225 A1 | 5/2012 | Shiomi et al. |
| 2012/0122302 A1 | 5/2012 | Weidman et al. |
| 2012/0122319 A1 | 5/2012 | Shimizu |
| 2012/0129354 A1 | 5/2012 | Luong |
| 2012/0135576 A1 | 5/2012 | Lee et al. |
| 2012/0148369 A1 | 6/2012 | Michalski et al. |
| 2012/0149200 A1 | 6/2012 | Culp et al. |
| 2012/0161405 A1 | 6/2012 | Mohn et al. |
| 2012/0164839 A1 | 6/2012 | Nishimura |
| 2012/0171852 A1 | 7/2012 | Yuan et al. |
| 2012/0180954 A1 | 7/2012 | Yang et al. |
| 2012/0181599 A1 | 7/2012 | Lung |
| 2012/0182808 A1 | 7/2012 | Lue et al. |
| 2012/0187844 A1 | 7/2012 | Hoffman et al. |
| 2012/0196447 A1 | 8/2012 | Yang et al. |
| 2012/0196451 A1 | 8/2012 | Mallick |
| 2012/0202408 A1 | 8/2012 | Shajii et al. |
| 2012/0208361 A1 | 8/2012 | Ha |
| 2012/0211462 A1 | 8/2012 | Zhang et al. |
| 2012/0211722 A1 | 8/2012 | Kellam et al. |
| 2012/0216955 A1 | 8/2012 | Eto et al. |
| 2012/0222616 A1 | 9/2012 | Han et al. |
| 2012/0222815 A1 | 9/2012 | Sabri et al. |
| 2012/0223048 A1 | 9/2012 | Paranjpe et al. |
| 2012/0223418 A1 | 9/2012 | Stowers et al. |
| 2012/0225557 A1 | 9/2012 | Serry et al. |
| 2012/0228642 A1 | 9/2012 | Aube et al. |
| 2012/0234945 A1 | 9/2012 | Olgado |
| 2012/0238102 A1 | 9/2012 | Zhang et al. |
| 2012/0238103 A1 | 9/2012 | Zhang et al. |
| 2012/0238108 A1 | 9/2012 | Chen et al. |
| 2012/0241411 A1 | 9/2012 | Darling et al. |
| 2012/0247390 A1 | 10/2012 | Sawada et al. |
| 2012/0247670 A1 | 10/2012 | Dobashi et al. |
| 2012/0247671 A1 | 10/2012 | Sugawara |
| 2012/0247677 A1 | 10/2012 | Himori et al. |
| 2012/0255491 A1 | 10/2012 | Hadidi |
| 2012/0258600 A1 | 10/2012 | Godet et al. |
| 2012/0258607 A1 | 10/2012 | Holland et al. |
| 2012/0267346 A1 | 10/2012 | Kao et al. |
| 2012/0269968 A1 | 10/2012 | Rayner |
| 2012/0282779 A1 | 11/2012 | Arnold et al. |
| 2012/0285619 A1 | 11/2012 | Matyushkin et al. |
| 2012/0285621 A1 | 11/2012 | Tan |
| 2012/0291696 A1 | 11/2012 | Clarke |
| 2012/0292664 A1 | 11/2012 | Kanike |
| 2012/0304933 A1 | 12/2012 | Mai et al. |
| 2012/0309204 A1 | 12/2012 | Kang et al. |
| 2012/0309205 A1 | 12/2012 | Wang et al. |
| 2012/0322015 A1 | 12/2012 | Kim |
| 2012/0323008 A1 | 12/2012 | Barry et al. |
| 2013/0001899 A1 | 1/2013 | Hwang et al. |
| 2013/0005103 A1 | 1/2013 | Liu et al. |
| 2013/0005140 A1 | 1/2013 | Jeng et al. |
| 2013/0012030 A1 | 1/2013 | Lakshmanan et al. |
| 2013/0012032 A1 | 1/2013 | Liu et al. |
| 2013/0023062 A1 | 1/2013 | Masuda et al. |
| 2013/0023094 A1 | 1/2013 | Yeh et al. |
| 2013/0023124 A1 | 1/2013 | Nemani et al. |
| 2013/0023125 A1 | 1/2013 | Singh |
| 2013/0026135 A1 | 1/2013 | Kim |
| 2013/0032574 A1 | 2/2013 | Liu et al. |
| 2013/0034666 A1 | 2/2013 | Liang et al. |
| 2013/0034968 A1 | 2/2013 | Zhang et al. |
| 2013/0037919 A1 | 2/2013 | Sapra et al. |
| 2013/0045605 A1 | 2/2013 | Wang et al. |
| 2013/0049592 A1 | 2/2013 | Yeom et al. |
| 2013/0052804 A1 | 2/2013 | Song |
| 2013/0052827 A1 | 2/2013 | Wang et al. |
| 2013/0052833 A1 | 2/2013 | Ranjan et al. |
| 2013/0059440 A1 | 3/2013 | Wang et al. |

(56) References Cited

U.S. PATENT DOCUMENTS

| | | |
|---|---|---|
| 2013/0059448 A1 | 3/2013 | Marakhtanov et al. |
| 2013/0062675 A1 | 3/2013 | Thomas |
| 2013/0065398 A1 | 3/2013 | Ohsawa et al. |
| 2013/0082197 A1 | 4/2013 | Yang et al. |
| 2013/0084654 A1 | 4/2013 | Gaylord et al. |
| 2013/0087309 A1 | 4/2013 | Volfovski |
| 2013/0089988 A1 | 4/2013 | Wang et al. |
| 2013/0095646 A1 | 4/2013 | Alsmeier et al. |
| 2013/0098868 A1 | 4/2013 | Nishimura et al. |
| 2013/0105303 A1 | 5/2013 | Lubomirsky et al. |
| 2013/0105948 A1 | 5/2013 | Kewley |
| 2013/0107415 A1 | 5/2013 | Banna et al. |
| 2013/0112383 A1 | 5/2013 | Hanamachi |
| 2013/0115372 A1 | 5/2013 | Pavol et al. |
| 2013/0118686 A1 | 5/2013 | Carducci et al. |
| 2013/0119016 A1 | 5/2013 | Kagoshima |
| 2013/0119457 A1 | 5/2013 | Lue et al. |
| 2013/0119483 A1 | 5/2013 | Alptekin et al. |
| 2013/0130507 A1 | 5/2013 | Wang et al. |
| 2013/0133578 A1 | 5/2013 | Hwang |
| 2013/0149866 A1 | 6/2013 | Shriner |
| 2013/0150303 A1 | 6/2013 | Kungl et al. |
| 2013/0152859 A1 | 6/2013 | Collins et al. |
| 2013/0155568 A1 | 6/2013 | Todorow et al. |
| 2013/0161726 A1 | 6/2013 | Kim et al. |
| 2013/0171810 A1 | 7/2013 | Sun et al. |
| 2013/0171827 A1 | 7/2013 | Cho et al. |
| 2013/0175654 A1 | 7/2013 | Muckenhirn et al. |
| 2013/0187220 A1 | 7/2013 | Surthi |
| 2013/0193108 A1 | 8/2013 | Zheng |
| 2013/0213935 A1 | 8/2013 | Liao et al. |
| 2013/0217243 A1 | 8/2013 | Underwood et al. |
| 2013/0224953 A1 | 8/2013 | Salinas et al. |
| 2013/0224960 A1 | 8/2013 | Payyapilly et al. |
| 2013/0260533 A1 | 10/2013 | Sapre et al. |
| 2013/0260564 A1 | 10/2013 | Sapre et al. |
| 2013/0276983 A1 | 10/2013 | Park et al. |
| 2013/0279066 A1 | 10/2013 | Lubomirsky et al. |
| 2013/0284369 A1 | 10/2013 | Kobayashi et al. |
| 2013/0284370 A1 | 10/2013 | Collins et al. |
| 2013/0284373 A1 | 10/2013 | Sun et al. |
| 2013/0284374 A1 | 10/2013 | Lubomirsky et al. |
| 2013/0284700 A1 | 10/2013 | Nangoy et al. |
| 2013/0286530 A1 | 10/2013 | Lin et al. |
| 2013/0286532 A1 | 10/2013 | Kataigi et al. |
| 2013/0295297 A1 | 11/2013 | Chou et al. |
| 2013/0298942 A1 | 11/2013 | Ren et al. |
| 2013/0299009 A1 | 11/2013 | Jiang et al. |
| 2013/0302980 A1 | 11/2013 | Chandrashekar et al. |
| 2013/0306758 A1 | 11/2013 | Park et al. |
| 2013/0320550 A1 | 12/2013 | Kim |
| 2013/0337655 A1 | 12/2013 | Lee et al. |
| 2013/0343829 A1 | 12/2013 | Benedetti et al. |
| 2014/0004707 A1 | 1/2014 | Thedjoisworo et al. |
| 2014/0004708 A1 | 1/2014 | Thedjoisworo |
| 2014/0008880 A1 | 1/2014 | Miura et al. |
| 2014/0020708 A1 | 1/2014 | Kim et al. |
| 2014/0021673 A1 | 1/2014 | Chen et al. |
| 2014/0026813 A1 | 1/2014 | Wang et al. |
| 2014/0053866 A1 | 2/2014 | Baluja et al. |
| 2014/0054269 A1 | 2/2014 | Hudson et al. |
| 2014/0057447 A1 | 2/2014 | Yang et al. |
| 2014/0061324 A1 | 3/2014 | Mohn et al. |
| 2014/0062285 A1 | 3/2014 | Chen |
| 2014/0065827 A1 | 3/2014 | Kang et al. |
| 2014/0065842 A1 | 3/2014 | Anthis et al. |
| 2014/0073143 A1 | 3/2014 | Alokozai et al. |
| 2014/0076234 A1 | 3/2014 | Kao et al. |
| 2014/0080308 A1 | 3/2014 | Chen et al. |
| 2014/0080309 A1 | 3/2014 | Park |
| 2014/0080310 A1 | 3/2014 | Chen et al. |
| 2014/0083362 A1 | 3/2014 | Lubomirsky et al. |
| 2014/0087488 A1 | 3/2014 | Nam et al. |
| 2014/0087561 A1 | 3/2014 | Lee et al. |
| 2014/0097270 A1 | 4/2014 | Liang et al. |
| 2014/0099794 A1 | 4/2014 | Ingle et al. |
| 2014/0102367 A1 | 4/2014 | Ishibashi |
| 2014/0110061 A1 | 4/2014 | Okunishi |
| 2014/0116338 A1 | 5/2014 | He et al. |
| 2014/0124364 A1 | 5/2014 | Yoo et al. |
| 2014/0134842 A1 | 5/2014 | Zhang et al. |
| 2014/0134847 A1 | 5/2014 | Seya |
| 2014/0141621 A1 | 5/2014 | Ren et al. |
| 2014/0144876 A1 | 5/2014 | Nakagawa et al. |
| 2014/0147126 A1 | 5/2014 | Linnartz et al. |
| 2014/0148015 A1 | 5/2014 | Larson |
| 2014/0152312 A1 | 6/2014 | Snow et al. |
| 2014/0154668 A1 | 6/2014 | Chou et al. |
| 2014/0154889 A1 | 6/2014 | Wang et al. |
| 2014/0165912 A1 | 6/2014 | Kao et al. |
| 2014/0166617 A1 | 6/2014 | Chen |
| 2014/0166618 A1 | 6/2014 | Tadigadapa et al. |
| 2014/0175530 A1 | 6/2014 | Chien et al. |
| 2014/0175534 A1 | 6/2014 | Kofuji et al. |
| 2014/0186772 A1 | 7/2014 | Pohlers et al. |
| 2014/0190410 A1 | 7/2014 | Kim |
| 2014/0190632 A1 | 7/2014 | Kumar et al. |
| 2014/0191388 A1 | 7/2014 | Chen |
| 2014/0199850 A1 | 7/2014 | Kim et al. |
| 2014/0199851 A1 | 7/2014 | Nemani et al. |
| 2014/0209245 A1 | 7/2014 | Yamamoto et al. |
| 2014/0225504 A1 | 8/2014 | Kaneko et al. |
| 2014/0227881 A1 | 8/2014 | Lubomirsky et al. |
| 2014/0234466 A1 | 8/2014 | Gao et al. |
| 2014/0248773 A1 | 9/2014 | Tsai et al. |
| 2014/0248780 A1 | 9/2014 | Ingle et al. |
| 2014/0251956 A1 | 9/2014 | Jeon et al. |
| 2014/0252134 A1 | 9/2014 | Chen et al. |
| 2014/0253900 A1 | 9/2014 | Cornelissen et al. |
| 2014/0256131 A1 | 9/2014 | Wang et al. |
| 2014/0256145 A1 | 9/2014 | Abdallah et al. |
| 2014/0262031 A1 | 9/2014 | Belostotskiy et al. |
| 2014/0262038 A1* | 9/2014 | Wang ............... H01L 21/02041 |
| | | 156/345.35 |
| 2014/0263172 A1 | 9/2014 | Xie et al. |
| 2014/0263272 A1 | 9/2014 | Duan et al. |
| 2014/0264507 A1 | 9/2014 | Lee et al. |
| 2014/0264533 A1 | 9/2014 | Simsek-Ege |
| 2014/0271097 A1 | 9/2014 | Wang et al. |
| 2014/0273373 A1 | 9/2014 | Makala et al. |
| 2014/0273406 A1 | 9/2014 | Wang et al. |
| 2014/0273410 A1 | 9/2014 | Abedijaberi et al. |
| 2014/0273451 A1 | 9/2014 | Wang et al. |
| 2014/0273462 A1 | 9/2014 | Simsek-Ege et al. |
| 2014/0273487 A1 | 9/2014 | Deshmukh et al. |
| 2014/0273489 A1 | 9/2014 | Wang et al. |
| 2014/0273491 A1 | 9/2014 | Zhang et al. |
| 2014/0273492 A1 | 9/2014 | Anthis et al. |
| 2014/0273496 A1 | 9/2014 | Kao |
| 2014/0288528 A1 | 9/2014 | Py et al. |
| 2014/0302678 A1 | 10/2014 | Paterson et al. |
| 2014/0302680 A1 | 10/2014 | Singh |
| 2014/0308758 A1 | 10/2014 | Nemani et al. |
| 2014/0308816 A1 | 10/2014 | Wang et al. |
| 2014/0311581 A1 | 10/2014 | Belostotskiy et al. |
| 2014/0342532 A1 | 11/2014 | Zhu |
| 2014/0342569 A1 | 11/2014 | Zhu et al. |
| 2014/0349477 A1 | 11/2014 | Chandrashekar et al. |
| 2014/0357083 A1 | 12/2014 | Ling et al. |
| 2014/0361684 A1 | 12/2014 | Ikeda et al. |
| 2014/0363977 A1 | 12/2014 | Morimoto et al. |
| 2014/0363979 A1 | 12/2014 | Or et al. |
| 2014/0373782 A1 | 12/2014 | Park et al. |
| 2015/0007770 A1 | 1/2015 | Chandrasekharan et al. |
| 2015/0011096 A1 | 1/2015 | Chandrasekharan et al. |
| 2015/0013793 A1 | 1/2015 | Chuc et al. |
| 2015/0014152 A1 | 1/2015 | Hoinkis et al. |
| 2015/0031211 A1 | 1/2015 | Sapre et al. |
| 2015/0037980 A1 | 2/2015 | Rha |
| 2015/0041430 A1 | 2/2015 | Yoshino et al. |
| 2015/0050812 A1 | 2/2015 | Smith |
| 2015/0056814 A1 | 2/2015 | Ling et al. |
| 2015/0060265 A1 | 3/2015 | Cho et al. |
| 2015/0064918 A1 | 3/2015 | Ranjan et al. |

(56) References Cited

U.S. PATENT DOCUMENTS

| | | |
|---|---|---|
| 2015/0072508 A1 | 3/2015 | Or et al. |
| 2015/0076110 A1 | 3/2015 | Wu et al. |
| 2015/0076586 A1 | 3/2015 | Rabkin et al. |
| 2015/0079797 A1 | 3/2015 | Chen et al. |
| 2015/0093891 A1 | 4/2015 | Zope |
| 2015/0118822 A1 | 4/2015 | Zhang et al. |
| 2015/0118858 A1 | 4/2015 | Takaba |
| 2015/0123541 A1 | 5/2015 | Baek et al. |
| 2015/0126035 A1 | 5/2015 | Diao et al. |
| 2015/0126039 A1 | 5/2015 | Korolik et al. |
| 2015/0126040 A1 | 5/2015 | Korolik et al. |
| 2015/0129541 A1 | 5/2015 | Wang et al. |
| 2015/0129545 A1 | 5/2015 | Ingle et al. |
| 2015/0129546 A1 | 5/2015 | Ingle et al. |
| 2015/0132953 A1 | 5/2015 | Nowling |
| 2015/0132968 A1 | 5/2015 | Ren et al. |
| 2015/0140827 A1 | 5/2015 | Kao et al. |
| 2015/0152072 A1 | 6/2015 | Cantat et al. |
| 2015/0155177 A1 | 6/2015 | Zhang et al. |
| 2015/0155189 A1 | 6/2015 | Cho et al. |
| 2015/0167705 A1 | 6/2015 | Lee et al. |
| 2015/0170811 A1 | 6/2015 | Tanigawa et al. |
| 2015/0170879 A1 | 6/2015 | Nguyen et al. |
| 2015/0170920 A1 | 6/2015 | Purayath et al. |
| 2015/0170924 A1 | 6/2015 | Nguyen et al. |
| 2015/0170926 A1 | 6/2015 | Michalak et al. |
| 2015/0170935 A1 | 6/2015 | Wang et al. |
| 2015/0170943 A1 | 6/2015 | Nguyen et al. |
| 2015/0170956 A1 | 6/2015 | Naik et al. |
| 2015/0171008 A1 | 6/2015 | Luo |
| 2015/0179464 A1 | 6/2015 | Wang et al. |
| 2015/0187625 A1 | 7/2015 | Busche et al. |
| 2015/0191823 A1 | 7/2015 | Banna et al. |
| 2015/0194435 A1 | 7/2015 | Lee |
| 2015/0200042 A1 | 7/2015 | Ling et al. |
| 2015/0206764 A1 | 7/2015 | Wang et al. |
| 2015/0214066 A1 | 7/2015 | Luere et al. |
| 2015/0214067 A1 | 7/2015 | Zhang et al. |
| 2015/0214092 A1 | 7/2015 | Purayath et al. |
| 2015/0214101 A1 | 7/2015 | Ren et al. |
| 2015/0214337 A1 | 7/2015 | Ko et al. |
| 2015/0221479 A1 | 8/2015 | Chen et al. |
| 2015/0221541 A1 | 8/2015 | Nemani et al. |
| 2015/0228456 A1 | 8/2015 | Ye et al. |
| 2015/0235809 A1 | 8/2015 | Ito et al. |
| 2015/0235860 A1 | 8/2015 | Tomura et al. |
| 2015/0235863 A1 | 8/2015 | Chen |
| 2015/0235865 A1 | 8/2015 | Wang et al. |
| 2015/0235867 A1 | 8/2015 | Nishizuka |
| 2015/0240359 A1 | 8/2015 | Jdira et al. |
| 2015/0247231 A1 | 9/2015 | Nguyen et al. |
| 2015/0249018 A1 | 9/2015 | Park et al. |
| 2015/0255481 A1 | 9/2015 | Baenninger et al. |
| 2015/0270105 A1 | 9/2015 | Kobayashi et al. |
| 2015/0270135 A1 | 9/2015 | Tabat et al. |
| 2015/0270140 A1 | 9/2015 | Gupta et al. |
| 2015/0275361 A1 | 10/2015 | Lubomirsky et al. |
| 2015/0275375 A1 | 10/2015 | Kim et al. |
| 2015/0279687 A1 | 10/2015 | Xue et al. |
| 2015/0294980 A1 | 10/2015 | Lee et al. |
| 2015/0303031 A1 | 10/2015 | Choi |
| 2015/0332930 A1 | 11/2015 | Wang et al. |
| 2015/0332953 A1 | 11/2015 | Futase et al. |
| 2015/0340225 A1 | 11/2015 | Kim et al. |
| 2015/0340371 A1 | 11/2015 | Lue |
| 2015/0345029 A1 | 12/2015 | Wang et al. |
| 2015/0357201 A1 | 12/2015 | Chen et al. |
| 2015/0357205 A1 | 12/2015 | Wang et al. |
| 2015/0371861 A1 | 12/2015 | Li et al. |
| 2015/0371864 A1 | 12/2015 | Hsu et al. |
| 2015/0371865 A1 | 12/2015 | Chen et al. |
| 2015/0371866 A1 | 12/2015 | Chen et al. |
| 2015/0371869 A1 | 12/2015 | Surla et al. |
| 2015/0371877 A1 | 12/2015 | Lin et al. |
| 2015/0372104 A1 | 12/2015 | Liu et al. |
| 2015/0376782 A1 | 12/2015 | Griffin et al. |
| 2015/0376784 A1 | 12/2015 | Wu et al. |
| 2015/0380419 A1 | 12/2015 | Gunji-Yoneoka et al. |
| 2015/0380431 A1 | 12/2015 | Kanamori et al. |
| 2016/0005571 A1 | 1/2016 | Rosa et al. |
| 2016/0005572 A1 | 1/2016 | Liang et al. |
| 2016/0005833 A1 | 1/2016 | Collins et al. |
| 2016/0020071 A1 | 1/2016 | Khaja et al. |
| 2016/0027654 A1 | 1/2016 | Kim et al. |
| 2016/0027673 A1 | 1/2016 | Wang et al. |
| 2016/0035586 A1 | 2/2016 | Purayath et al. |
| 2016/0035614 A1 | 2/2016 | Purayath et al. |
| 2016/0042920 A1 | 2/2016 | Cho et al. |
| 2016/0042924 A1 | 2/2016 | Kim et al. |
| 2016/0042968 A1 | 2/2016 | Purayath et al. |
| 2016/0043099 A1 | 2/2016 | Purayath et al. |
| 2016/0056167 A1 | 2/2016 | Wang et al. |
| 2016/0056235 A1 | 2/2016 | Lee et al. |
| 2016/0064212 A1 | 3/2016 | Thedjoisworo et al. |
| 2016/0064233 A1 | 3/2016 | Wang et al. |
| 2016/0064247 A1 | 3/2016 | Tomura et al. |
| 2016/0079062 A1 | 3/2016 | Zheng et al. |
| 2016/0079072 A1 | 3/2016 | Wang et al. |
| 2016/0083844 A1 | 3/2016 | Nishitani et al. |
| 2016/0086772 A1 | 3/2016 | Khaja |
| 2016/0086807 A1 | 3/2016 | Park et al. |
| 2016/0086808 A1 | 3/2016 | Zhang et al. |
| 2016/0086815 A1 | 3/2016 | Pandit et al. |
| 2016/0086816 A1 | 3/2016 | Wang et al. |
| 2016/0093505 A1 | 3/2016 | Chen et al. |
| 2016/0093506 A1 | 3/2016 | Chen et al. |
| 2016/0093737 A1 | 3/2016 | Li et al. |
| 2016/0097119 A1 | 4/2016 | Cui et al. |
| 2016/0099173 A1 | 4/2016 | Agarwal et al. |
| 2016/0104606 A1 | 4/2016 | Park et al. |
| 2016/0104648 A1 | 4/2016 | Park et al. |
| 2016/0109863 A1 | 4/2016 | Valcore et al. |
| 2016/0111258 A1 | 4/2016 | Taskar et al. |
| 2016/0111315 A1 | 4/2016 | Parkhe |
| 2016/0117425 A1 | 4/2016 | Povolny et al. |
| 2016/0118227 A1 | 4/2016 | Valcore et al. |
| 2016/0118268 A1 | 4/2016 | Ingle et al. |
| 2016/0118396 A1 | 4/2016 | Rabkin et al. |
| 2016/0126118 A1 | 5/2016 | Chen et al. |
| 2016/0133480 A1 | 5/2016 | Ko et al. |
| 2016/0136660 A1 | 5/2016 | Song |
| 2016/0141179 A1 | 5/2016 | Wu et al. |
| 2016/0141419 A1 | 5/2016 | Baenninger et al. |
| 2016/0148805 A1 | 5/2016 | Jongbloed et al. |
| 2016/0148821 A1 | 5/2016 | Singh et al. |
| 2016/0163512 A1 | 6/2016 | Lubomirsky |
| 2016/0163513 A1 | 6/2016 | Lubomirsky |
| 2016/0172216 A1 | 6/2016 | Marakhtanov et al. |
| 2016/0181112 A1 | 6/2016 | Xue et al. |
| 2016/0181116 A1 | 6/2016 | Berry et al. |
| 2016/0189933 A1 | 6/2016 | Kobayashi et al. |
| 2016/0190147 A1 | 6/2016 | Kato et al. |
| 2016/0196969 A1 | 7/2016 | Berry et al. |
| 2016/0196984 A1 | 7/2016 | Lill et al. |
| 2016/0196985 A1 | 7/2016 | Tan et al. |
| 2016/0203958 A1 | 7/2016 | Arase et al. |
| 2016/0204009 A1 | 7/2016 | Nguyen et al. |
| 2016/0208395 A1 | 7/2016 | Ooshima |
| 2016/0218018 A1 | 7/2016 | Liu et al. |
| 2016/0222522 A1 | 8/2016 | Wang et al. |
| 2016/0225616 A1 | 8/2016 | Li et al. |
| 2016/0225651 A1 | 8/2016 | Tran et al. |
| 2016/0225652 A1 | 8/2016 | Tran et al. |
| 2016/0237570 A1 | 8/2016 | Tan et al. |
| 2016/0240353 A1 | 8/2016 | Nagami |
| 2016/0240389 A1 | 8/2016 | Zhang et al. |
| 2016/0240402 A1 | 8/2016 | Park et al. |
| 2016/0254165 A1 | 9/2016 | Posseme |
| 2016/0260588 A1 | 9/2016 | Park et al. |
| 2016/0260616 A1 | 9/2016 | Li et al. |
| 2016/0260619 A1 | 9/2016 | Zhang et al. |
| 2016/0284556 A1 | 9/2016 | Ingle et al. |
| 2016/0293398 A1 | 10/2016 | Danek et al. |
| 2016/0293438 A1 | 10/2016 | Zhou et al. |

(56) References Cited

U.S. PATENT DOCUMENTS

| | | |
|---|---|---|
| 2016/0300694 A1 | 10/2016 | Yang et al. |
| 2016/0307743 A1 | 10/2016 | Brown et al. |
| 2016/0307771 A1 | 10/2016 | Xu et al. |
| 2016/0307772 A1 | 10/2016 | Choi et al. |
| 2016/0307773 A1 | 10/2016 | Lee et al. |
| 2016/0314961 A1 | 10/2016 | Liu et al. |
| 2016/0314985 A1 | 10/2016 | Yang et al. |
| 2016/0319452 A1 | 11/2016 | Eidschun et al. |
| 2016/0340781 A1 | 11/2016 | Thomas et al. |
| 2016/0343548 A1 | 11/2016 | Howald et al. |
| 2016/0348244 A1 | 12/2016 | Sabri et al. |
| 2016/0358793 A1 | 12/2016 | Okumura et al. |
| 2016/0365228 A1 | 12/2016 | Singh et al. |
| 2017/0011922 A1 | 1/2017 | Tanimura et al. |
| 2017/0040175 A1 | 2/2017 | Xu et al. |
| 2017/0040180 A1 | 2/2017 | Xu et al. |
| 2017/0040190 A1 | 2/2017 | Benjaminson et al. |
| 2017/0040191 A1 | 2/2017 | Benjaminson et al. |
| 2017/0040207 A1 | 2/2017 | Purayath |
| 2017/0040214 A1 | 2/2017 | Lai et al. |
| 2017/0053808 A1 | 2/2017 | Kamp et al. |
| 2017/0062184 A1 | 3/2017 | Tran et al. |
| 2017/0104061 A1 | 4/2017 | Peng et al. |
| 2017/0110290 A1 | 4/2017 | Kobayashi et al. |
| 2017/0110335 A1 | 4/2017 | Yang et al. |
| 2017/0110475 A1 | 4/2017 | Liu et al. |
| 2017/0121818 A1 | 5/2017 | Dunn et al. |
| 2017/0133202 A1 | 5/2017 | Berry |
| 2017/0154784 A1 | 6/2017 | Wada |
| 2017/0169995 A1 | 6/2017 | Kim et al. |
| 2017/0178894 A1 | 6/2017 | Stone et al. |
| 2017/0178899 A1 | 6/2017 | Kabansky et al. |
| 2017/0178915 A1 | 6/2017 | Ingle et al. |
| 2017/0178924 A1 | 6/2017 | Chen et al. |
| 2017/0194128 A1 | 7/2017 | Lai et al. |
| 2017/0207088 A1 | 7/2017 | Kwon et al. |
| 2017/0221708 A1 | 8/2017 | Bergendahl et al. |
| 2017/0226637 A1 | 8/2017 | Lubomirsky et al. |
| 2017/0229287 A1 | 8/2017 | Xu et al. |
| 2017/0229289 A1 | 8/2017 | Lubomirsky et al. |
| 2017/0229291 A1 | 8/2017 | Singh et al. |
| 2017/0229293 A1 | 8/2017 | Park et al. |
| 2017/0229326 A1 | 8/2017 | Tran et al. |
| 2017/0229328 A1 | 8/2017 | Benjaminson et al. |
| 2017/0229329 A1 | 8/2017 | Benjaminson et al. |
| 2017/0236691 A1 | 8/2017 | Liang et al. |
| 2017/0236694 A1 | 8/2017 | Eason et al. |
| 2017/0250193 A1 | 8/2017 | Huo |
| 2017/0283947 A1 | 10/2017 | Rasheed et al. |
| 2017/0294445 A1 | 10/2017 | Son et al. |
| 2017/0306494 A1 | 10/2017 | Lin et al. |
| 2017/0309509 A1 | 10/2017 | Tran et al. |
| 2017/0316935 A1 | 11/2017 | Tan et al. |
| 2017/0338133 A1 | 11/2017 | Tan et al. |
| 2017/0338134 A1 | 11/2017 | Tan et al. |
| 2017/0342556 A1 | 11/2017 | Crook et al. |
| 2017/0350011 A1 | 12/2017 | Marquardt |
| 2017/0362704 A1 | 12/2017 | Yamashita |
| 2017/0373082 A1 | 12/2017 | Sekine et al. |
| 2018/0005850 A1 | 1/2018 | Citla et al. |
| 2018/0006041 A1 | 1/2018 | Xu et al. |
| 2018/0006050 A1 | 1/2018 | Watanabe et al. |
| 2018/0025900 A1 | 1/2018 | Park et al. |
| 2018/0069000 A1 | 3/2018 | Bergendahl et al. |
| 2018/0076031 A1 | 3/2018 | Yan et al. |
| 2018/0076044 A1 | 3/2018 | Choi et al. |
| 2018/0076048 A1 | 3/2018 | Gohira et al. |
| 2018/0076083 A1 | 3/2018 | Ko et al. |
| 2018/0080124 A1 | 3/2018 | Bajaj et al. |
| 2018/0082861 A1 | 3/2018 | Citla et al. |
| 2018/0096818 A1 | 4/2018 | Lubomirsky |
| 2018/0096819 A1 | 4/2018 | Lubomirsky et al. |
| 2018/0096821 A1 | 4/2018 | Lubomirsky et al. |
| 2018/0096865 A1 | 4/2018 | Lubomirsky et al. |
| 2018/0102255 A1 | 4/2018 | Chen et al. |
| 2018/0102256 A1 | 4/2018 | Chen et al. |
| 2018/0102259 A1 | 4/2018 | Wang et al. |
| 2018/0130818 A1 | 5/2018 | Kim et al. |
| 2018/0138049 A1 | 5/2018 | Ko et al. |
| 2018/0138055 A1 | 5/2018 | Xu et al. |
| 2018/0138075 A1 | 5/2018 | Kang et al. |
| 2018/0138085 A1 | 5/2018 | Wang et al. |
| 2018/0151683 A1 | 5/2018 | Yeo et al. |
| 2018/0175051 A1 | 6/2018 | Lue et al. |
| 2018/0182633 A1 | 6/2018 | Pandit et al. |
| 2018/0182777 A1 | 6/2018 | Cui et al. |
| 2018/0211862 A1 | 7/2018 | Konkola et al. |
| 2018/0223437 A1 | 8/2018 | George et al. |
| 2018/0226223 A1 | 8/2018 | Lubomirsky |
| 2018/0226230 A1 | 8/2018 | Kobayashi et al. |
| 2018/0226259 A1 | 8/2018 | Choi et al. |
| 2018/0226278 A1 | 8/2018 | Arnepalli et al. |
| 2018/0226425 A1 | 8/2018 | Purayath |
| 2018/0226426 A1 | 8/2018 | Purayath |
| 2018/0240654 A1 | 8/2018 | Park et al. |
| 2018/0261476 A1 | 9/2018 | Ouchi |
| 2018/0261516 A1 | 9/2018 | Lin et al. |
| 2018/0261686 A1 | 9/2018 | Lin et al. |
| 2018/0330958 A1 | 11/2018 | Kumakura et al. |
| 2018/0337024 A1 | 11/2018 | Tan et al. |
| 2018/0337057 A1 | 11/2018 | Samir et al. |
| 2018/0366351 A1 | 12/2018 | Lubomirsky |
| 2019/0013211 A1 | 1/2019 | Wang et al. |
| 2019/0037264 A1 | 1/2019 | Lyons et al. |
| 2019/0067006 A1 | 2/2019 | Hawrylchak et al. |
| 2019/0074191 A1 | 3/2019 | Nagatomo et al. |
| 2019/0252154 A1 | 8/2019 | Samir et al. |
| 2019/0252216 A1 | 8/2019 | Samir et al. |
| 2019/0271082 A1 | 9/2019 | Wang et al. |
| 2019/0272998 A1 | 9/2019 | Yang et al. |
| 2019/0311883 A1 | 10/2019 | Samir et al. |
| 2019/0333786 A1 | 10/2019 | Samir et al. |
| 2020/0060005 A1 | 2/2020 | Radermacher et al. |
| 2020/0087784 A1 | 3/2020 | Wu et al. |

FOREIGN PATENT DOCUMENTS

| | | |
|---|---|---|
| CN | 101236893 A | 8/2008 |
| CN | 101378850 A | 3/2009 |
| CN | 102893705 | 1/2013 |
| EP | 1675160 A1 | 6/2006 |
| JP | S59-126778 A | 7/1984 |
| JP | S62-45119 A | 2/1987 |
| JP | 63301051 A | 12/1988 |
| JP | H01-200627 A | 8/1989 |
| JP | H02-114525 A | 4/1990 |
| JP | H07-153739 A | 6/1995 |
| JP | H8-31755 A | 2/1996 |
| JP | H08-107101 A | 4/1996 |
| JP | H08-264510 A | 10/1996 |
| JP | H09-263356 A | 10/1997 |
| JP | 2001-313282 A | 11/2001 |
| JP | 2001-332608 A | 11/2001 |
| JP | 2002-075972 A | 3/2002 |
| JP | 2002-083869 A | 3/2002 |
| JP | 2003-174020 A | 6/2003 |
| JP | 2003-282591 A | 10/2003 |
| JP | 2004-508709 A | 3/2004 |
| JP | 2004-296467 A | 10/2004 |
| JP | 2005-050908 A | 2/2005 |
| JP | 2006-041039 A | 2/2006 |
| JP | 2006-066408 A | 3/2006 |
| JP | 2008-288560 A | 11/2008 |
| JP | 4191137 B2 | 12/2008 |
| JP | 2009-141343 A | 6/2009 |
| JP | 2009-530871 A | 8/2009 |
| JP | 2009-239056 A | 10/2009 |
| JP | 2010-180458 | 8/2010 |
| JP | 2011-508436 A | 3/2011 |
| JP | 2011-518408 A | 6/2011 |
| JP | 4763293 B2 | 8/2011 |
| JP | 2011-171378 A | 9/2011 |
| JP | 2012-19164 A | 1/2012 |
| JP | 2012-019194 A | 1/2012 |

(56) References Cited

FOREIGN PATENT DOCUMENTS

| | | |
|---|---|---|
| JP | 2012-512531 A | 5/2012 |
| JP | 2013-243418 A | 12/2013 |
| JP | 5802323 B2 | 10/2015 |
| JP | 2016-111177 A | 6/2016 |
| KR | 10-2000-008278 A | 2/2000 |
| KR | 10-2000-0064946 A | 11/2000 |
| KR | 10-2001-0056735 A | 7/2001 |
| KR | 2003-0023964 A | 3/2003 |
| KR | 10-2003-0054726 A | 7/2003 |
| KR | 10-2003-0083663 A | 10/2003 |
| KR | 100441297 B1 | 7/2004 |
| KR | 10-2005-0007143 A | 1/2005 |
| KR | 10-2005-0042701 A | 5/2005 |
| KR | 2005-0049903 A | 5/2005 |
| KR | 10-2006-0080509 A | 7/2006 |
| KR | 1006-41762 B1 | 11/2006 |
| KR | 10-2006-0127173 A | 12/2006 |
| KR | 100663668 B1 | 1/2007 |
| KR | 100678696 B1 | 1/2007 |
| KR | 200709256 A | 3/2007 |
| KR | 100712727 B1 | 4/2007 |
| KR | 2007-0079870 A | 8/2007 |
| KR | 10-2008-0063988 A | 7/2008 |
| KR | 10-0843236 B1 | 7/2008 |
| KR | 10-2009-0040869 A | 4/2009 |
| KR | 10-2009-0128913 A | 12/2009 |
| KR | 10-2010-0013980 A | 2/2010 |
| KR | 10-2010-0093358 A | 8/2010 |
| KR | 10-2011-008640 A | 7/2011 |
| KR | 10-2011-0114538 A | 10/2011 |
| KR | 10-2011-0126675 A | 11/2011 |
| KR | 10-2012-0022251 A | 3/2012 |
| KR | 10-2012-0082640 A | 7/2012 |
| KR | 10-2016-0002543 A | 1/2016 |
| TW | 2006-12480 A | 10/2003 |
| TW | 2007-35196 A | 9/2007 |
| TW | 2011-27983 A1 | 8/2011 |
| TW | 2012-07919 | 2/2012 |
| TW | 2012-13594 A | 4/2012 |
| TW | 2012-33842 A1 | 8/2012 |
| WO | 2012-125656 A2 | 2/2005 |
| WO | 2008-112673 A2 | 9/2008 |
| WO | 2009-009611 A2 | 1/2009 |
| WO | 2009-084194 A1 | 7/2009 |
| WO | 2010-010706 | 1/2010 |
| WO | 2010-113946 A1 | 10/2010 |
| WO | 2011-027515 A | 3/2011 |
| WO | 2011-031556 A | 3/2011 |
| WO | 2011070945 A1 | 6/2011 |
| WO | 2011-095846 A1 | 8/2011 |
| WO | 2011-149638 A | 12/2011 |
| WO | 2012-050321 A | 4/2012 |
| WO | 2012-118987 A1 | 9/2012 |
| WO | 2012-148568 A1 | 11/2012 |
| WO | 2013-118260 A1 | 8/2013 |

OTHER PUBLICATIONS

Manual No. TQMA72E1. "Bayard-Alpert Pirani Gauge FRG-730: Short Operating Instructions" Mar. 2012. Agilent Technologies, Lexington, MA 02421, USA. pp. 1-45.
International Search Report and Written Opinion of PCT/US2016/045551 dated Nov. 17, 2016, all pages.
International Search Report and Written Opinion of PCT/US2016/045543 dated Nov. 17, 2016, all pages.
"Liang et al. Industrial Application of Plasma Process vol. 3, pp. 61-74, 2010".
Instrument Manual: Vacuum Gauge Model MM200, Rev D. Televac (website: www.televac.com), A Division of the Fredericks Company, Huntingdon Valley, PA, US. 2008. pp. 162.
J.J. Wang and et al., "Inductively coupled plasma etching of bulk 1-20 6H-SiC and thin-film SiCN in NF3 chemistries," Journal of Vacuum Science & Technology A: Vacuum, Surfaces, and Films 16, 2204 (1998).
International Search Report and Written Opinion of PCT/US2017/047209 dated Nov. 24, 2017, all pages.
International Search Report and Written Opinion of PCT/US2017/033362 dated Aug. 24, 2017, all pages.
International Search Report and Written Opinion of PCT/US2017/037820 dated Aug. 31, 2017, all pages.
International Search Report and Written Opinion of PCT/US2017/060696 dated Jan. 25, 2018, all pages.
International Search Report and Written Opinion of PCT/US2017/055431 dated Jan. 19, 2018, all pages.
Won et al. Sep. 7, 2014, 10 pages.
International Search Report and Written Opinion of PCT/US2018/016261 dated May 21, 2018, all pages.
International Search Report and Written Opinion of PCT/US2018/016648 dated May 18, 2018, all pages.

* cited by examiner

METAL RECESS FOR SEMICONDUCTOR STRUCTURES

TECHNICAL FIELD

The present technology relates to semiconductor processes and equipment. More specifically, the present technology relates to laterally etching tungsten in vertical structures.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process. Such an etch process is said to be selective to the first material. As a result of the diversity of materials, circuits, and processes, etch processes have been developed with a selectivity towards a variety of materials.

Etch processes may be termed wet or dry based on the materials used in the process. A wet HF etch preferentially removes silicon oxide over other dielectrics and materials. However, wet processes may have difficulty penetrating some constrained trenches and also may sometimes deform the remaining material. Dry etches produced in local plasmas formed within the substrate processing region can penetrate more constrained trenches and exhibit less deformation of delicate remaining structures. However, local plasmas may damage the substrate through the production of electric arcs as they discharge.

Thus, there is a need for improved systems and methods that can be used to produce high quality devices and structures. These and other needs are addressed by the present technology.

SUMMARY

Exemplary methods for laterally etching tungsten and/or titanium nitride may include flowing an oxygen-containing precursor into a semiconductor processing chamber. A substrate may be positioned within the semiconductor processing chamber. The substrate may include a trench formed between two vertical columns and tungsten slabs arranged within a plurality of recesses defined by at least one of the two vertical columns. At least two of the tungsten slabs may be connected by tungsten lining a portion of sidewalls of the trench. The methods may include oxidizing the tungsten connecting the at least two of the tungsten slabs with the oxygen-containing precursor. The methods may also include flowing a halide precursor into the semiconductor processing chamber. The methods may further include laterally etching the oxidized tungsten from the sidewalls of the trench.

In some embodiments of the methods, the oxidation operation may produce a layer of tungsten oxide formed along the sidewalls of the trench. In some embodiments, the oxidation operation may produce a layer of tungsten oxide having a thickness of at least about 20 Å. In some embodiments, the oxidation operation may produce a layer of tungsten oxide having a thickness of at least about 200 Å. In some embodiments, a thickness of the layer of tungsten oxide proximate an upper region of the trench may differ in thickness from the layer of tungsten oxide proximate a lower region of the trench by less than about 10%. In some embodiments, the thickness of the layer of tungsten oxide proximate the upper region of the trench may differ in thickness from the layer of tungsten oxide proximate the lower region of the trench by less than about 30%.

In some embodiments of the methods, the substrate may further include metal nitride liners disposed adjacent to the tungsten slabs and the tungsten connecting the at least two of the tungsten slabs. The methods may also include oxidizing at least portions of the metal nitride liners with the oxygen-containing precursor. The methods may further include laterally etching the oxidized portions of the metal nitride liners. The methods may further include laterally etching the oxidized portions of the metal nitride liners with the halide precursor. In some embodiments of the methods, the substrate may further include metal oxide layers disposed adjacent to the metal nitride liners. The methods may selectively etch the metal nitride liners relative to the metal oxide layers.

In some embodiments of the methods, the substrate may further include metal nitride liners disposed adjacent to the tungsten slabs and the tungsten connecting the at least two of the tungsten slabs. The methods may also include flowing a fluorine-containing precursor into a remote plasma region of the semiconductor processing chamber. The methods may further include forming a plasma of the fluorine-containing precursor to produce fluorine-containing plasma effluents. The methods may also include flowing a hydrogen-containing precursor into the remote plasma region of the semiconductor processing chamber. The methods may further include forming a plasma of the hydrogen-containing precursor to produce hydrogen-containing plasma effluents. The methods may also include flowing the fluorine-containing plasma effluents and the hydrogen-containing plasma effluents into a processing region of the semiconductor processing chamber. The substrate may be positioned within the processing region. The methods may further include laterally etching exposed portions of the metal nitride liners.

In some embodiments of the methods, the oxidation operation may be performed for a period of time less than or about one minute. In some embodiments of the methods, the oxidation operation may be performed for a period of time greater than or about one minute. The substrate may be maintained at a first temperature during at least the oxidation operation. The substrate may be maintained at a second temperature during at least the etching operation. In some embodiments, the first temperature may be greater than or about the second temperature. In some embodiments, the first temperature may be less than or about the second temperature. The first temperature may be between about 200° C. and about 600° C. In some embodiments, a chamber operating pressure of less than or about 10 Torr may be maintained during the oxidation operation. In some embodiments, a chamber operating pressure of less than or about 100 Torr may be maintained during the etching operation. In some embodiments, the chamber operating pressure of less than or about 20 Torr may be maintained during the etching operation.

In some embodiments of the methods, the semiconductor processing chamber may include a remote plasma region and a processing region. The substrate may be positioned within the processing region. The methods may further include flowing the oxygen-containing precursor into the remote plasma region of the semiconductor processing chamber. The methods may also include forming a plasma of the oxygen-containing precursor to produce oxygen-containing plasma effluents. The methods may further include flowing the oxygen-containing plasma effluents into the processing region of the semiconductor processing chamber. The methods may further include oxidizing the tungsten connecting the at least two of the tungsten slabs with the oxygen-containing plasma effluents. In some embodiments of the methods, the remote plasma region may include a remote plasma system ("RPS") unit fluidly coupled with an inlet to the semiconductor processing chamber. In some embodiments of the methods, the remote plasma region may include a capacitively-coupled plasma region physically separated from the processing region by at least one electrode of the capacitively-coupled plasma region.

In some embodiments, the methods may further include pulsing the flow of the oxygen-containing precursor prior to flowing the halide precursor. In some embodiments, the methods may further include pausing the flow of the oxygen-containing precursor prior to the flow the halide precursor. In some embodiments, the methods may also include resuming the flow of the oxygen-containing precursor subsequent to the flow of the halide precursor. In some embodiments of the methods, the oxygen-containing precursor may include at least one of atomic oxygen, molecular oxygen ($O_2$), $N_2O$, $NO$, $NO_2$, $CO_2$, or ozone ($O_3$). In some embodiments of the methods, the halide precursor may include at least one of tungsten chloride or tungsten fluoride.

In some embodiments of the methods, the substrate may further include dielectric layers disposed between the tungsten slabs. The etching method may selectively etch the oxidized tungsten relative to the dielectric layers. The substrate may include at least 20 layers of the tungsten slabs and at least 20 layers of the dielectric layers. The trench may be characterized by an aspect ratio of greater than or about 20:1.

The present technology may also encompass additional etching methods. The methods may include flowing an oxygen-containing precursor into a first semiconductor processing chamber. A substrate may be positioned within the first semiconductor processing chamber. The substrate may include a trench formed between two vertical columns and tungsten slabs arranged within a plurality of recesses defined by at least one of the two vertical columns. At least two of the tungsten slabs may be connected by tungsten lining a portion of sidewalls of the trench. The substrate may further include metal nitride liners disposed adjacent to the tungsten slabs and the tungsten connecting the at least two of the tungsten slabs. The methods may include oxidizing, in the first semiconductor processing chamber, the tungsten connecting the at least two of the tungsten slabs with the oxygen-containing precursor. The methods may also include oxidizing, in the first semiconductor processing chamber, at least portions of the metal nitride liners with the oxygen-containing precursor. The methods may also include flowing a halide precursor into a second semiconductor processing chamber. The methods may also include laterally etching, in the second semiconductor processing chamber, the tungsten oxidized in the first semiconductor processing chamber from the sidewalls of the trench. The methods may also include laterally etching, in the second semiconductor processing chamber, the portions of the metal nitride liners oxidized in the first semiconductor processing chamber. In some embodiments, the first semiconductor processing chamber and the second semiconductor processing chamber may be the same.

The present technology may also encompass additional etching methods. The methods may include flowing an oxygen-containing precursor into a semiconductor processing chamber. A substrate may be positioned within the semiconductor processing chamber. The semiconductor processing chamber may include a heating source. The substrate may include a trench formed between two vertical columns and tungsten slabs arranged within a plurality of recesses defined by at least one of the two vertical columns. At least two of the tungsten slabs may be connected by tungsten lining a portion of sidewalls of the trench. The methods may include oxidizing the tungsten connecting the at least two of the tungsten slabs with the oxygen-containing precursor while the substrate may be positioned at a first distance from the heating source. The methods may also include flowing a halide precursor into the semiconductor processing chamber. The methods may further include laterally etching the oxidized tungsten from the sidewalls of the trench while the substrate may be positioned at a second distance from the heating source. The second distance may be greater than the first distance.

Such technology may provide numerous benefits over conventional systems and techniques. For example, the processes may provide uniform top to bottom etching of tungsten metal inside a trench. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
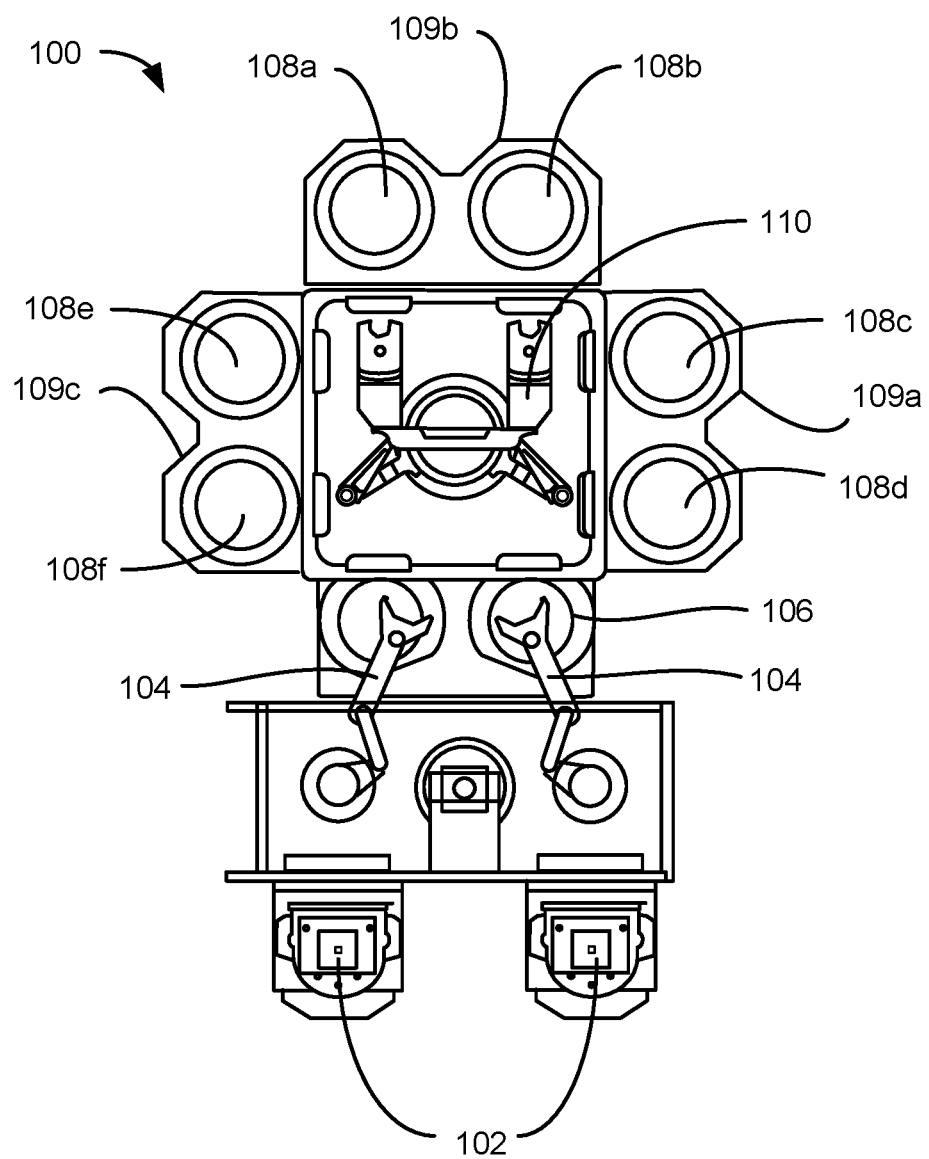
FIG. 1 shows a top plan view of one embodiment of an exemplary processing system according to embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

The growing demands of mobile computing and data centers continue to drive the need for high-capacity, high-performance NAND flash technology. With planar NAND nearing its practical scaling limits, 3D NAND is replacing 2D NAND for memory devices. Manufacturing 3D NAND structures may require depositing alternating layers of two or more materials. For example, in some structures, alternating layers of silicon oxide and silicon may be used, or alternating layers of silicon oxide and silicon nitride, or alternating layers of silicon oxide and tungsten, among other combinations, with a total thickness of the stacked layers up to several microns. These stacked layers may be etched into trenches or contact holes. Additionally, one of these two alternating materials, or at least a portion thereof, may be etched selectively from the trenches to form memory cells. For example, silicon, silicon nitride, or tungsten are the respective materials that need to be removed at least partially in the silicon oxide and silicon, silicon oxide and silicon nitride, or silicon oxide and tungsten alternating layers. If a liner material is utilized when forming the stacked layers, such as a titanium nitride liner formed between silicon oxide and tungsten, the liner may also need to be removed.

In transitioning from 2D NAND to 3D NAND, many process operations, such as the etching operation for forming the memory cells, are modified from vertical to horizontal operations. Additionally, as 3D NAND structures grow in the number of cells being formed, the aspect ratios of the trenches, contact holes, and other structures increase, sometimes dramatically. Because of the high aspect ratio (>10:1) of the trenches, one common challenge involves uniformly etching the materials, such as tungsten and titanium nitride discussed above, from top to bottom within the feature. Wet methods are conventionally used for these applications, however the wet etching may etch the materials further than necessary or desired. For example, the wet etching may etch each layer significantly, and may etch each layer almost through completely to other memory holes, which may make placing the cell layers in the appropriate or desired locations more difficult, and may weaken the structures causing deformation. Additionally, as structures continue to shrink in size, the surface tension of fluids used in wet etching can cause pattern collapse or sticking issues.

Traditional plasma dry etching has also been explored for these applications. Because plasma etching can be anisotropic and directional, it may be used to clear the materials on the top and the bottom of the trenches, but it may have difficulty in recessing the sidewalls of the memory holes uniformly. Plasma dry etching may be combined with wet etching: with one to etch the top and the bottom, and the other to etch the sidewalls. In this case, however, two steps are needed, which increases the processing time and costs.

The present technology overcomes these issues by performing a dry etch process that allows uniform top to bottom etching of tungsten metal and/or titanium nitride inside trenches of high aspect ratios. By oxidizing the tungsten metal and/or the titanium nitride first, an oxide layer with a substantially uniform thickness from the top to the bottom of the trenches may be formed. By subsequently supplying a halide precursor to selectively etch only the oxidized layer by the preceding oxidation operation, a uniform etching of the tungsten metal and/or the titanium nitride from the top to the bottom inside the trenches may be achieved.

Although the remaining disclosure will routinely identify specific etching processes utilizing the disclosed technology, it will be readily understood that the systems and methods are equally applicable to deposition and cleaning processes as may occur in the described chambers. Accordingly, the technology should not be considered to be so limited as for use with etching processes or chambers alone. Moreover, although an exemplary chamber is described to provide foundation for the present technology, it is to be understood that the present technology can be applied to virtually any semiconductor processing chamber that may allow the operations described.

FIG. 1 shows a top plan view of one embodiment of a processing system 100 of deposition, etching, baking, and curing chambers according to embodiments. In the figure, a pair of front opening unified pods (FOUPs) 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation, and other substrate processes.

The substrate processing chambers 108a-f may include one or more system components for depositing, annealing, curing and/or etching a dielectric or metallic film on the substrate wafer. In one configuration, two pairs of the processing chambers, e.g., 108c-d and 108e-f, may be used to deposit material on the substrate, and the third pair of processing chambers, e.g., 108a-b, may be used to etch the deposited material. In another configuration, all three pairs of chambers, e.g., 108a-f, may be configured to etch a dielectric or metallic film on the substrate. Any one or more of the processes described may be carried out in chamber(s) separated from the fabrication system shown in different embodiments. It will be appreciated that additional configurations of deposition, etching, annealing, and curing chambers for dielectric films are contemplated by system 100.

Figure 2A:
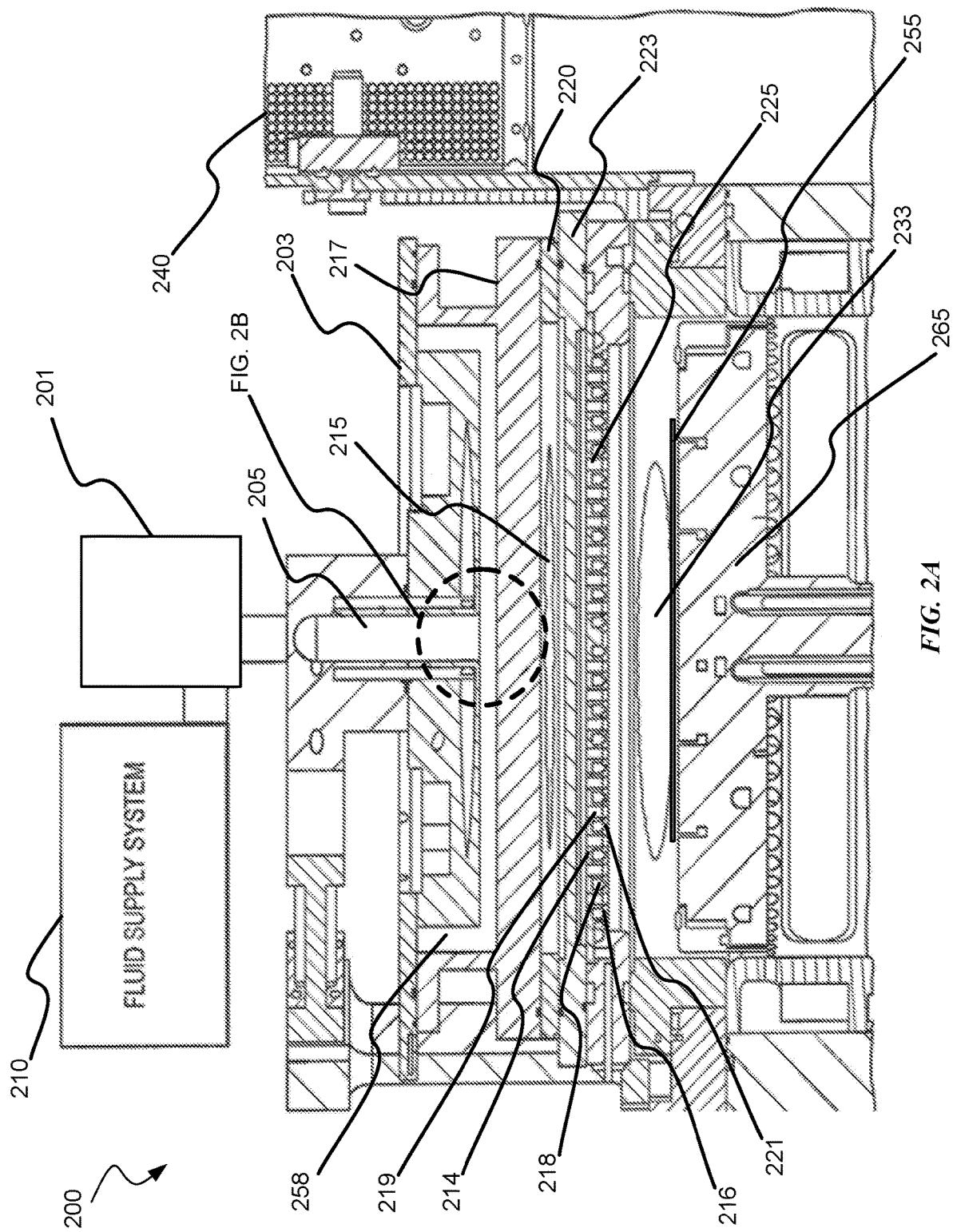
FIG. 2A shows a schematic cross-sectional view of an exemplary processing chamber according to embodiments of the present technology.

FIG. 2A shows a cross-sectional view of an exemplary process chamber system 200 with partitioned plasma generation regions within the processing chamber. During film etching, e.g., titanium nitride, tantalum nitride, tungsten, copper, cobalt, silicon, polysilicon, silicon oxide, silicon nitride, silicon oxynitride, silicon oxycarbide, etc., a process gas may be flowed into the first plasma region 215 through a gas inlet assembly 205. A remote plasma system (RPS) 201 may optionally be included in the system, and may process a first gas which then travels through gas inlet assembly 205. The inlet assembly 205 may include two or more distinct gas supply channels where the second channel (not shown) may bypass the RPS 201, if included.

A cooling plate 203, faceplate 217, ion suppressor 223, showerhead 225, and a substrate support 265, having a substrate 255 disposed thereon, are shown and may each be included according to embodiments. The pedestal 265 may have a heat exchange channel through which a heat exchange fluid flows to control the temperature of the substrate, which may be operated to heat and/or cool the substrate or wafer during processing operations. The wafer support platter of the pedestal 265, which may comprise aluminum, ceramic, or a combination thereof, may also be resistively heated in order to achieve relatively high temperatures, such as from up to or about 100° C. to above or about 600° C., using an embedded resistive heater element.

The faceplate 217 may be pyramidal, conical, or of another similar structure with a narrow top portion expanding to a wide bottom portion. The faceplate 217 may additionally be flat as shown and include a plurality of through-channels used to distribute process gases. Plasma generating gases and/or plasma excited species, depending on use of the RPS 201, may pass through a plurality of holes, shown in FIG. 2B, in faceplate 217 for a more uniform delivery into the first plasma region 215.

Exemplary configurations may include having the gas inlet assembly 205 open into a gas supply region 258 partitioned from the first plasma region 215 by faceplate 217 so that the gases/species flow through the holes in the faceplate 217 into the first plasma region 215. Structural and operational features may be selected to prevent significant backflow of plasma from the first plasma region 215 back into the supply region 258, gas inlet assembly 205, and fluid supply system 210. The faceplate 217, or a conductive top portion of the chamber, and showerhead 225 are shown with an insulating ring 220 located between the features, which allows an AC potential to be applied to the faceplate 217 relative to showerhead 225 and/or ion suppressor 223. The insulating ring 220 may be positioned between the faceplate 217 and the showerhead 225 and/or ion suppressor 223 enabling a capacitively coupled plasma (CCP) to be formed in the first plasma region. A baffle (not shown) may additionally be located in the first plasma region 215, or otherwise coupled with gas inlet assembly 205, to affect the flow of fluid into the region through gas inlet assembly 205.

The ion suppressor 223 may comprise a plate or other geometry that defines a plurality of apertures throughout the structure that are configured to suppress the migration of ionically-charged species out of the first plasma region 215 while allowing uncharged neutral or radical species to pass through the ion suppressor 223 into an activated gas delivery region between the suppressor and the showerhead. In embodiments, the ion suppressor 223 may comprise a perforated plate with a variety of aperture configurations. These uncharged species may include highly reactive species that are transported with less reactive carrier gas through the apertures. As noted above, the migration of ionic species through the holes may be reduced, and in some instances completely suppressed. Controlling the amount of ionic species passing through the ion suppressor 223 may advantageously provide increased control over the gas mixture brought into contact with the underlying wafer substrate, which in turn may increase control of the deposition and/or etch characteristics of the gas mixture. For example, adjustments in the ion concentration of the gas mixture can significantly alter its etch selectivity, e.g., SiNx:SiOx etch ratios, Si:SiOx etch ratios, etc. In alternative embodiments in which deposition is performed, it can also shift the balance of conformal-to-flowable style depositions for dielectric materials.

The plurality of apertures in the ion suppressor 223 may be configured to control the passage of the activated gas, i.e., the ionic, radical, and/or neutral species, through the ion suppressor 223. For example, the aspect ratio of the holes, or the hole diameter to length, and/or the geometry of the holes may be controlled so that the flow of ionically-charged species in the activated gas passing through the ion suppressor 223 is reduced. The holes in the ion suppressor 223 may include a tapered portion that faces the plasma excitation region 215, and a cylindrical portion that faces the showerhead 225. The cylindrical portion may be shaped and dimensioned to control the flow of ionic species passing to the showerhead 225. An adjustable electrical bias may also be applied to the ion suppressor 223 as an additional means to control the flow of ionic species through the suppressor.

The ion suppressor 223 may function to reduce or eliminate the amount of ionically charged species traveling from the plasma generation region to the substrate. Uncharged neutral and radical species may still pass through the openings in the ion suppressor to react with the substrate. It should be noted that the complete elimination of ionically charged species in the reaction region surrounding the substrate may not be performed in embodiments. In certain instances, ionic species are intended to reach the substrate in order to perform the etch and/or deposition process. In these instances, the ion suppressor may help to control the concentration of ionic species in the reaction region at a level that assists the process.

Showerhead 225 in combination with ion suppressor 223 may allow a plasma present in first plasma region 215 to avoid directly exciting gases in substrate processing region 233, while still allowing excited species to travel from chamber plasma region 215 into substrate processing region 233. In this way, the chamber may be configured to prevent the plasma from contacting a substrate 255 being etched. This may advantageously protect a variety of intricate structures and films patterned on the substrate, which may be damaged, dislocated, or otherwise warped if directly contacted by a generated plasma. Additionally, when plasma is allowed to contact the substrate or approach the substrate level, the rate at which oxide species etch may increase. Accordingly, if an exposed region of material is oxide, this material may be further protected by maintaining the plasma remotely from the substrate.

The processing system may further include a power supply 240 electrically coupled with the processing chamber to provide electric power to the faceplate 217, ion suppressor 223, showerhead 225, and/or pedestal 265 to generate a plasma in the first plasma region 215 or processing region 233. The power supply may be configured to deliver an adjustable amount of power to the chamber depending on the process performed. Such a configuration may allow for a tunable plasma to be used in the processes being performed. Unlike a remote plasma unit, which is often presented with on or off functionality, a tunable plasma may be configured to deliver a specific amount of power to the plasma region 215. This in turn may allow development of particular plasma characteristics such that precursors may be dissociated in specific ways to enhance the etching profiles produced by these precursors.

A plasma may be ignited either in chamber plasma region 215 above showerhead 225 or substrate processing region 233 below showerhead 225. Plasma may be present in chamber plasma region 215 to produce the radical precursors from an inflow of, for example, a fluorine-containing precursor or other precursor. An AC voltage typically in the radio frequency (RF) range may be applied between the conductive top portion of the processing chamber, such as faceplate 217, and showerhead 225 and/or ion suppressor 223 to ignite a plasma in chamber plasma region 215 during deposition. An RF power supply may generate a high RF frequency of 13.56 MHz but may also generate other frequencies alone or in combination with the 13.56 MHz frequency.

Figure 2B:
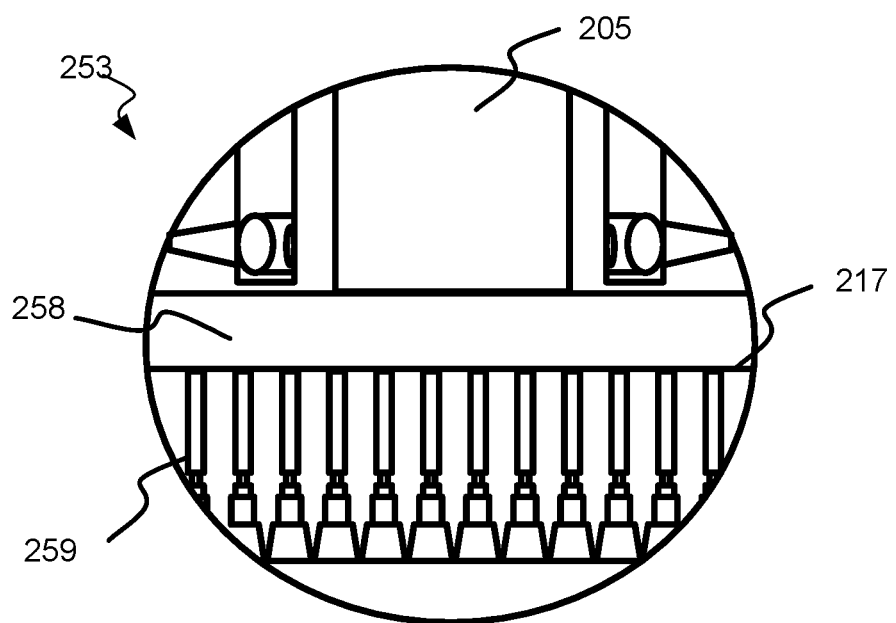
FIG. 2B shows a detailed view of a portion of the processing chamber illustrated in FIG. 2A according to embodiments of the present technology.

FIG. 2B shows a detailed view 253 of the features affecting the processing gas distribution through faceplate 217. As shown in FIGS. 2A and 2B, faceplate 217, cooling plate 203, and gas inlet assembly 205 intersect to define a gas supply region 258 into which process gases may be delivered from gas inlet 205. The gases may fill the gas supply region 258 and flow to first plasma region 215 through apertures 259 in faceplate 217. The apertures 259 may be configured to direct flow in a substantially unidirectional manner such that process gases may flow into processing region 233, but may be partially or fully prevented from backflow into the gas supply region 258 after traversing the faceplate 217.

Figure 3:
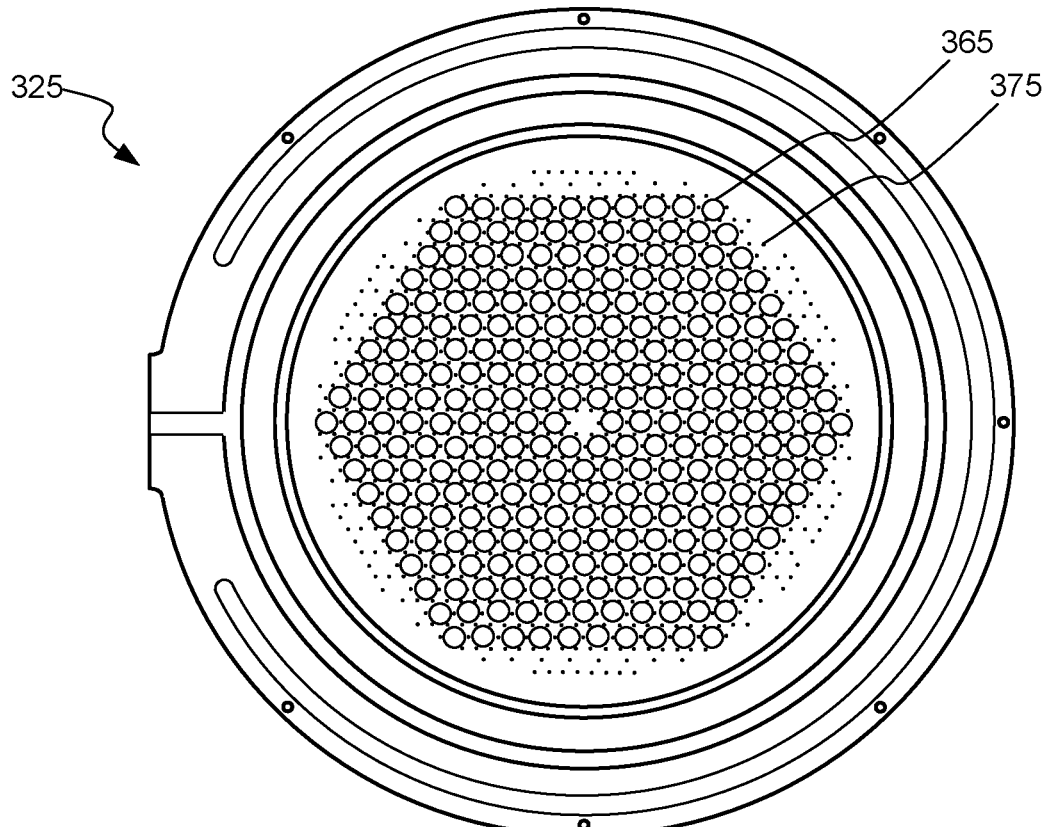
FIG. 3 shows a bottom plan view of an exemplary showerhead according to embodiments of the present technology.

The gas distribution assemblies such as showerhead 225 for use in the processing chamber section 200 may be referred to as dual channel showerheads (DCSH) and are additionally detailed in the embodiments described in FIG. 3. The dual channel showerhead may provide for etching processes that allow for separation of etchants outside of the processing region 233 to provide limited interaction with chamber components and each other prior to being delivered into the processing region.

The showerhead 225 may comprise an upper plate 214 and a lower plate 216. The plates may be coupled with one another to define a volume 218 between the plates. The coupling of the plates may be so as to provide first fluid channels 219 through the upper and lower plates, and second fluid channels 221 through the lower plate 216. The formed channels may be configured to provide fluid access from the volume 218 through the lower plate 216 via second fluid channels 221 alone, and the first fluid channels 219 may be fluidly isolated from the volume 218 between the plates and the second fluid channels 221. The volume 218 may be fluidly accessible through a side of the gas distribution assembly 225.

FIG. 3 is a bottom view of a showerhead 325 for use with a processing chamber according to embodiments. Showerhead 325 may correspond with the showerhead 225 shown in FIG. 2A. Through-holes 365, which show a view of first fluid channels 219, may have a plurality of shapes and configurations in order to control and affect the flow of precursors through the showerhead 225. Small holes 375, which show a view of second fluid channels 221, may be distributed substantially evenly over the surface of the showerhead, even amongst the through-holes 365, and may help to provide more even mixing of the precursors as they exit the showerhead than other configurations.

Figure 4:
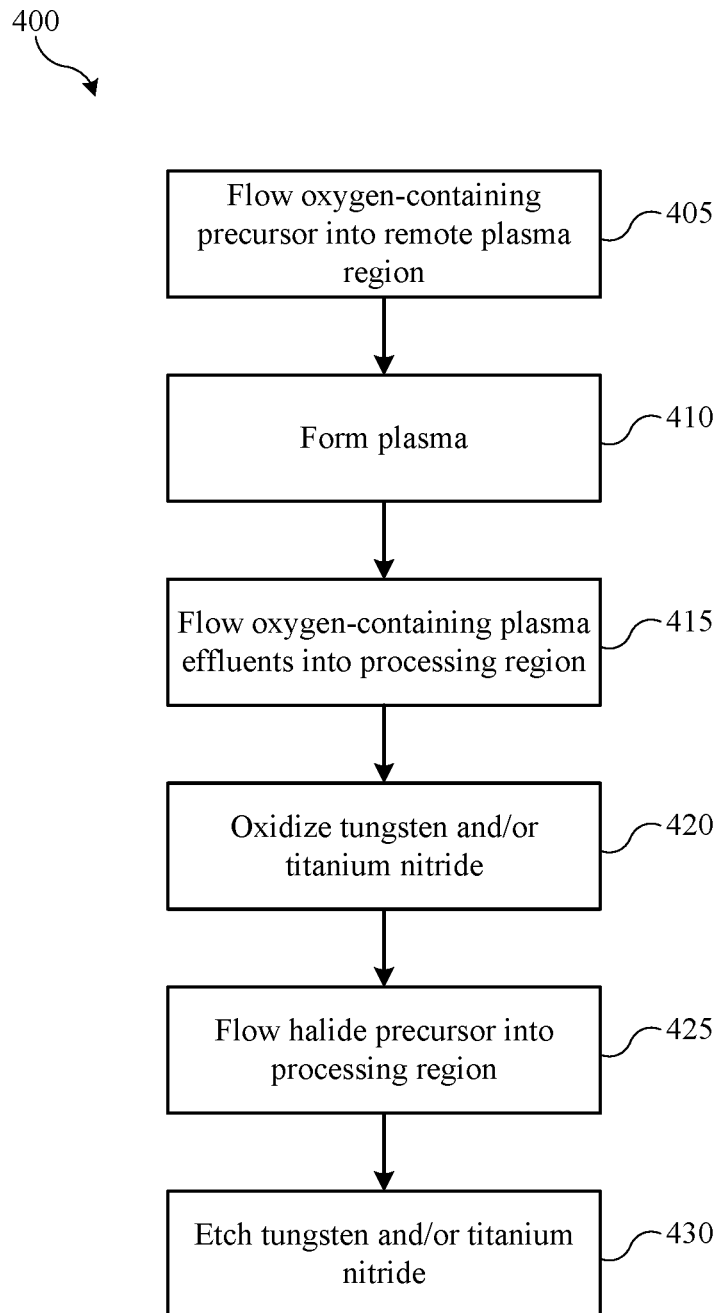
FIG. 4 shows exemplary operations in a method according to embodiments of the present technology.

The chambers discussed previously may be used for performing exemplary methods including etching methods. Turning to FIG. 4, exemplary operations in method 400 are shown according to embodiments of the present technology. Prior to the first operation of method 400, a substrate may be processed in one or more ways. For example, inter-poly dielectric (IPD) layers may be formed on the substrate. The IPD layers may include any number of materials, and may include alternating layers of a placeholder material and a dielectric material. In embodiments the dielectric material may be or include silicon oxide, and the placeholder material may be or include silicon nitride. One or more trenches or memory holes may be formed through the stacked IPD layers, and the trenches may divide the IPD layers into vertical columns to be further processed into 3D NAND structures. For example, layers of the placeholder material or at least portions thereof may be removed to form lateral recesses along sidewalls of the vertical columns. Then the lateral recesses may be lined with a gate dielectric and filled by a gate metal to form the gate structure of 3D NAND. In embodiments the gate dielectric may be or include aluminum oxide, and the gate metal may be or include tungsten, cobalt, or any other conductive material.

A gate metal barrier may also be formed between the gate metal and the gate dielectric and/or between the gate metal and the dielectric material of the IPD layers. The gate metal barrier may be or include a metal or metal nitride, such as titanium, titanium nitride, tantalum, or tantalum nitride. Typically, the gate metal may be deposited from top to bottom into the trenches and inside the lateral recesses formed along the sidewalls of the trenches to form metal slabs interposed between the layers of the dielectric material of the IPD layers. During deposition, the gate metal may also be deposited outside the lateral recesses, lining portions of the sidewalls of the trenches and connecting the metal slabs. Such lining or connecting metal may be removed so as to separate the metal slabs from each other to prevent crosstalk or shorting between the cells. Some or all of the operations may be performed in chambers or system tools as previously described, or may be performed in different chambers on the same system tool, which may include the one or more chambers in which the operations of method 400 are performed to remove the connecting metal lining the sidewalls of the trench.

Figure 5A:
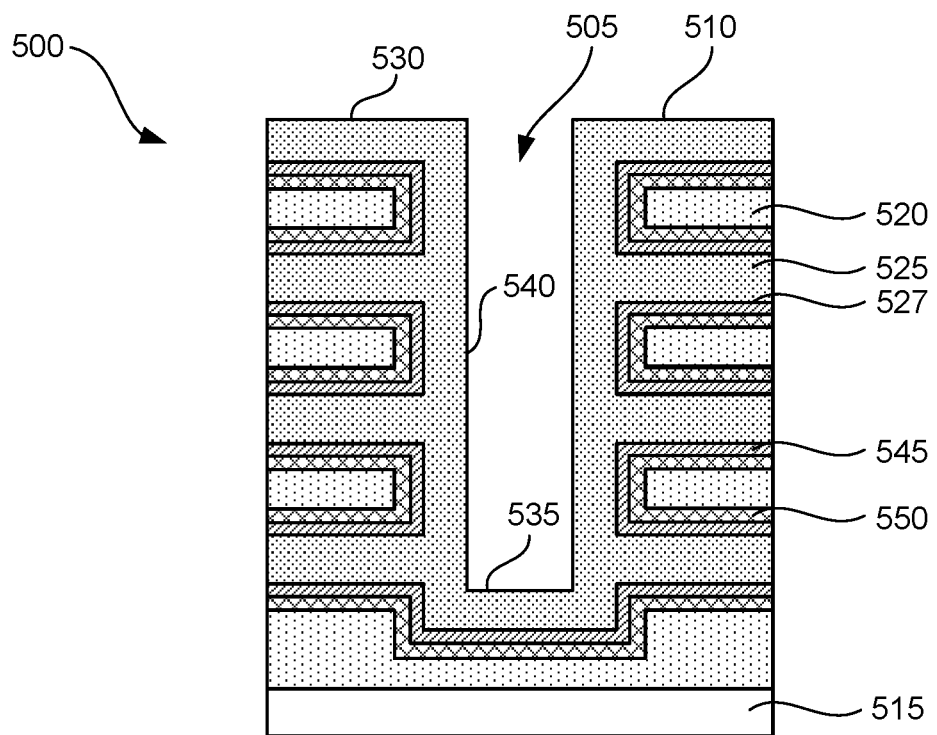
FIGS. 5A-5D show cross-sectional views of substrates being processed according to embodiments of the present technology.

The operations of method 400 will now be described in conjunction with the schematic illustration of FIGS. 5A-5D. FIG. 5A illustrates a portion of a processed structure 500 to be further developed in producing 3D NAND structures. The processed structure 500 may include one or more trenches 505 (only one shown) formed between adjacent vertical columns 510 of stacked layers overlying a substrate 515. The stacked layers may include dielectric layers and metal layers or metal slabs interposed between the dielectric layers for forming the gate structure of each memory cell. The dielectric layers may include oxide layers, such as silicon oxide layers 520 as shown in FIG. 5A. The metal slabs may include tungsten slabs, such as tungsten slabs 525 as shown in FIG. 5A. The tungsten slabs 525 may be formed by depositing tungsten in lateral recesses 527 created by removing layers, or portions thereof, of a placeholder material. When forming the tungsten slabs 525, tungsten may also be deposited along the top 530, bottom 535, and sidewalls 540 of the trench 505 and may connect two or more of the tungsten slabs 525. The processed structure 500 may further include gate metal barriers and gate dielectric. The gate metal barriers may include titanium nitride barriers, such as titanium nitride barriers 545 as shown in FIG. 5A, and the gate dielectric may include aluminum oxide gate dielectric, such as aluminum oxide gate dielectric 550 as shown in FIG. 5A.

Although FIG. 5A illustrates only 4 layers of dielectric material and 4 layers of metal, the processed structure 500 may include any number of layers of each material, such as up to or greater than about 10, greater than or about 15, greater than or about 20, greater than or about 25, greater than or about 30, greater than or about 35, greater than or about 40, greater than or about 45, greater than or about 50, greater than or about 55, greater than or about 60, greater than or about 65, greater than or about 70, greater than or about 80, greater than or about 90, greater than or about 100, or more layers of materials. This may produce trenches with a width of a few tens of nanometers or less, while the height thereof may be on the order of a few microns or more. The resulting aspect ratios or height to width ratios of the trenches may be greater than 20:1, greater than 50:1, greater than 75:1, greater than 100:1, or even greater. As discussed above, tungsten lining the bottom and the sidewalls of the trenches may be removed in order to separate the tungsten slabs from each other. Because of the high aspect ratios of the trenches, traditional dry etching methods have difficulty in achieving uniform etching of the tungsten metal from the top to the bottom of the trenches, also called a 1:1 ratio of top-to-bottom loading. As will be described in more detail below, method 400 in accordance with some embodiments of the present technology improves the top to bottom loading and may produce substantially uniform etching of the tungsten metal inside the trenches.

Figure 5B:
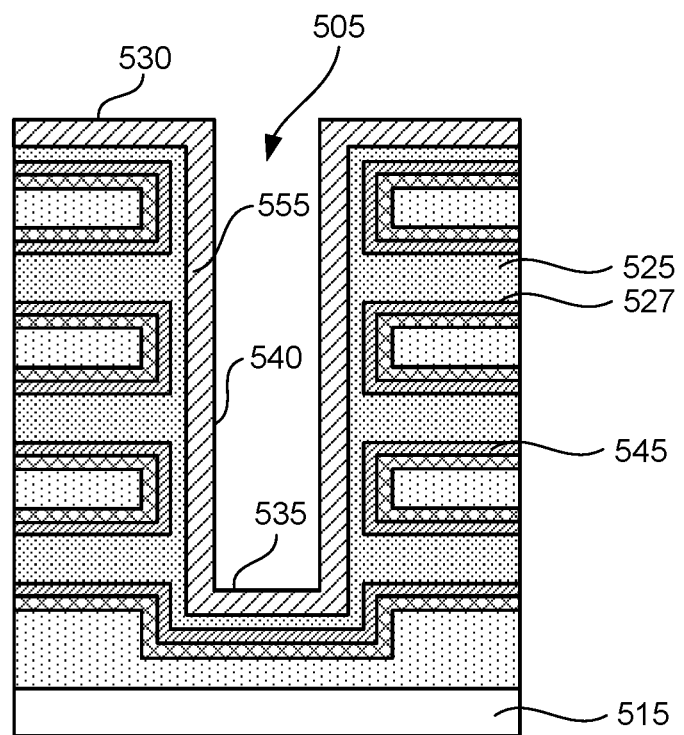

As illustrated in FIG. 5B, method 400 may include initially oxidizing the tungsten lining the top 530, bottom 535, and sidewalls 540 of the trench 505 to form a tungsten oxide layer 555 inside and on top of the trench 505. In some embodiments, to oxidize tungsten, the substrate 515 may be positioned within a processing region of a semiconductor processing chamber, such as the substrate processing region 233 of the process chamber system 200 discussed above with reference to FIG. 2A. Once positioned within the processing region, method 400 may be initiated by flowing an oxygen-containing precursor into a remote plasma region of the semiconductor processing chamber at operation 405. The remote plasma region may be fluidly coupled with the processing region, although it may be physically partitioned to limit plasma at the substrate level, which may damage exposed structures or materials on the substrate 515. In some embodiments, the remote plasma region may include a remote plasma system (RPS) fluidly coupled with an inlet to the semiconductor processing chamber, such as the RPS 201 discussed above. In some embodiments, the remote plasma region may include a capacitively-coupled plasma (CCP) region, such as the first plasma region 215 formed by capacitively coupling the faceplate 217 and the showerhead 225 and/or ion suppressor 223, and the CCP region may be physically separated from the processing region by one of its electrodes, such as the showerhead 225 and/or ion suppressor 223. Method 400 may further include forming a plasma of the oxygen-containing precursor at operation 410 to produce oxygen-containing plasma effluents, and flowing the oxygen-containing plasma effluents into the processing region at operation 415. At operation 420, the tungsten connecting the tungsten slabs 525 may be oxidized to form the tungsten oxide layer 555 inside and on top of the trench 505 as shown in FIG. 5B.

The oxygen-containing precursor may include a variety of fluids, and may include one or more of atomic oxygen, molecular oxygen ($O_2$), $N_2O$, NO, $NO_2$, $CO_2$, ozone ($O_3$), or any other oxygen-containing precursor that may similarly perform the oxidation operation. The oxygen-containing precursor may be flowed at a rate of at least 1000 sccm, and may be flowed at a rate greater than or about 2000 sccm, greater than or about 3000 sccm, greater than or about 4000 sccm, greater than or about 5000 sccm, greater than or about 6000 sccm, greater than or about 7000 sccm, greater than or about 8000 sccm, greater than or about 9000 sccm, or more in embodiments. In some embodiments, the flow of the oxygen-containing precursors may be pulsed. The flow of the oxygen-containing precursors may be pulsed for time periods of less than or about 60 seconds in embodiments, and may be pulsed for time periods of less than or about 55 seconds, less than or about 50 seconds, less than or about 45 seconds, less than or about 40 seconds, less than or about 35 seconds, less than or about 30 seconds, less than or about 25 seconds, less than or about 20 seconds, less than or about 15 seconds, less than or about 10 seconds, less than or about 5 seconds, or less.

During the flow of the oxygen-containing precursors, the flow rate of the oxygen-containing precursor may be maintained at relatively high levels such that sufficient or even more than sufficient oxygen may be present from the top to the bottom of the trenches to fully oxidize the tungsten connecting the tungsten slabs. In some embodiments, ample supply of oxygen may further improve the uniformity of the thickness of the tungsten oxide layer formed inside the trenches. The uniformity may occur in part due to the initial rapid oxidization occurring at the neat or clean tungsten surface. Specifically, method 400 may be performed after tungsten has been deposited inside the trenches but before any atmospheric exposure. The oxidation rate at the neat tungsten surface may be sufficiently rapid that with ample supply of oxygen, the tungsten proximate the bottom of the trenches may be almost simultaneously oxidized to a thickness that may be substantially the same as that of the tungsten oxidized proximate the top of the trenches. As oxidation penetrates the surface of the metal, the oxidation rate may decrease dramatically, and may in some embodiments reach a saturation depth at which minimal or no further oxidation may continue to occur at chamber conditions. Accordingly, metal located at a location further from initial contact of the plasma effluents, such as at the bottom of the trench, may be oxidized to a similar or substantially similar depth as at the top of the trench despite the longer residence time at locations proximate the top of the trench.

In some embodiments, the initial rapid oxidization may produce a tungsten oxide layer having a thickness of greater than or about 10 Å, greater than or about 15 Å, greater than or about 20 Å, greater than or about 25 Å, greater than or about 30 Å, greater than or about 35 Å, greater than or about 40 Å, greater than or about 50 Å, greater than or about 60 Å, greater than or about 70 Å, greater than or about 80 Å, greater than or about 90 Å, greater than or about 100 Å, or more, before the oxidization process slows down. In some embodiments, by adjusting the processing conditions, the initial rapid oxidization may produce a tungsten oxide layer having a thickness of greater than or about 100 Å, greater than or about 150 Å, greater than or about 200 Å, greater than or about 250 Å, greater than or about 300 Å, greater than or about 350 Å, greater than or about 400 Å, or more. The thickness of the tungsten oxide layer proximate an upper region of the trenches may differ from the thickness of the tungsten oxide layer proximate a lower region of the trenches by less than or about 30%, less than or about 25%, less than or about 20%, less than or about 15%, less than or about 10%, less than or about 5%, less than or about 3%, less than or about 1%, or less in embodiments. Accordingly, a ratio of less than or about 1.3:1, less than or about 1.25:1, less than or about 1.2:1, less than or about 1.15:1, less than or about 1.1:1, less than or about 1.05:1, or a ratio of substantially or essentially 1:1 top to bottom loading of tungsten oxidation as shown in FIG. 5B may be achieved utilizing method 400. Given the initial rapid oxidation, the flow of the oxygen-containing precursor may be maintained for time periods of less than or about 15 minutes, less than or about 10 minutes, less than or about 5 minutes, less than or about 3 minutes, less than or about 2 minutes, less than or about 90 seconds, less than or about 60 seconds, less than or about 50 seconds, less than or about 40 seconds, less than or about 30 seconds, less than or about 25 seconds, less than or about 20 seconds, less than or about 15 seconds, less than or about 10 seconds, less than or about 5 seconds, or less. In some embodiments, to facilitate sufficient oxidation, the flow of the oxygen-containing precursor may be maintained for time periods greater than or about 5 seconds, greater than or about 10 seconds, greater than or about 30 seconds, greater than or about 1 minute, greater than or about 5 minutes, greater than or about 10 minutes, greater than or about 15 minutes, or more. Accordingly, in some embodiments, the flow of the oxygen-containing precursor may be maintained between about 5 seconds and about 15 minutes, between about 30 seconds and about 10 minutes, between about 1 minute to about 5 minutes, or any other suitable time period.

The oxygen-containing precursor may also include any number of carrier gases, which may include nitrogen, helium, argon, or other noble, inert, or useful precursors. The carrier gases may be used to enhance uniform distribution of the oxygen-containing precursor inside the trenches, which may further improve top to bottom loading for the oxidation operation 420. In some embodiments, a flow rate of the carrier gas may be maintained less than or about 50% of the oxygen-containing precursor flow rate, or may be less than or about 40%, less than or about 30%, less than or about 20%, less than or about 10%, less than or about 5%, less than or about 3%, or less than or about 1% of the oxygen-containing precursor flow rate, or less. By adjusting the composition and/or the respective flow rates of the components of the oxygen-containing precursor, uniform delivery of the oxygen-containing plasma effluents inside the trench may be achieved, thereby further improving the uniformity of tungsten oxidation from the top to the bottom of the trenches.

Other process conditions may also impact the uniformity of tungsten oxidation from the top to the bottom of the trenches, such as plasma power, operating temperature, operating pressure, etc. In embodiments where the oxygen-containing plasma may be formed in a remote plasma system, the plasma power may be at least 500 W, and may be greater than or about 1000 W, greater than or about 1500 W, greater than or about 2000 W, greater than or about 2500 W, greater than or about 3000 W, greater than or about 3500 W, greater than or about 4000 W, or more, to facilitate the dissociation of the oxygen-containing precursors. In embodiments where the oxygen-containing plasma may be formed in a capacitively-coupled plasma (CCP) region of the semiconductor processing chamber, lower plasma powers may be utilized so as to prevent damage to structures on the substrate. The plasma power in the CCP region may be at least 50 W, and may be greater than or about 100 W, greater than or about 150 W, greater than or about 200 W, greater than or about 250 W, greater than or about 300 W, greater than or about 350 W, greater than or about 400 W, greater than or about 450 W, greater than or about 500 W, or more in embodiments.

To facilitate rapid oxidation and thereby improve top to bottom loading, the temperature within the processing chamber or at the substrate level may be maintained between about 200° C. and about 600° C. in embodiments. The temperature may be maintained above or about 200° C., and may be maintained above or about 250° C., above or about 300° C., above or about 350° C., above or about 400° C., above or about 450° C., above or about 500° C., above or about 550° C., above or about 600° C., or higher. The higher the temperature that may be maintained during the oxidation operation 420, the faster the tungsten may be oxidized, and the more uniform the thickness of the tungsten oxide layer may be. During the oxidation operation 420, a pressure within the processing chamber may be maintained below or about 20 Torr in embodiments. The pressure may be maintained below or about 15 Torr, and may be maintained below or about 10 Torr, below or about 5 Torr, below or about 4 Torr, below or about 3 Torr, below or about 2 Torr, below or about 1 Torr, below or about 100 mTorr, or lower. In embodiments the pressure may be maintained between about 500 mTorr and about 5 Torr. Maintaining a relatively low pressure inside the processing chamber may facilitate the distribution of the oxygen-containing plasma effluents into the trench, and the rapid oxidation of the tungsten inside the trench, resulting in uniform top to bottom oxidation as discussed above.

Although FIG. 4 illustrates oxidizing tungsten and/or titanium nitride using oxygen-containing plasma, a non-plasma process may be utilized. Accordingly, in some embodiments, operations 410 and 415 of method 400 may be omitted. The oxygen-containing precursor, such as one or more of atomic oxygen, molecular oxygen ($O_2$), ozone ($O_3$), or other oxygen-containing precursors, may be flowed into the processing region to oxidize tungsten and/or titanium nitride. In the embodiments where molecular oxygen may be utilized for oxidizing tungsten and/or titanium nitride, the temperature within the processing chamber or at the substrate level may be maintained between about 250° C. and about 600° C. The temperature may be maintained above or about 250° C., and may be maintained above or about 300° C., above or about 350° C., above or about 400° C., above or about 450° C., above or about 500° C., above or about 550° C., above or about 600° C., or higher. In the embodiments where ozone may be utilized for oxidizing tungsten and/or titanium nitride, the ozone may be produced using an ozonator, which may be fluidly coupled with an inlet of the processing chamber.

Figure 5C:
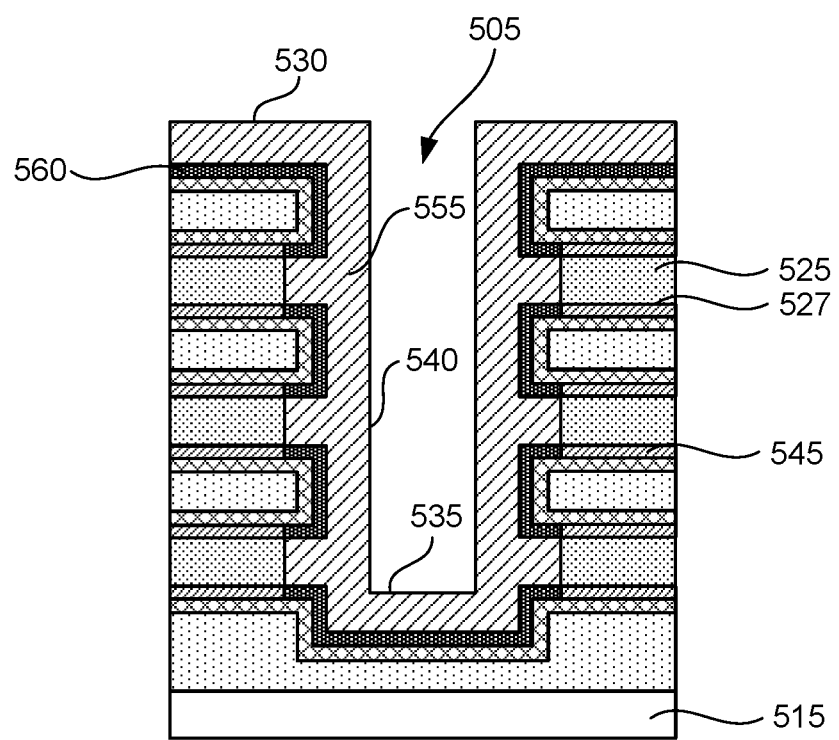

Given the ample supply of the oxygen-containing precursor and proper operating conditions, in some embodiments, substantially all the tungsten lining the sidewalls of the trench 505 may be oxidized, and portions of the tungsten slabs 525 inside the lateral recesses 527 of the trench 505 may also be oxidized, as illustrated in FIG. 5C. Slightly etching tungsten inside the lateral recesses 527 may ensure separation of the tungsten slabs 525 when the oxidized tungsten may be removed in subsequent operations of method 400. As is also shown in FIG. 5C, during the oxidation operation 420, portions of the titanium nitride barriers 545 contacting the oxidized tungsten 555 may also be oxidized to form titanium oxide 560.

Once the tungsten lining the sidewalls 540 of the trench 505 is oxidized, along with portions of the tungsten slabs 525 in some embodiments, the oxidization operation 420 may be paused by halting the flow of the oxygen-containing precursor. At operation 425, a halide precursor may be flowed into the processing region. The halide precursor may include a metal halide or other halogen-containing precursors that may interact with tungsten oxide and/or titanium oxide. The metal halide may include tungsten chloride, such as tungsten pentachloride, and/or tungsten fluoride, such as tungsten hexafluoride. At operation 430, the halide precursor may modify and interact with the tungsten oxide 555 to form volatile substances, which may then be removed from the chamber. The volatile substances formed from the halide precursor and the tungsten oxide 555 may include tungsten oxychloride and/or tungsten oxyfluoride. Once the tungsten oxide 555 is removed by the halide precursor, the underlying titanium nitride barriers 545, which may also be oxidized as discussed above, may be exposed. Although the exposed portions of the titanium nitride barriers 545 may interact with the halide precursor without being first oxidized, oxidation of the titanium nitride barriers 545 to form titanium oxide 560 may improve the etch rate.

Figure 5D:
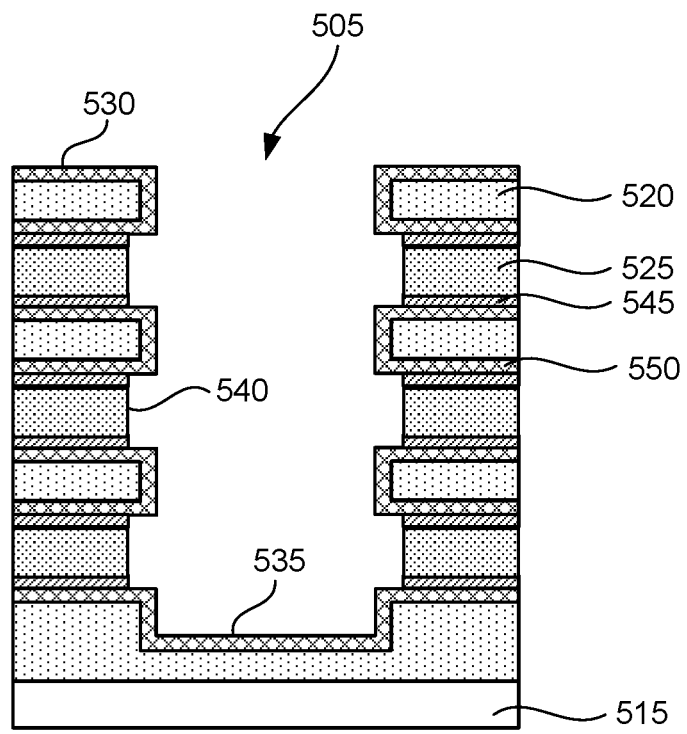

The etch rate of titanium oxide by the halide precursor may be at least about 2 times, about 3 times, about 4 times, about 5 times, about 6 times, about 7 times, about 8 times, or more of the etch rate of titanium nitride by the halide precursor. The volatile substances formed from the halide precursor and the titanium oxide 560 may include tungsten oxychloride, tungsten oxyfluoride, titanium chloride, such as titanium tetrachloride, and/or titanium fluoride, such as titanium tetrafluoride. The halide precursor may be delivered during operation 425 for a time period between about 15 seconds and about 5 minutes. The halide precursor delivery may last at least about 30 seconds, 1 minute, 1.5 minutes, 2 minutes, 2.5 minutes, 3 minutes, 3.5 minutes, 4 minutes, 4.5 minutes, 5 minutes, or longer in embodiments to ensure complete removal of the tungsten oxide 555 and/or the titanium oxide 560. As shown in FIG. 5D, the tungsten oxide 555 and/or the titanium oxide 560 may be removed upon completion of etching operation 430, and the tungsten slabs 525 may be separated from one another.

At the etching operation 430, the oxidized tungsten 555 and the oxidized portions 560 of the titanium nitride barriers 545 may be selectively removed relative to the other materials and structures on the substrate, including the tungsten slabs 525, the titanium nitride barriers 545 interposed between the tungsten slabs 525 and the aluminum oxide gate dielectric 550, and the aluminum oxide gate dielectric 550. Without intending to be bound to any particular theory, the aluminum oxide gate dielectric 550 may not be etched by the halide precursor partly because the bonding between oxygen and aluminum may be stronger than the bonding between oxygen and tungsten and/or the bonding between oxygen and titanium, and partly because the reactive products, if any, may include aluminum fluoride and/or aluminum oxyfluoride, which may be substantially non-volatile under the operating conditions for the etch operation 430. Although not explicitly illustrated in FIG. 5D, method 400 may also selectively remove the oxidized tungsten 555 and the oxidized portions 560 of the titanium nitride barriers 545 relative to silicon oxide, such as the silicon oxide layers 520, and relative to silicon nitride, which may form the charge trap layers for the memory cells.

Because the halide precursor may selectively etch only the oxidized tungsten 555 and/or the oxidized portions 560 of the titanium nitride barriers 545, and because the oxidation operation 420 may yield substantially uniform top to bottom loading as discussed above, the etching operation 430 may also yield substantially uniform top to bottom loading. The etched thickness of the tungsten layer proximate an upper region of the trenches may differ from the etched thickness of the tungsten layer proximate a lower region of the trenches etched by method 400 by less than about 30%, less than or about 25%, less than or about 20%, less than or about 15%, less than or about 10%, less than or about 5%, less than or about 3%, less than or about 1%, or less in embodiments. Accordingly, a ratio of less than or about 1.3:1, less than or about 1.25:1, less than or about 1.2:1, less than or about 1.15:1, less than or about 1.1:1, less than or about 1.05:1, or a ratio of substantially or essentially 1:1 top to bottom loading of tungsten etching may be achieved utilizing method 400. Such uniform top to bottom loading may prevent or limit over-etching of the tungsten slabs 525 inside the lateral recesses 527 of the trench 505 while facilitating complete removal of the tungsten that may be deposited on the sidewalls 540 and/or the bottom 535 of the trench 505 to ensure separation of the tungsten slabs 525 from each other.

Additionally, using the halide precursor as the etchant may further improve the top to bottom loading due to the isotropic etching it may offer. As compared to conventional reactive ion etching methods, which may impart directionality and make it difficult to laterally etch the tungsten oxide 555 and/or the titanium oxide 560 lining the sidewalls 540 of the trench 505, the halide precursor may react with the tungsten oxide 555 and/or the titanium oxide 560 substantially uniformly inside the trench 505, resulting in a virtually isotropic etching of the tungsten oxide 555 and/or the titanium oxide 560 inside the trench 505. Such uniformity may be facilitated by maintaining a pressure within the processing chamber above or about 10 Torr, above or about 15 Torr, above or about 20 Torr, above or about 25 Torr, above or about 30 Torr, above or about 35 Torr, above or about 40 Torr, above or about 45 Torr, above or about 50 Torr, above or about 55 Torr, above or about 60 Torr, above or about 70 Torr, above or about 80 Torr, above or about 90 Torr, above or about 100 Torr, or higher. Higher pressure inside the processing chamber may reduce the mean free path of the halide precursor and may achieve a non-directional flow of the halide precursor, thereby achieving the isotropic etching inside the trenches. Alternatively, in some embodiments, during the etching operation 430, the pressure within the processing chamber may be maintained below or about 100 Torr, below or about 90 Torr, below or about 80 Torr, below or about 70 Torr, below or about 60 Torr, below or about 55 Torr, below or about 50 Torr, below or about 45 Torr, below or about 40 Torr, below or about 35 Torr, below or about 30 Torr, below or about 25 Torr, below or about 20 Torr, below or about 15 Torr, below or about 10 Torr, below or about 5 Torr, below or about 1 Torr, or lower. Accordingly, in some embodiments, method 400 may further include adjusting the pressure within the processing chamber between the oxidation operation and the etching operation. For example, in some embodiments, the pressure may be adjusted from below or about 5 Torr during the oxidation, to a pressure above or about 10 Torr. Any of the previously discussed pressures or ranges may similarly be used during the two operations.

As discussed above, a relatively higher temperature may be maintained within the processing chamber or at the substrate level during the oxidation operation 420 of method 400 to facilitate uniform oxidation. In some embodiments, during the etching operation 430, a relatively lower temperature may be maintained within the processing chamber or at the substrate level. Due to the high volatility of the byproducts formed using the halide precursor, a higher temperature may not be required for effective etching to be achieved. Additionally, a relatively lower temperature may also limit or prevent surface migration of any non-volatile or less volatile byproducts that may be formed, such as aluminum fluoride as discussed above. During the etching operation 430, the temperature within the processing chamber or at the substrate level may be maintained between about 250° C. and about 400° C. during the etching operation 430. In some embodiments, the temperature may be maintained below or about 400° C., and may be maintained below or about 350° C., below or about 300° C., below or about 250° C., or lower in embodiments. In some embodiments, to increase reaction rates, a relatively higher temperature may be maintained within the processing chamber or at the substrate level during the etching operation 430. In some embodiments, the temperature maintained within the processing chamber or at the substrate level during the etching operation 430 may be similar to or even greater than the temperature maintained within the processing chamber or at the substrate level during the oxidation operation 420. Accordingly, during the etching operation 430, the temperature within the processing chamber or at the substrate level may be maintained greater than or about 400° C., greater than or about 450° C., greater than or about 500° C., greater than or about 550° C., greater than or about 600° C., or even higher.

There may be several ways to maintain different temperatures in the processing chamber or at the substrate level during the oxidation operation 420 and the etching operation 430. When the oxidation operation 420 may be paused, the temperature in the processing chamber or at the substrate level may be lowered or increased to a desired level before initiating the flow of the halide precursor at operation 425. Alternatively or additionally, in some embodiments, during the oxidation operation 420, the substrate may be positioned close to a heating source inside the processing chamber so as to achieve a relatively high temperature at the substrate level, and subsequent to the oxidation operation 420, the substrate may be moved away from the heating source so as to lower the temperature at the substrate level for the etching operation 430. For example, showerhead 225 may include a heater or may be configured to be heated in some embodiments. During the oxidation operation, the substrate may be positioned proximate the showerhead to increase the substrate and operating temperature, and the substrate may be positioned at a first distance from the heating source. Subsequent to the oxidation operations, the substrate may be translated away from the showerhead to a second distance from the heating source, such as by lowering a pedestal height, to reduce the heating effect. The etching operation may then be performed at a second temperature lower than the first temperature when the substrate is moved. In some embodiments where the etching operation 430 may be performed at a higher temperature than the oxidation operation 420, the substrate may be positioned further away from the heating source inside the processing chamber so as to achieve a relatively lower temperature at the substrate level during the oxidation operation 420, and subsequent to the oxidation operation 420, the substrate may be moved closer to the heating source so as to increase the temperature at the substrate level for the etching operation 430.

In still other embodiments, the oxidation operation 420, as well as the operation 405 and optionally, operations 410, 415 for producing the oxygen-containing plasma effluents, may be performed in a chamber separate from the chamber into which the halide precursor may be flowed at operation 425 to start the etching operation 430. Utilizing two chambers maintained at different temperatures for the oxidation operation 420 and the etching operation 430, respectively, may involve extra time for transporting the substrate from one chamber to the other. However, processing time may be saved due to the fact that no temperature adjustment may be required inside each chamber and sufficient oxidation may be ensured in one cycle, thereby reducing overall processing time.

In some embodiments, depending on the thickness of the tungsten lining the sidewalls of the trench, method 400 may be performed in cycles to facilitate complete oxidation and removal of the tungsten outside the lateral recesses to ensure separation of the tungsten slabs from one another. As discussed above, depending on the processing conditions, the initial rapid oxidization of neat or clean tungsten may produce a tungsten oxide layer having a thickness between about 10 Å and about 400 Å or more before the oxidization process slows down. To improve processing efficiency, oxidation of the tungsten may be paused after the initial rapid oxidization, and removal of the oxidized tungsten may be initiated. After removal of the oxidized tungsten, the flow of the oxygen-containing precursor may be resumed to initiate another cycle of method 400. In some embodiments, one or more cycles of oxidation and removal operations may be performed to achieve complete removal of the tungsten lining the sidewalls of the trenches.

In some embodiments, a reduction operation may be performed between the oxidation and removal operations to accommodate various profiles of tungsten films that may be formed inside and on the top of the trenches, as well as to limit over oxidation proximate upper regions of the trench. For example, the thickness of the tungsten deposited inside and/or on the top of the trenches may not be uniform. As discussed above, methods as described herein may produce a tungsten oxide layer with a substantially uniform thickness from the top to the bottom of the trench, leading to a substantially uniform removal of tungsten from the top to the bottom of the trench. To accommodate a profile with non-uniform tungsten thickness, after the oxidation operation but prior to the removal operation, hydrogen-containing plasma may be formed and the plasma effluents may be flowed into the processing region to reduce portions of the oxidized tungsten to tungsten. The reduced tungsten may not be etched in the subsequent etching operation given the etching selectivity of tungsten oxide over tungsten offered by the halide precursor.

By controlling the pressure inside the processing chamber, the reduction reaction may be controlled proximate an upper region of the trenches to achieve a desired etching profile. For example, the tungsten oxide proximate the upper region of the trenches may be reduced by maintaining a higher pressure inside the processing chamber. Depending on the operating conditions, after the reduction operation, the thickness of the tungsten oxide layer proximate the upper region of the trenches may be similar to the thickness of the tungsten oxide layer proximate the lower region of the trenches. In some embodiments, the thickness of the tungsten oxide layer proximate the upper region of the trenches may be greater or less than the thickness of the tungsten oxide layer proximate the lower region of the trenches, and may differ from the thickness of the tungsten oxide layer proximate the lower region of the trenches by less than or about 30%, less than or about 25%, less than or about 20%, less than or about 15%, less than or about 10%, less than or about 5%, less than or about 3%, less than or about 1%, or less in embodiments. Accordingly, a ratio of less than or about 1.3:1, less than or about 1.25:1, less than or about 1.2:1, less than or about 1.15:1, less than or about 1.1:1, less than or about 1.05:1, less than or about 1:1, less than or about 0.95:1, less than or about 0.9:1, less than or about 0.85:1, less than or about 0.8:1, less than or about 0.75:1, less than or about 0.7:1, or an even lower ratio of top to bottom loading of tungsten oxidation may be achieved. The reduction operation may also be performed even if the initial profile of the tungsten deposited may be uniform so as to achieve a non-uniform, or any desired profile of the etched tungsten. As a result, a greater thickness of the tungsten proximate the top region of the trench, along a middle portion of the trench, and/or proximate the bottom region of the trench may be removed than the tungsten deposited at other regions of the trench. In various embodiments, a ratio of less than or about 1.3:1, less than or about 1.25:1, less than or about 1.2:1, less than or about 1.15:1, less than or about 1.1:1, less than or about 1.05:1, less than or about 1:1, less than or about 0.95:1, less than or about 0.9:1, less than or about 0.85:1, less than or about 0.8:1, less than or about 0.75:1, less than or about 0.7:1, or an even lower ratio of top to bottom loading of tungsten etching may be achieved.

Figure 6:
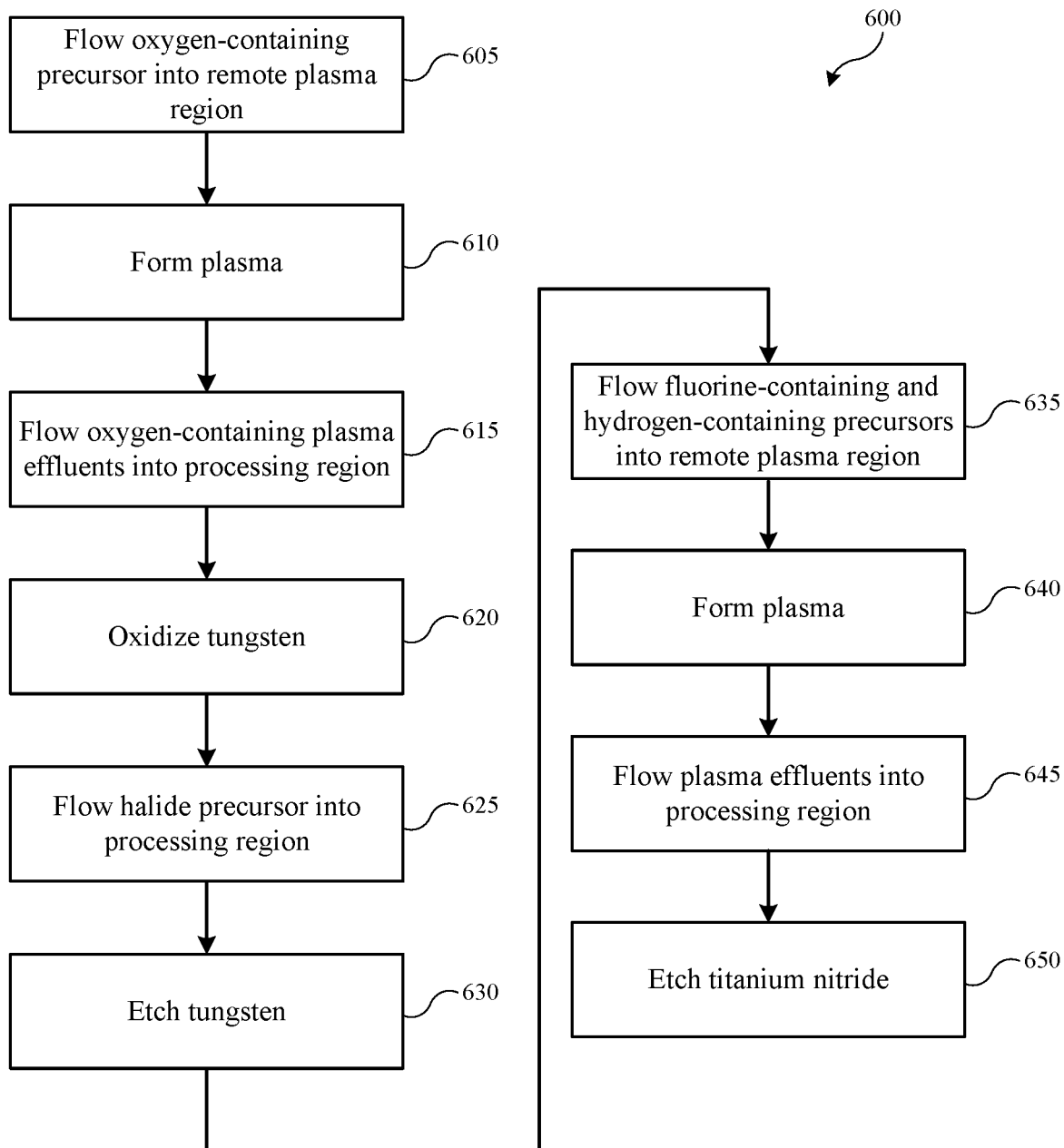
FIG. 6 shows exemplary operations in a method according to embodiments of the present technology.
Figure 7A:
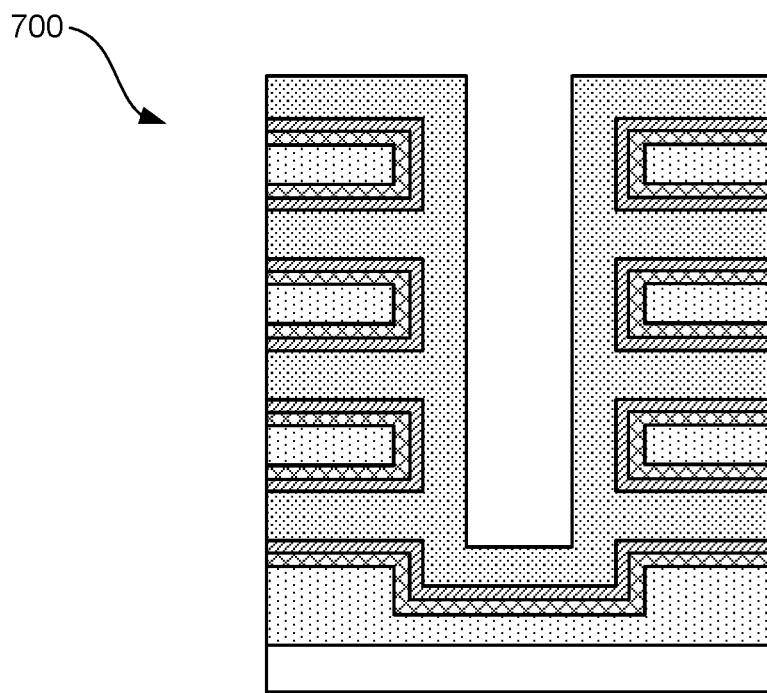
FIGS. 7A-7D show cross-sectional views of substrates being processed according to embodiments of the present technology.
Figure 7B:
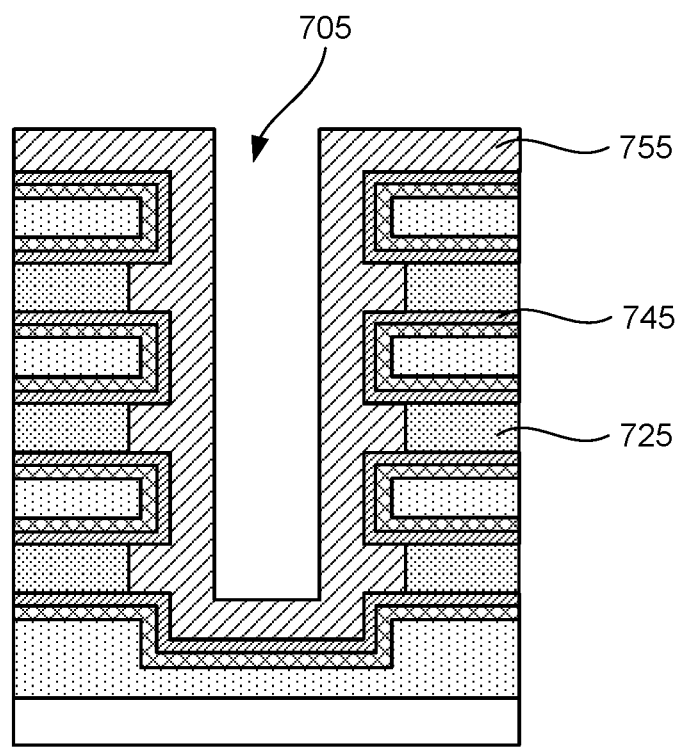

Turning to FIG. 6, exemplary operations of another method 600 are shown according to embodiments of the present technology. The operations of method 600 are also schematically illustrated in FIGS. 7A-7D, which illustrate a processed structure 700 similar to the processed structure 500 in FIGS. 5A-5D. Method 600 may include operations 605-630 similar to operations 405-430 of method 400. In some embodiments, method 600 may include flowing an oxygen-containing precursor into a remote plasma region of the semiconductor processing chamber at operation 605. The remote plasma region may be a remote plasma system (RPS) fluidly coupled with the processing region, or may include a capacitively-coupled plasma (CCP) region, as discussed above with reference to method 400. Method 600 may further include forming a plasma of the oxygen-containing precursor at operation 610 to produce oxygen-containing plasma effluents, and flowing the oxygen-containing plasma effluents into the processing region at operation 615. At operation 620, the oxygen-containing plasma effluents may contact and oxidize the tungsten connecting the tungsten slabs 725 to form a tungsten oxide layer 755 inside and on top of the trench 705 as shown in FIG. 7B. The oxygen-containing precursor may include a variety of fluids, and may include one or more of atomic oxygen, molecular oxygen ($O_2$), $N_2O$, NO, $NO_2$, $CO_2$, ozone ($O_3$), or any other oxygen-containing precursor that may similarly perform the oxidation operation.

Although FIG. 6 illustrates oxidizing tungsten using oxygen-containing plasma, method 600 may include flowing molecular oxygen ($O_2$), ozone ($O_3$), or other oxygen-containing precursors, instead of flowing plasma effluents, into the processing region to oxidize tungsten. In the embodiments where molecular oxygen may be utilized for oxidizing tungsten, the temperature within the processing chamber or at the substrate level may be maintained between about 250° C. and about 600° C. In the embodiment where ozone may be utilized for oxidizing tungsten, the ozone may be produced using an ozonator, which may be fluidly coupled with an inlet of the processing chamber.

At operation 625, a halide precursor may be flowed into the processing region. The halide precursor may include a metal halide or other halogen-containing precursors that may interact with tungsten oxide. The metal halide may include tungsten chloride, such as tungsten pentachloride, and/or tungsten fluoride, such as tungsten hexafluoride. At operation 630, the halide precursor may modify and interact with the tungsten oxide 755 to form volatile substances, which may then be removed from the chamber. The volatile substances formed from the halide precursor and the tungsten oxide 755 may include tungsten oxychloride and/or tungsten oxyfluoride.

Figure 7C:
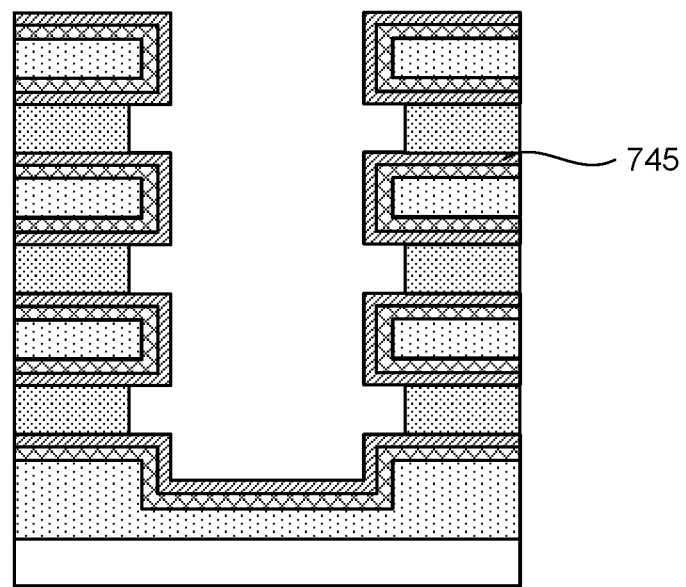
Figure 7D:
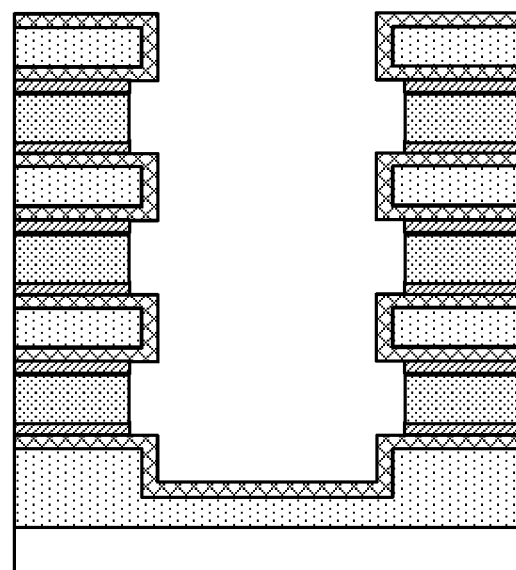

Method 600 may differ from method 400 in that the operating conditions may be adjusted in method 600 such that gate metal barriers, such as titanium nitride barriers 745, may not be oxidized as shown in FIG. 7B, or at least may not be fully oxidized. Accordingly, upon completion of the etching operation 630 for etching the oxidized tungsten 755, the titanium nitride barriers 745 may not be etched and portions thereof may be exposed as shown in FIG. 7C. To remove the exposed portions of the titanium nitride barriers 745, method 600 may include flowing a fluorine-containing precursor and a hydrogen-containing precursor into a remote plasma region of the processing chamber at operation 635. Again, the remote plasma region may be a remote plasma system (RPS) fluidly coupled with the processing region, or may include a capacitively-coupled plasma (CCP) region, as discussed above. Method 600 may further include forming a plasma of the fluorine-containing precursor and the hydrogen-containing precursor at operation 640 to produce fluorine-containing plasma effluents and hydrogen-containing plasma effluents, which may be flowed into the processing region at operation 645. At operation 650, the plasma effluents may interact with the exposed portions of the titanium nitride barriers 745 to form volatile byproducts thereby removing the exposed portions of the titanium nitride barriers 745 as shown in FIG. 7D. Operation 650 may selectively etch titanium nitride over tungsten and/or tungsten oxide due to the presence of hydrogen in the plasma effluents. The temperature of the processing chamber may be maintained similar to the temperature utilized in the oxidation operation of the tungsten to facilitate removal of the exposed portions of the titanium nitride barriers 745. In other embodiments, the operating temperature during the removal of the barrier materials may be similar to the operating temperature during removal of the tungsten oxide.

The fluorine-containing precursor may include at least one precursor selected from the group of atomic fluorine, diatomic fluorine, nitrogen trifluoride, carbon tetrafluoride, hydrogen fluoride, xenon difluoride, and various other fluorine-containing precursors used or useful in semiconductor processing. An exemplary fluorine-containing precursor used in method 600 may include nitrogen trifluoride ($NF_3$). Other sources of fluorine may be used in conjunction with or as replacements for the nitrogen trifluoride. The hydrogen-containing precursor may include hydrogen, a hydrocarbon, water, hydrogen peroxide, or other materials that may include hydrogen. The precursors may also include any number of carrier gases, which may include nitrogen, helium, argon, or other noble, inert, or useful precursors.

Although FIG. 6 illustrates that both the fluorine-containing precursor and the hydrogen-containing precursor may be flowed into the remote plasma region of the processing chamber, either one of the precursors may bypass the remote plasma region and be flowed into additional regions of the processing chamber. For example, while the fluorine-containing precursor may be flowed through the remote plasma region to produce fluorine-containing plasma effluents, the hydrogen-containing precursor may bypass the remote plasma region. The hydrogen-containing precursor may bypass the remote plasma region by a bypass at a top of the chamber, or may be flowed into a separate region of the chamber, such as through a port providing access to the volume within the showerhead, such as showerhead 225 of FIG. 2A. The hydrogen-containing precursor may then be flowed into the processing region, where it may then mix or interact with fluorine-containing plasma effluents.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. An etching method comprising:
   flowing an oxygen-containing precursor into a semiconductor processing chamber, wherein a substrate is positioned within the semiconductor processing chamber, wherein the substrate comprises a trench formed between two vertical columns and tungsten slabs arranged within a plurality of recesses defined by at least one of the two vertical columns, and wherein at least two of the tungsten slabs are connected by tungsten lining a portion of sidewalls of the trench;
   oxidizing the tungsten connecting the at least two of the tungsten slabs with the oxygen-containing precursor, wherein the oxidation operation is performed for a period of time less than or about one minute;
   flowing a halide precursor into the semiconductor processing chamber; and
   laterally etching the oxidized tungsten from the sidewalls of the trench.

2. The etching method of claim 1, wherein the oxidation operation produces a layer of tungsten oxide having a thickness of at least about 20 Å.

3. The etching method of claim 1, wherein the oxidation operation produces a layer of tungsten oxide formed along the sidewalls of the trench, and wherein a thickness of the layer of tungsten oxide proximate an upper region of the trench differs in thickness from the layer of tungsten oxide proximate a lower region of the trench by less than about 30%.

4. The etching method of claim 1, wherein the substrate further comprises metal nitride liners disposed adjacent to the tungsten slabs and the tungsten connecting the at least two of the tungsten slabs, the etching method further comprising:
   oxidizing at least portions of the metal nitride liners with the oxygen-containing precursor; and
   laterally etching the oxidized portions of the metal nitride liners with the halide precursor.

5. The etching method of claim 4, wherein the substrate further comprises metal oxide layers disposed adjacent to the metal nitride liners, and wherein the etching method selectively etches the metal nitride liners relative to the metal oxide layers.

6. The etching method of claim 1, wherein the substrate further comprises metal nitride liners disposed adjacent to the tungsten slabs and the tungsten connecting the at least two of the tungsten slabs, the etching method further comprising:
   flowing a fluorine-containing precursor into a remote plasma region of the semiconductor processing chamber;
   forming a plasma of the fluorine-containing precursor to produce fluorine-containing plasma effluents;
   flowing a hydrogen-containing precursor into the remote plasma region of the semiconductor processing chamber;
   forming a plasma of the hydrogen-containing precursor to produce hydrogen-containing plasma effluents;
   flowing the fluorine-containing plasma effluents and the hydrogen-containing plasma effluents into a processing region of the semiconductor processing chamber, wherein the substrate is positioned within the processing region; and
   laterally etching exposed portions of the metal nitride liners.

7. The etching method of claim 1, wherein the substrate is maintained at a first temperature during at least the oxidation operation, wherein the substrate is maintained at a second temperature during at least the etching operation, and wherein the first temperature is greater than or about the second temperature.

8. The etching method of claim 7, wherein the first temperature is between about 200° C. and about 600° C.

9. The etching method of claim 1, wherein a chamber operating pressure of less than or about 100 Torr is maintained during the etching operation.

10. The etching method of claim 1, wherein the oxygen-containing precursor comprises at least one of atomic oxygen, molecular oxygen, $N_2O$, NO, $NO_2$, $CO_2$, or ozone.

11. The etching method of claim 1, wherein the semiconductor processing chamber comprises a remote plasma region and a processing region, wherein the substrate is positioned within the processing region, the etching method further comprising:
   flowing the oxygen-containing precursor into the remote plasma region of the semiconductor processing chamber;
   forming a plasma of the oxygen-containing precursor to produce oxygen-containing plasma effluents;
   flowing the oxygen-containing plasma effluents into the processing region of the semiconductor processing chamber; and
   oxidizing the tungsten connecting the at least two of the tungsten slabs with the oxygen-containing plasma effluents.

12. The etching method of claim 11, wherein the remote plasma region comprises at least one of a remote plasma system ("RPS") unit fluidly coupled with an inlet to the semiconductor processing chamber, or a capacitively-coupled plasma region physically separated from the processing region by at least one electrode of the capacitively-coupled plasma region.

13. The etching method of claim 1, further comprising:
pulsing the flow of the oxygen-containing precursor;
pausing the flow of the oxygen-containing precursor prior to the flow the halide precursor; and
resuming the flow of the oxygen-containing precursor subsequent to the flow of the halide precursor.

14. The etching method of claim 1, wherein the halide precursor comprises at least one of tungsten chloride or tungsten fluoride.

15. The etching method of claim 1, wherein the substrate further comprises dielectric layers disposed between the tungsten slabs, and wherein the etching method selectively etches the oxidized tungsten relative to the dielectric layers.

16. The etching method of claim 15, wherein the substrate comprises at least 20 layers of the tungsten slabs and at least 20 layers of the dielectric layers, and wherein the trench is characterized by an aspect ratio of greater than or about 20:1.

17. An etching method comprising:
flowing an oxygen-containing precursor into a first semiconductor processing chamber, wherein a substrate is positioned within the first semiconductor processing chamber, wherein the substrate comprises a trench formed between two vertical columns and tungsten slabs arranged within a plurality of recesses defined by at least one of the two vertical columns, wherein at least two of the tungsten slabs are connected by tungsten lining a portion of sidewalls of the trench, and wherein the substrate further comprises metal nitride liners disposed adjacent to the tungsten slabs and the tungsten connecting the at least two of the tungsten slabs;
oxidizing, in the first semiconductor processing chamber, the tungsten connecting the at least two of the tungsten slabs with the oxygen-containing precursor;
oxidizing, in the first semiconductor processing chamber, at least portions of the metal nitride liners with the oxygen-containing precursor;
flowing a halide precursor into a second semiconductor processing chamber, wherein the halide precursor comprises at least one of tungsten chloride or tungsten fluoride;
laterally etching, in the second semiconductor processing chamber, the tungsten oxidized in the first semiconductor processing chamber from the sidewalls of the trench; and
laterally etching, in the second semiconductor processing chamber, the portions of the metal nitride liners oxidized in the first semiconductor processing chamber.

18. The etching method of claim 17, wherein the first semiconductor processing chamber and the second semiconductor processing chamber are the same.

19. An etching method comprising:
flowing an oxygen-containing precursor into a semiconductor processing chamber, wherein a substrate is positioned within the semiconductor processing chamber, wherein the semiconductor processing chamber includes a heating source, wherein the substrate comprises a trench formed between two vertical columns and tungsten slabs arranged within a plurality of recesses defined by at least one of the two vertical columns, wherein at least two of the tungsten slabs are connected by tungsten lining a portion of sidewalls of the trench, and wherein flowing the oxygen-containing precursor comprises pulsing the flow of the oxygen-containing precursor;
oxidizing the tungsten connecting the at least two of the tungsten slabs with the oxygen-containing precursor while the substrate is positioned at a first distance from the heating source;
pausing the flow of the oxygen-containing precursor;
flowing a halide precursor into the semiconductor processing chamber;
resuming the flow of the oxygen-containing precursor subsequent to the flow of the halide precursor; and
laterally etching the oxidized tungsten from the sidewalls of the trench while the substrate is positioned at a second distance from the heating source, wherein the second distance is greater than the first distance.

* * * * *